United States Patent
Zhang

(10) Patent No.: US 7,304,355 B2
(45) Date of Patent: Dec. 4, 2007

(54) THREE-DIMENSIONAL-MEMORY-BASED SELF-TEST INTEGRATED CIRCUITS AND METHODS

(76) Inventor: Guobiao Zhang, P.O. Box 6182, Stateline, NV (US) 89449-6182

( * ) Notice: Subject to any disclaimer, the term of this patent is extended or adjusted under 35 U.S.C. 154(b) by 70 days.

(21) Appl. No.: 10/772,053

(22) Filed: Feb. 3, 2004

(65) Prior Publication Data

US 2004/0155301 A1    Aug. 12, 2004

Related U.S. Application Data

(62) Division of application No. 10/230,648, filed on Aug. 28, 2002, now Pat. No. 6,717,222.

(30) Foreign Application Priority Data

Apr. 8, 2002 (CN) .................... 02 1 13586
May 15, 2002 (CN) .................... 02 1 13738

(51) Int. Cl.
*H01L 29/76* (2006.01)

(52) U.S. Cl. .................................. 257/390; 257/401
(58) Field of Classification Search ............... 257/390, 257/401
See application file for complete search history.

(56) References Cited

U.S. PATENT DOCUMENTS

| | | | |
|---|---|---|---|
| 5,130,645 A | 7/1992 | Levy | 324/158 |
| 5,239,262 A | 8/1993 | Grutzner et al. | 324/158 |
| 5,592,616 A | 1/1997 | Finch et al. | 395/183.18 |
| 5,835,396 A | 11/1998 | Zhang | 365/51 |
| 6,034,882 A | 3/2000 | Johnson et al. | 365/103 |
| 6,839,873 B1* | 1/2005 | Moore | 714/725 |

* cited by examiner

*Primary Examiner*—Long Pham

(57) ABSTRACT

The three-dimensional memory (3D-M) can be used to carry the test data and/or test-data seeds for the circuit-under-test (CUT). When integrated with the CUT, 3D-M has minimum impact to the layout of the CUT. The CUT with integrated 3D-M supports IC self-test. Moreover, with a large bandwidth with the CUT, 3DM-based IC self-test enables at-speed test.

12 Claims, 22 Drawing Sheets

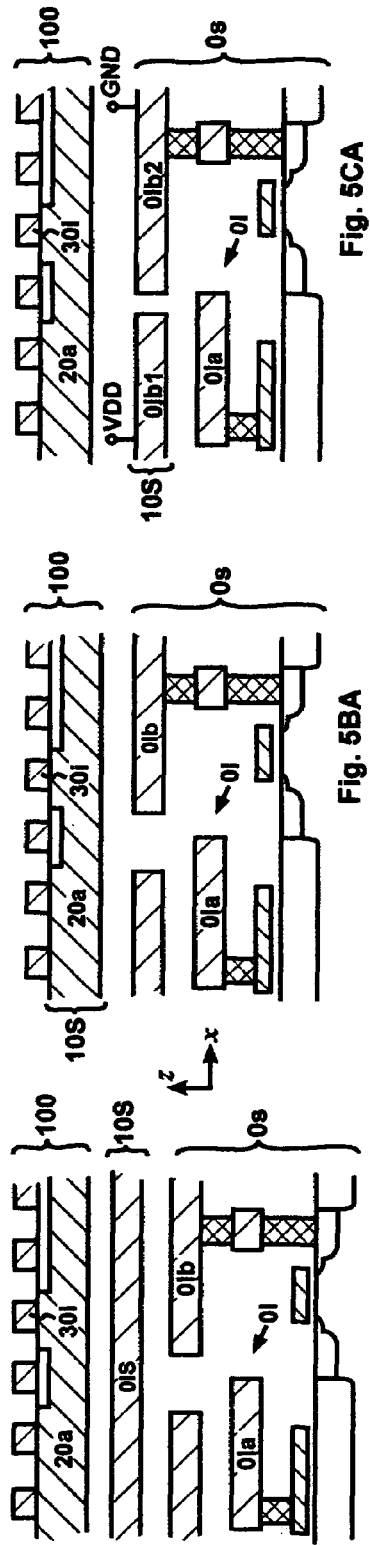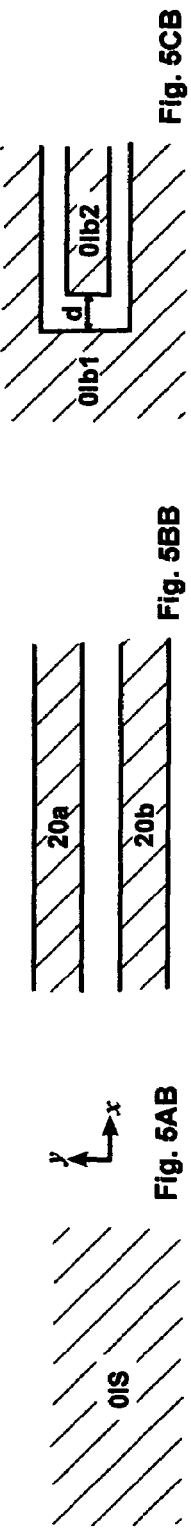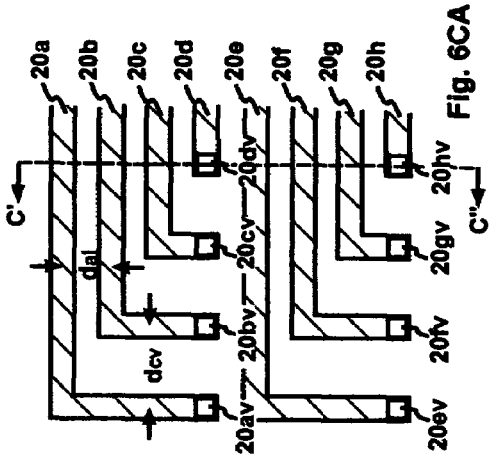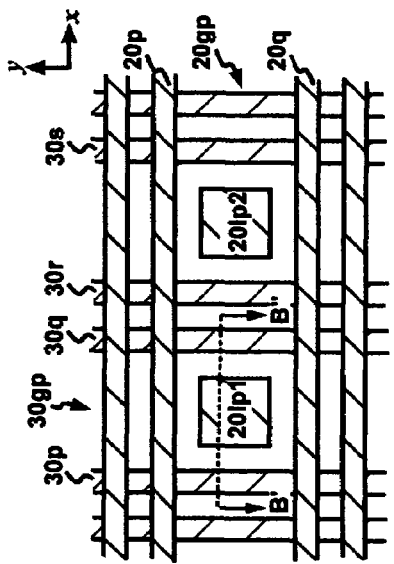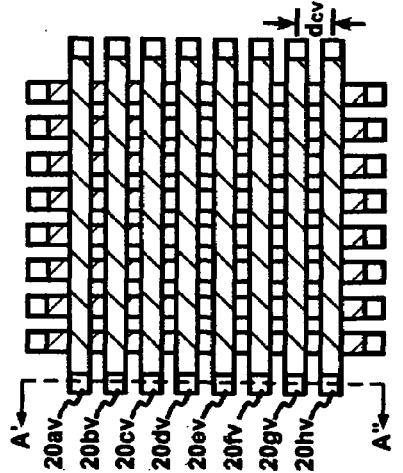

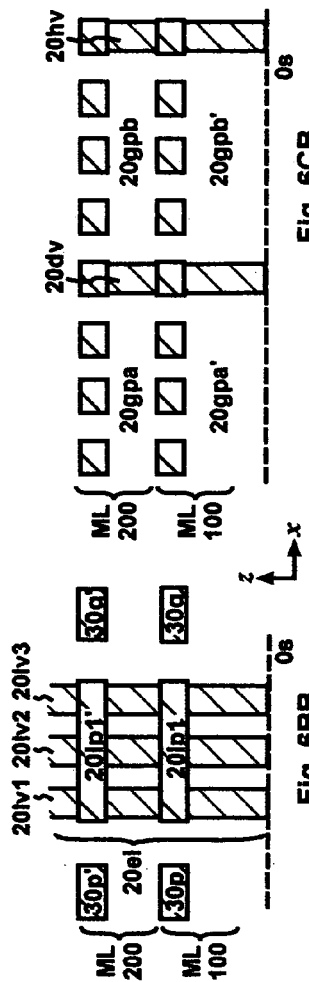
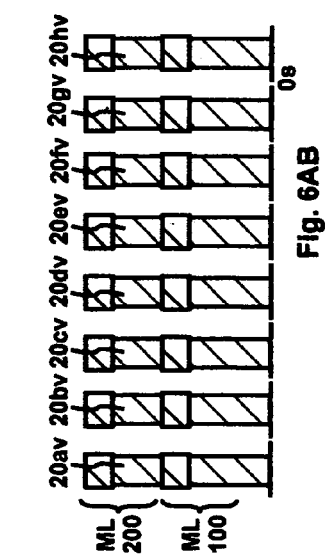
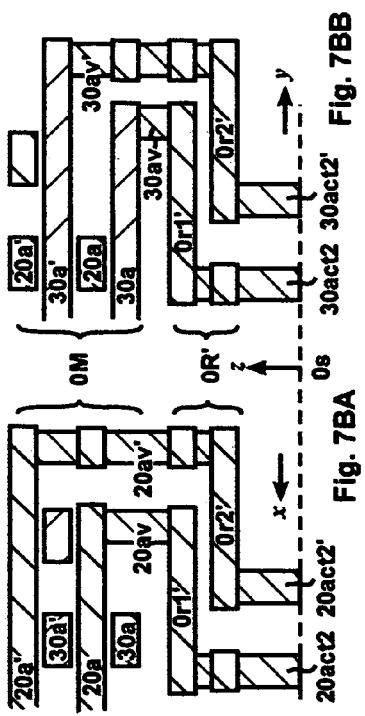
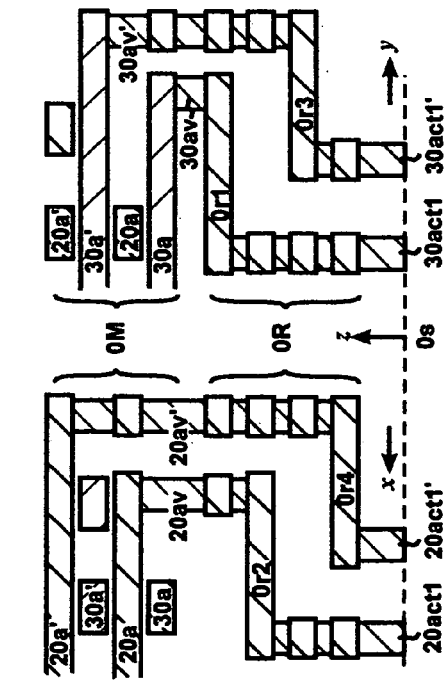
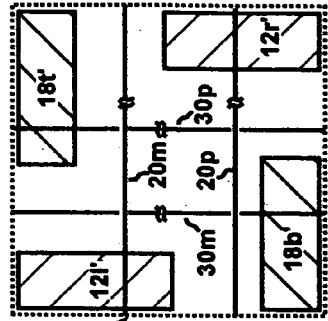
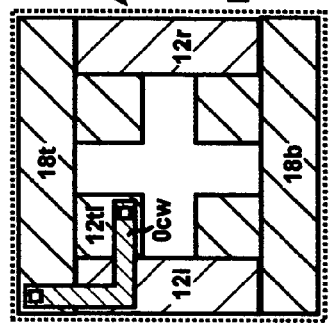

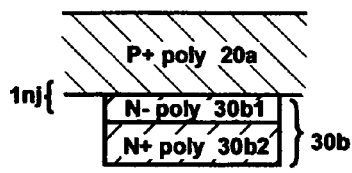
Fig. 10EA
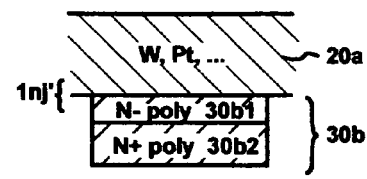
Fig. 10EB
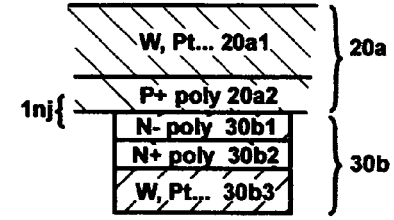
Fig. 10EC
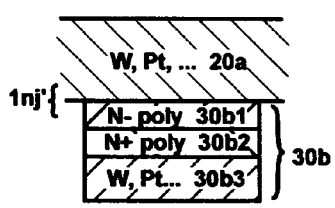
Fig. 10ED
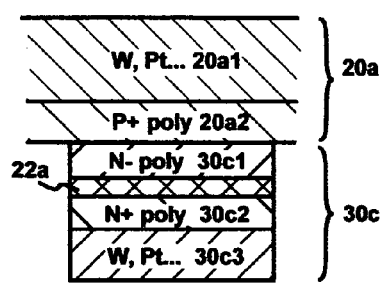
Fig. 11A
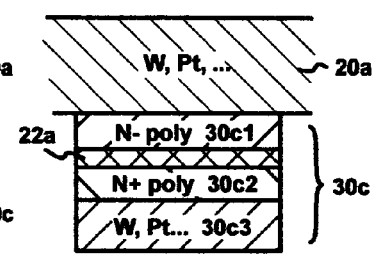
Fig. 11B
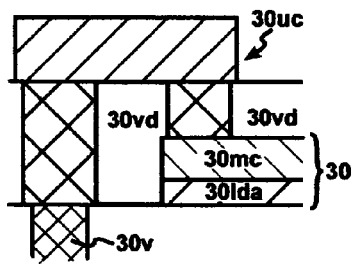
Fig. 12AA
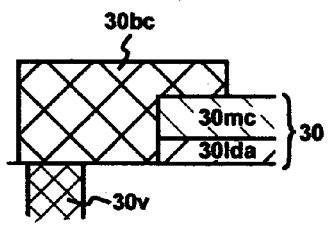
Fig. 12AB
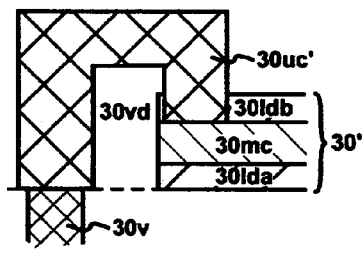
Fig. 12BA
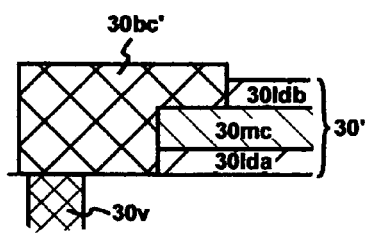
Fig. 12BB
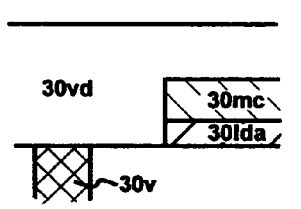
Fig. 12CA
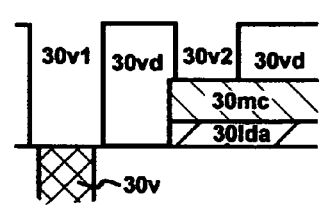
Fig. 12CB
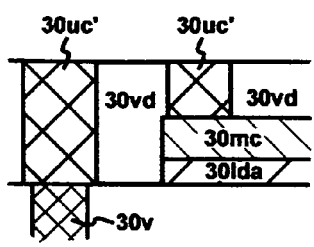
Fig. 12CC
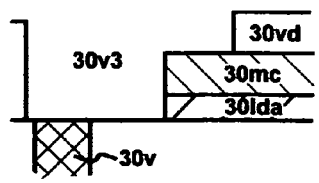
Fig. 12CB'
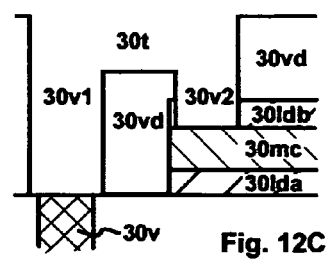
Fig. 12CB"

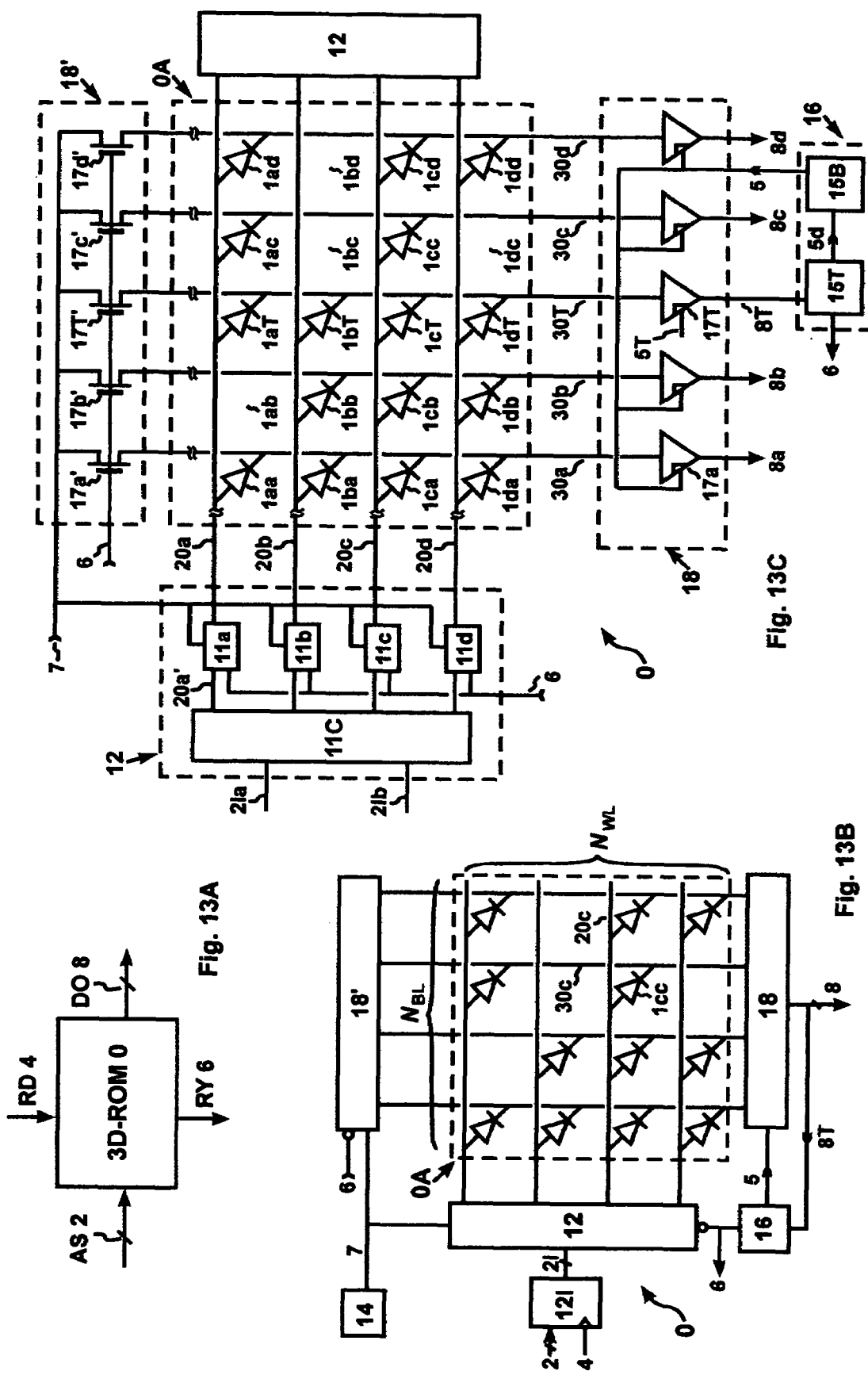

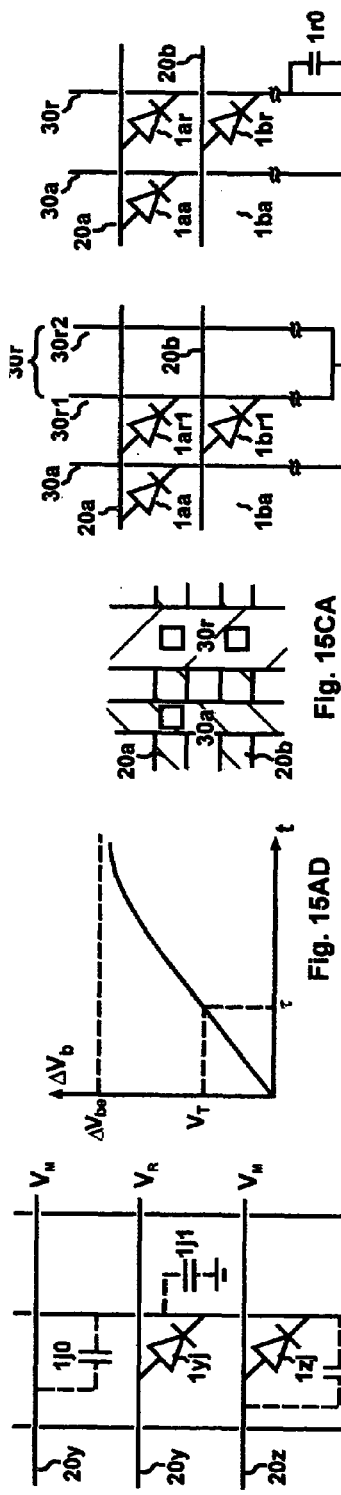

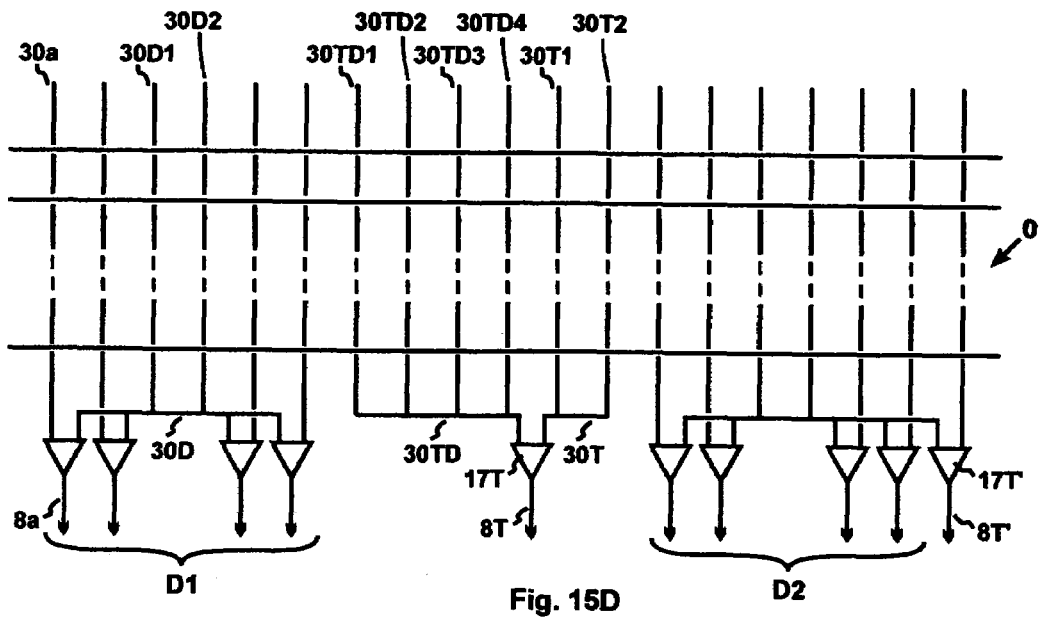
Fig. 15D
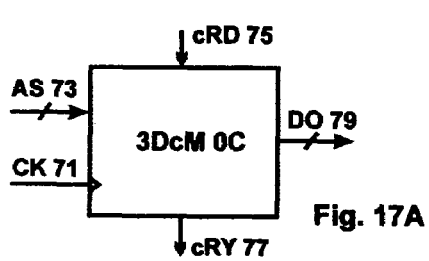
Fig. 17A
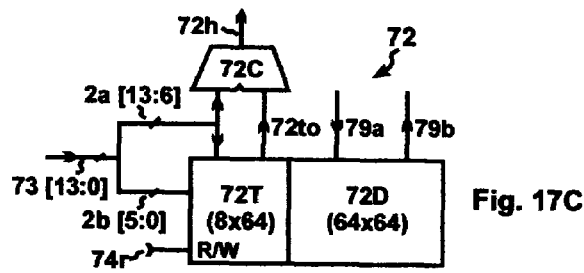
Fig. 17C
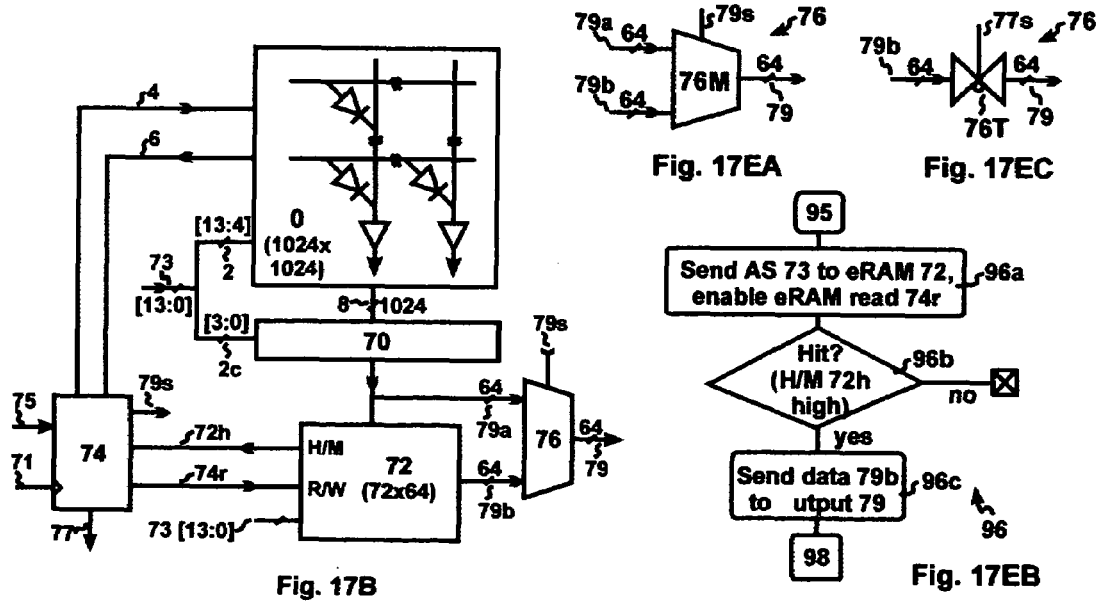
Fig. 17B
Fig. 17EA    Fig. 17EC
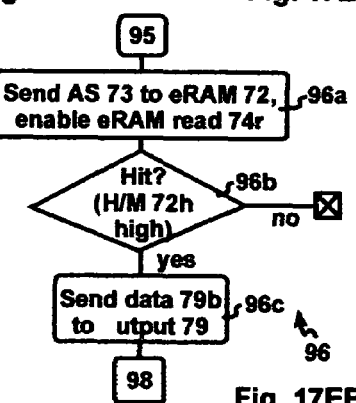
Fig. 17EB

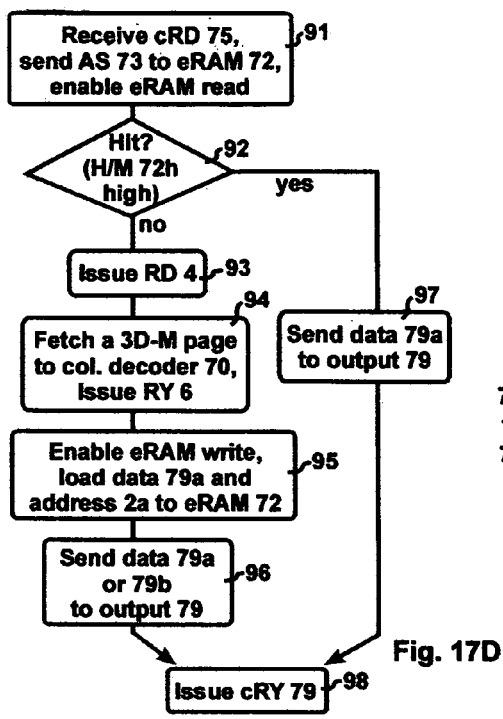
Fig. 17D
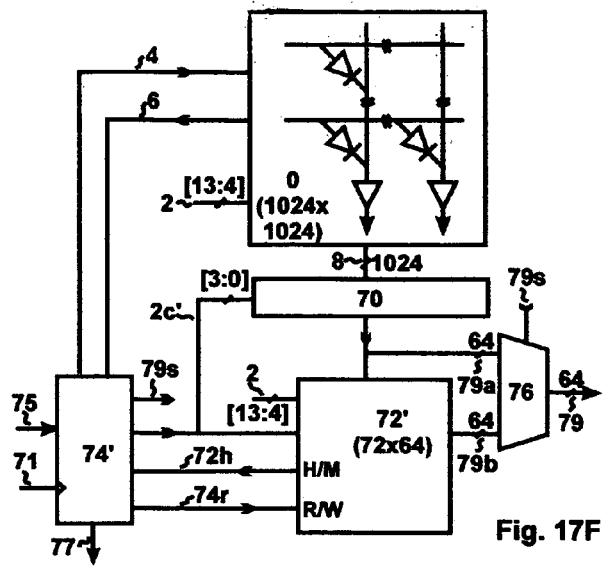
Fig. 17F
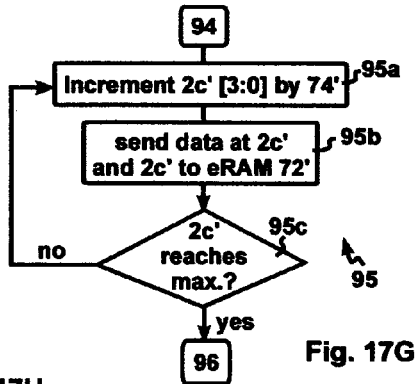
Fig. 17G
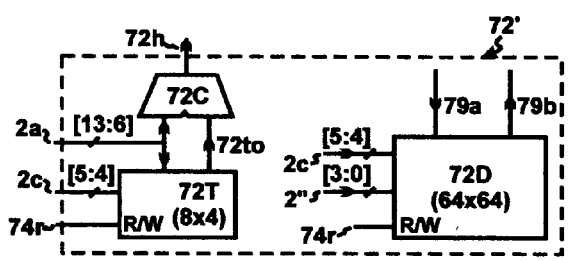
Fig. 17H
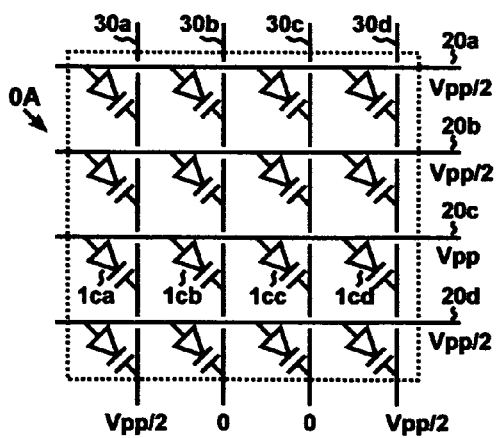
Fig. 18A
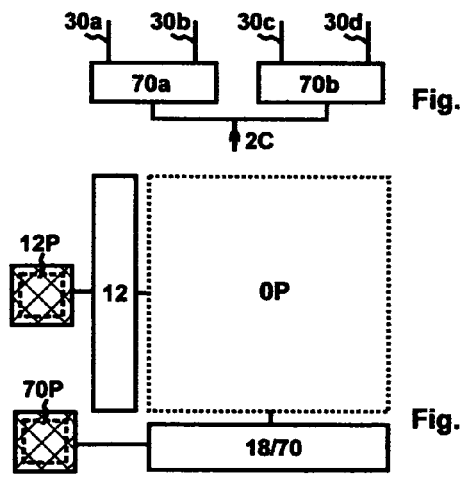
Fig. 18B
Fig. 18C

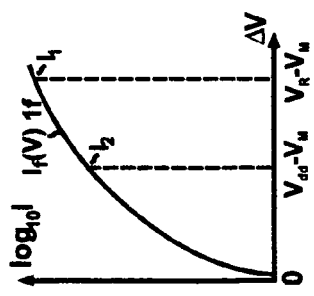
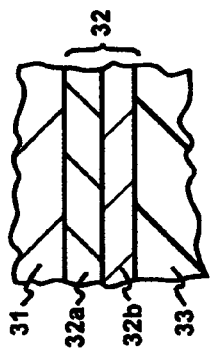
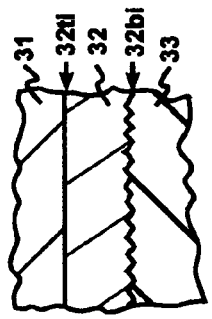
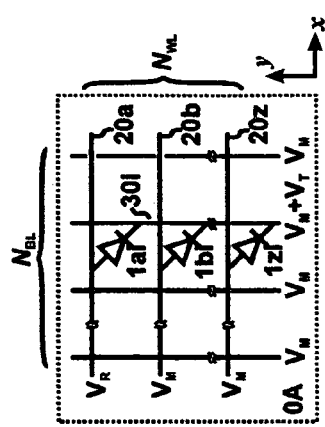
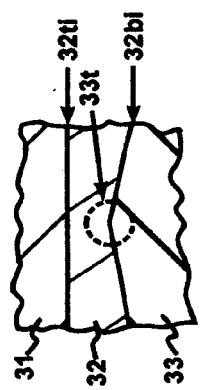
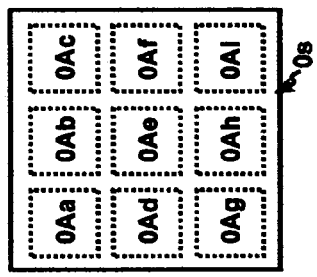
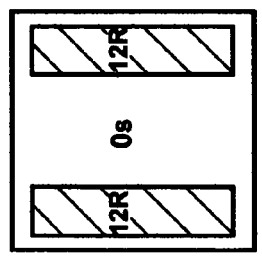
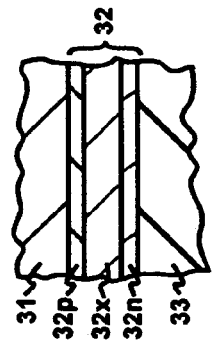
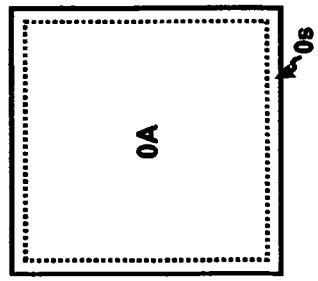
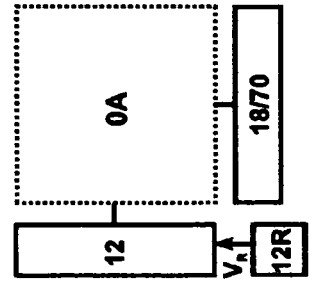
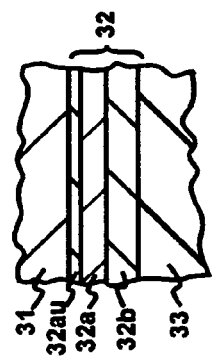

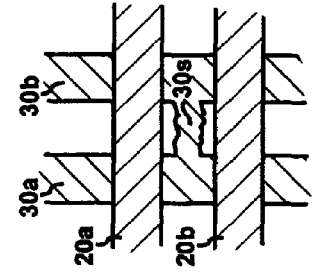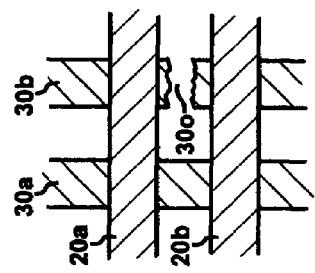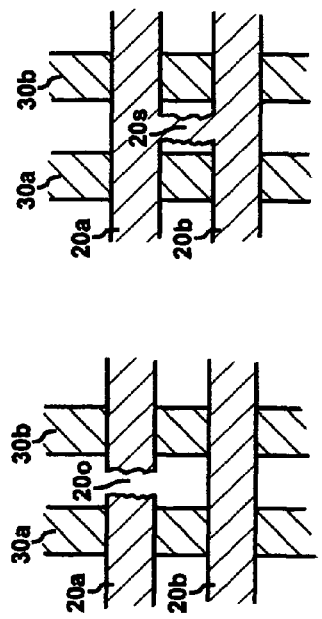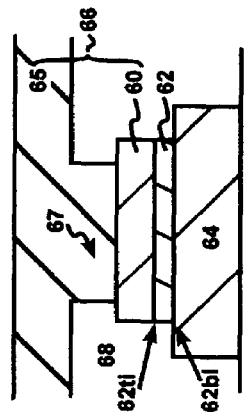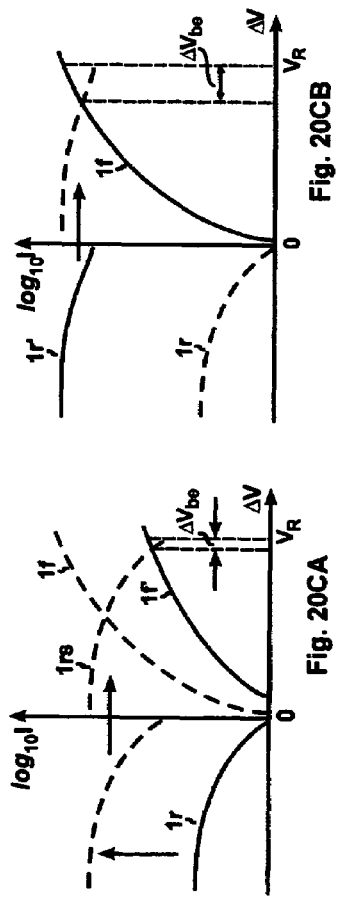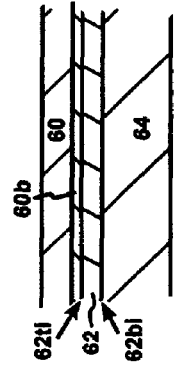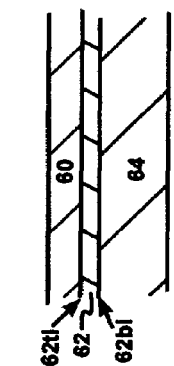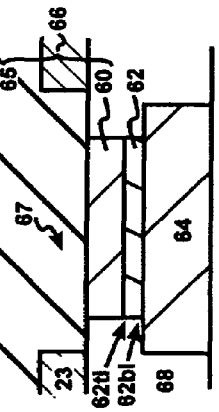

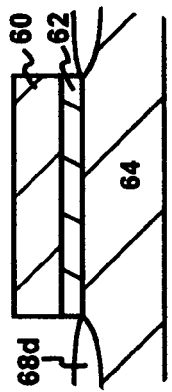
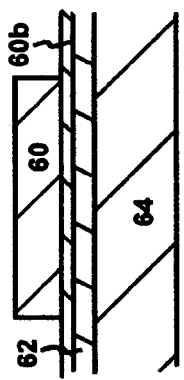
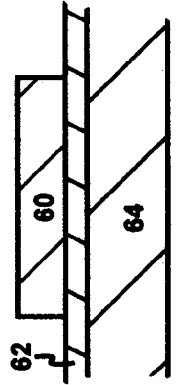
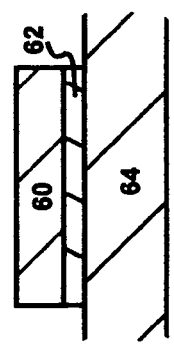
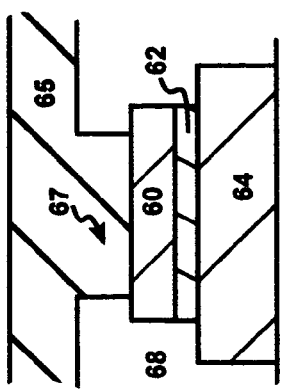
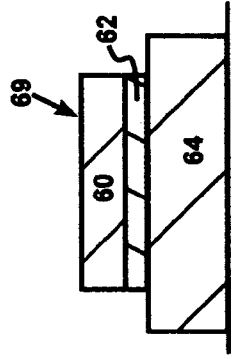
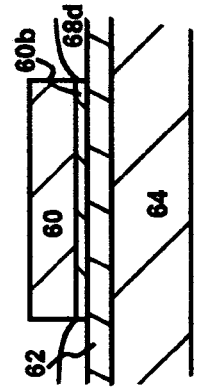
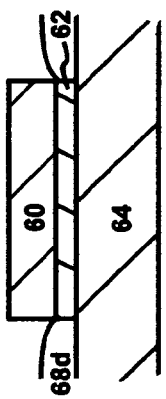
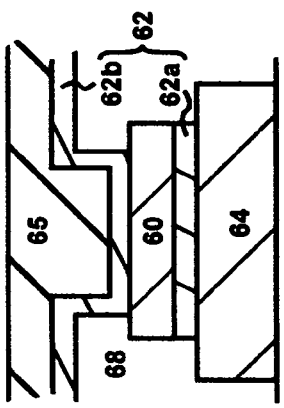
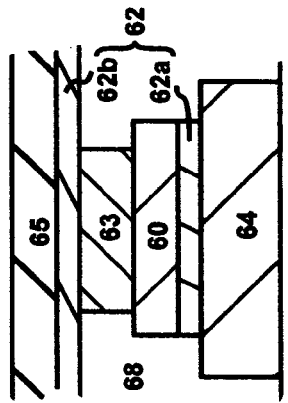
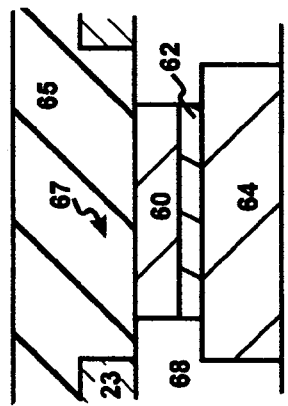

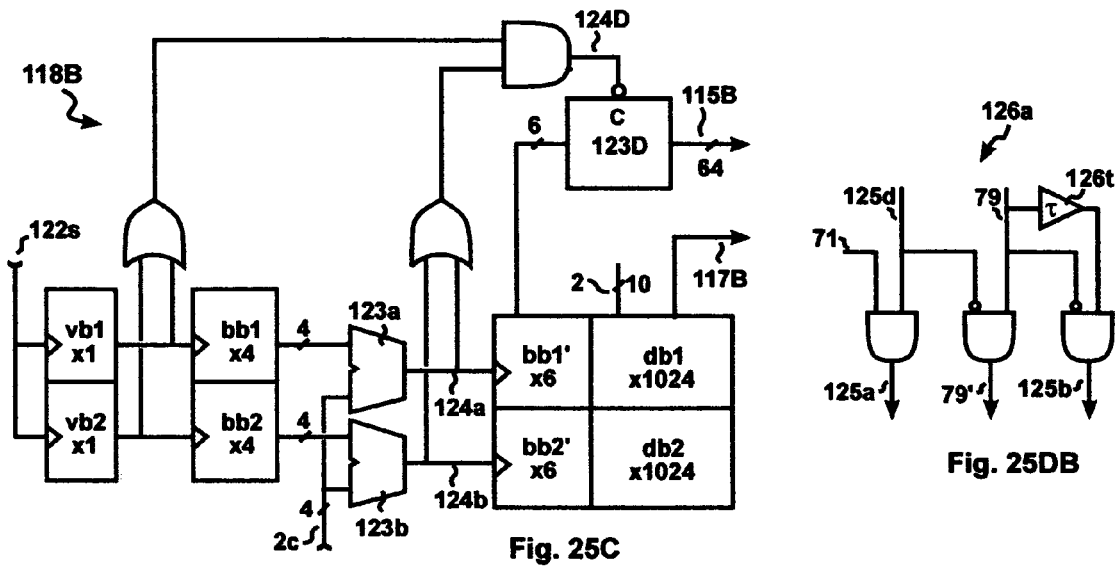
Fig. 25C
Fig. 25DB
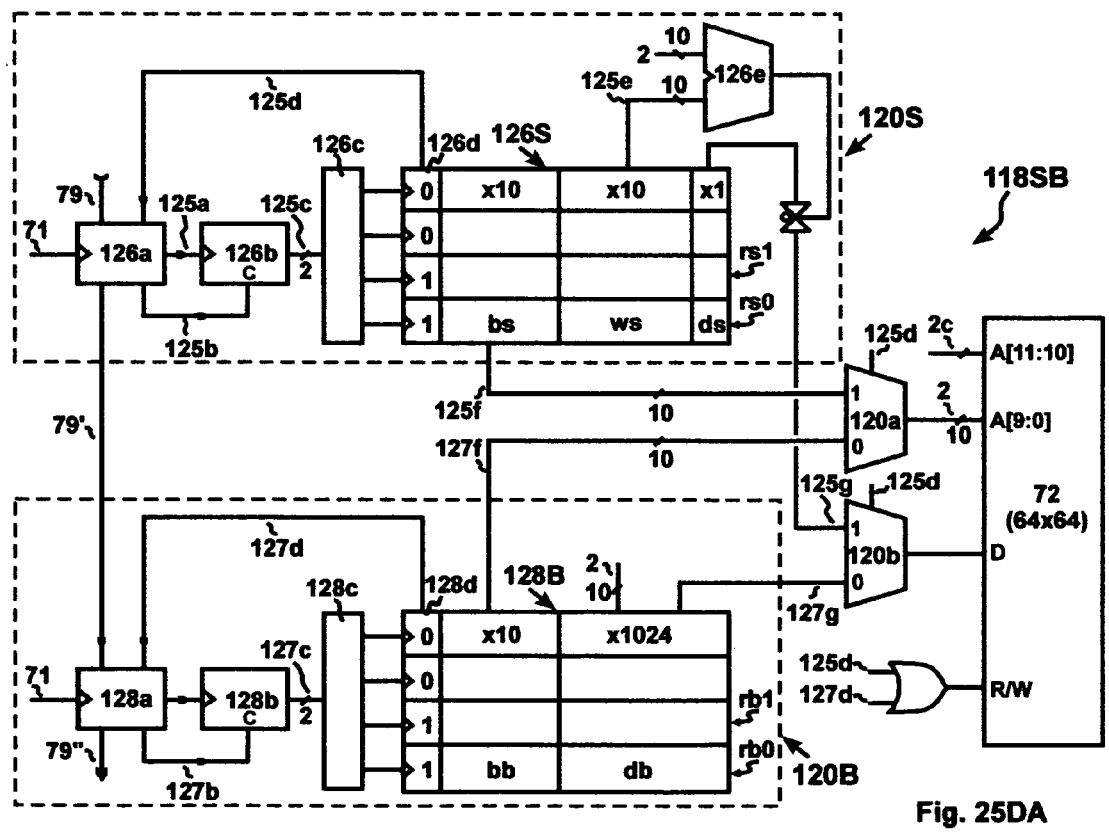
Fig. 25DA

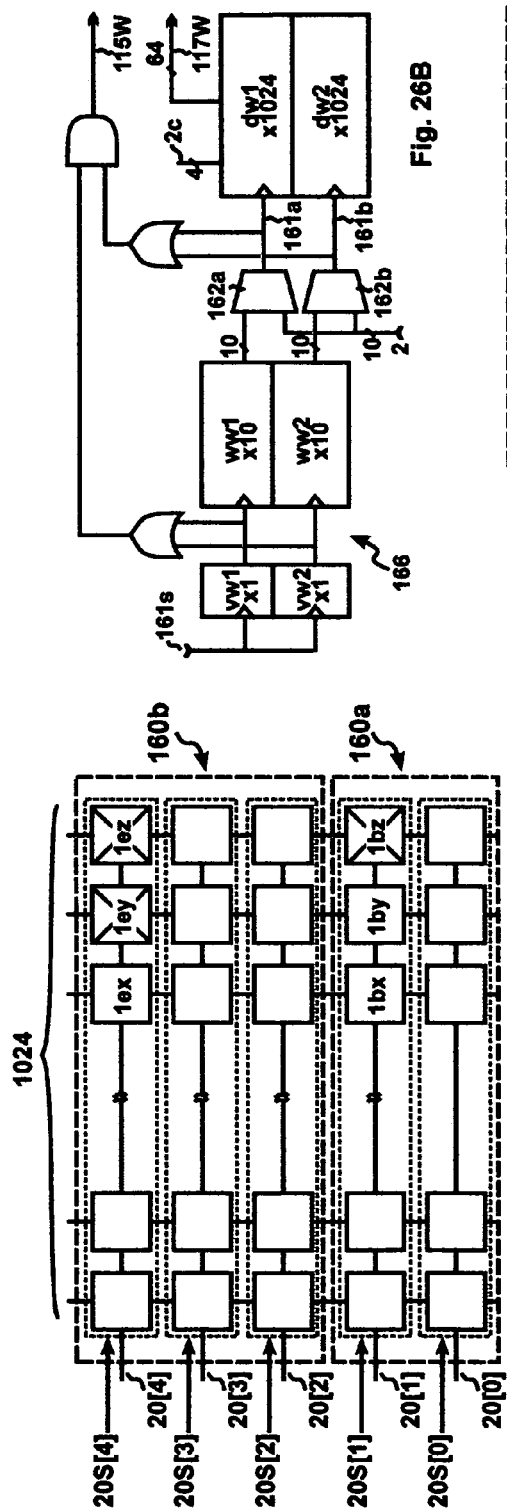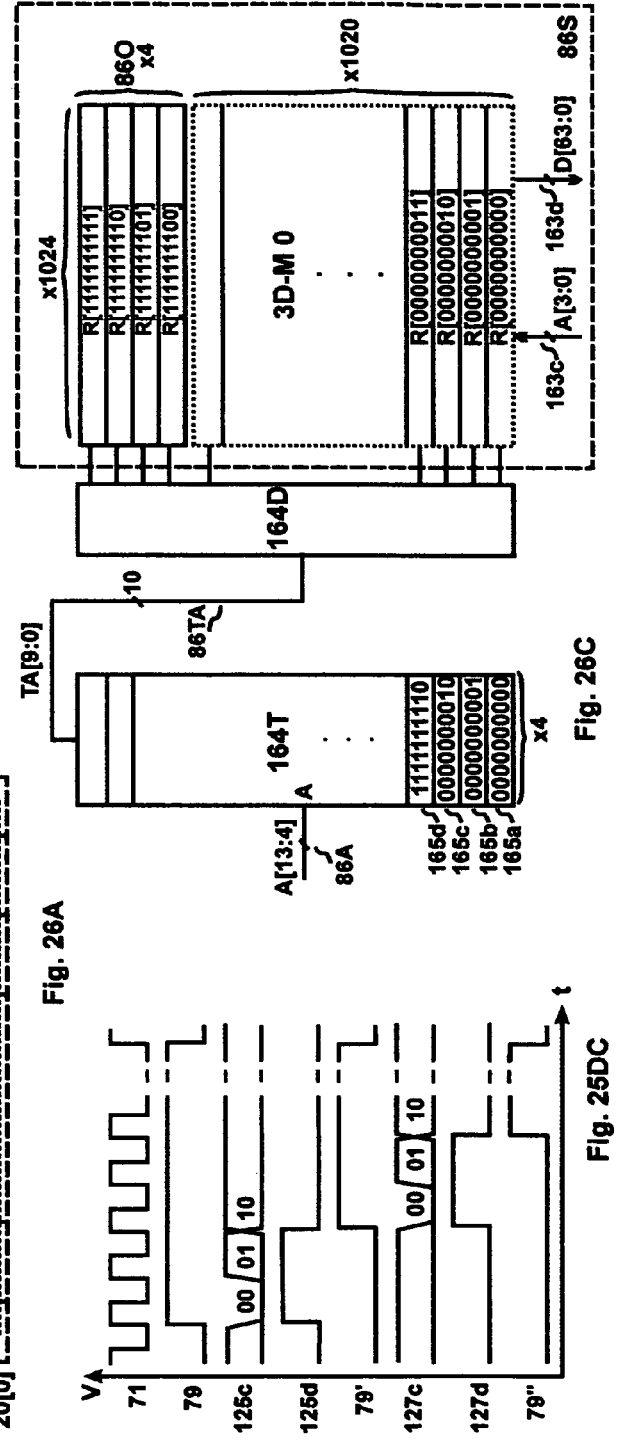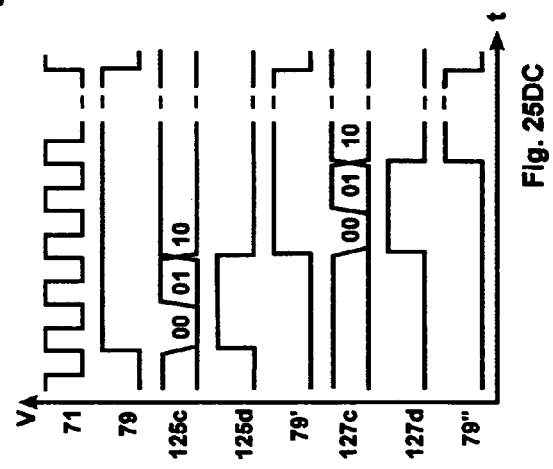
Fig. 26B
Fig. 26C
Fig. 26A
Fig. 25DC

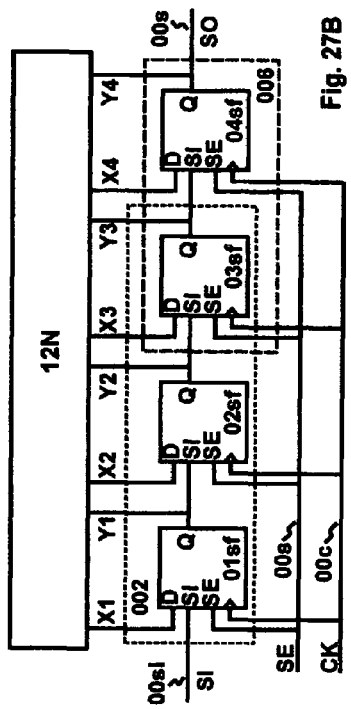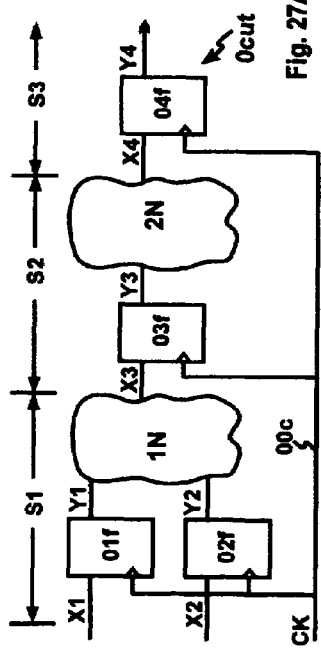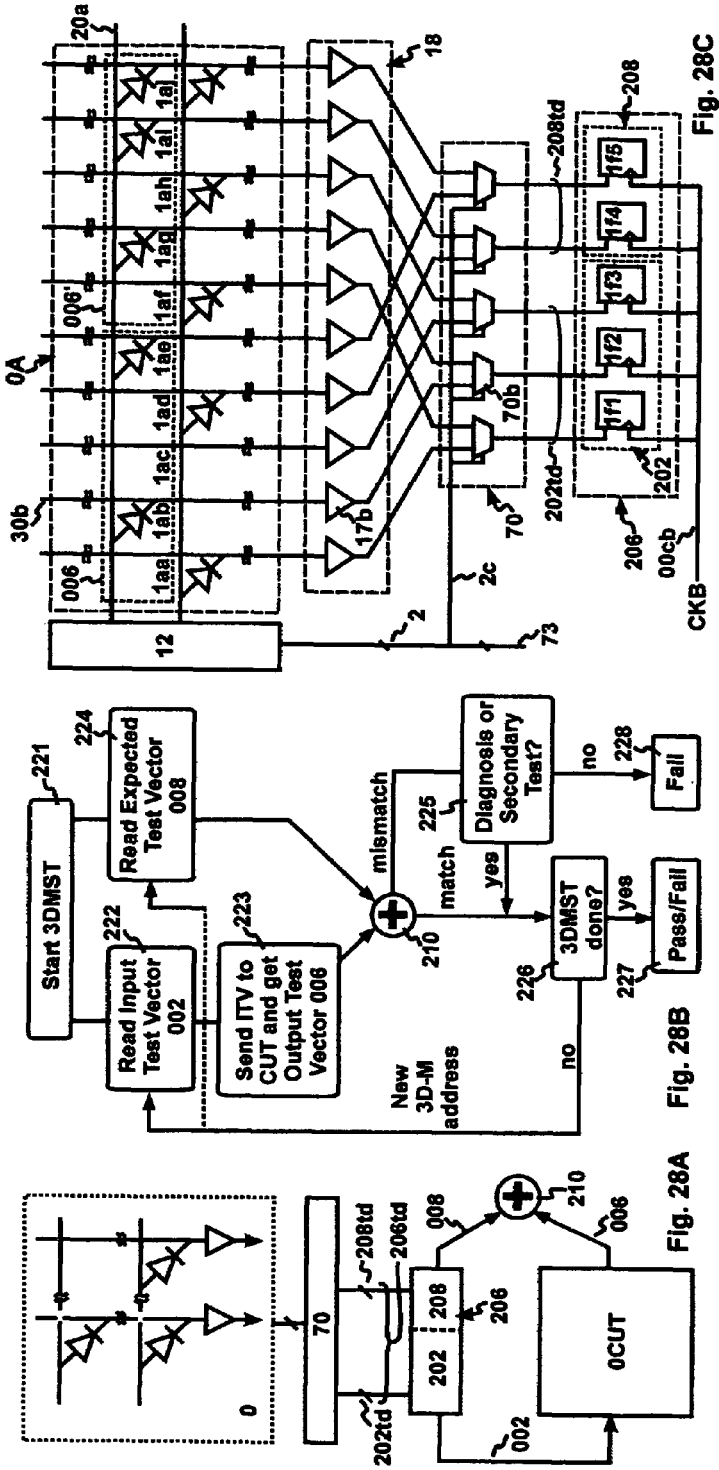

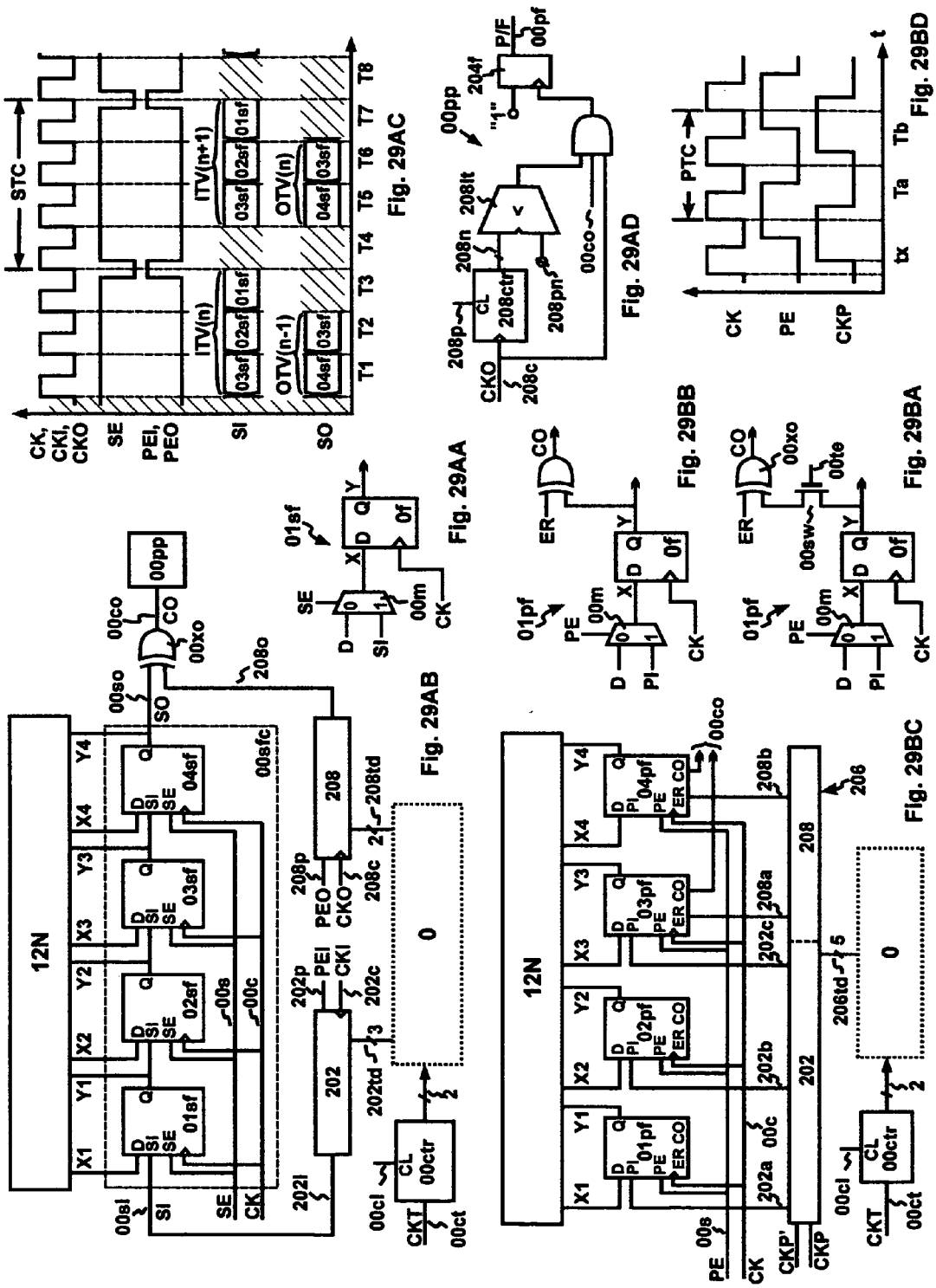

| | Test Methodology |
|---|---|
| Block-level test | BIST, etc. |
| Chip-level test/ Structural test | 3DMST (optionally with EST) |

Fig. 31BA

| | Test Methodology |
|---|---|
| High-speed test, critical test vectors | 3DMST (optionally with BIST) |
| Medium- to low-speed test | EST |

Fig. 31BB

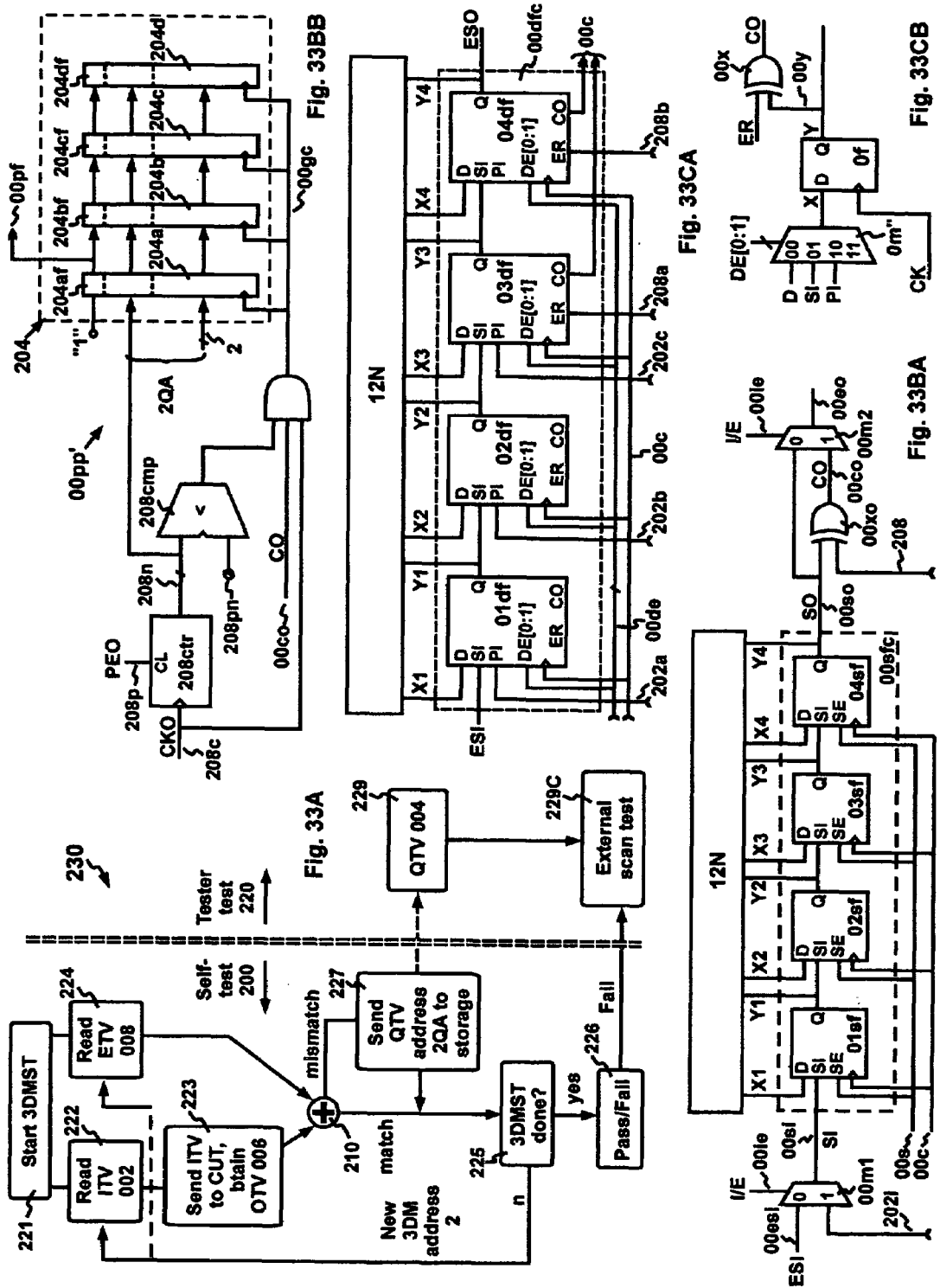

THREE-DIMENSIONAL-MEMORY-BASED SELF-TEST INTEGRATED CIRCUITS AND METHODS

This is a division of Ser. No. 10/230,648, filed Aug. 28, 2002 now U.S. Pat No. 6,717,222.

CROSS-REFERENCE TO RELATED APPLICATIONS

This patent application relates to the following domestic patent applications:
1. "3D-ROM-Based IC Test Structure", provisional application Ser. No. 60/328,119, filed on Oct. 7, 2001;
2. "Three-Dimensional Read-Only Memory Integrated Circuits", provisional application
3. "Three-Dimensional Read-Only Memory", provisional application Ser. No. 60/354,313, filed on Feb. 1, 2002, and the following foreign patent applications:
1. "Three-Dimensional-Memory-Based Self-Test Integrated Circuits and Methods", CHINA P. R., patent application Ser. No. 02113586.X, filed on Apr. 8, 2002;
2. "Three-dimensional Memory System-on-a-Chip", CHINA P. R., patent application Ser. No. 02113738.2, filed on May 15, 2002, all by the same inventor.

BACKGROUND

1. Technical Field of the Invention

The present invention relates to the field of integrated circuits, and more particularly to three-dimensional-memory-based IC self-test.

2. Related Arts

In a three-dimensional (3-D) integrated circuit (3D-IC), one or more 3D-IC layers are stacked one above another on top of a substrate. Each IC layer comprises functional blocks such as logic, memory and analog blocks. It is typically comprised of non-single-crystalline (poly, microcrystalline or amorphous) semiconductor material. Because logic and analog blocks are sensitive to defects and non-single-crystalline semiconductor material has a large defect density, the conventional 3D-IC comprising logic and/or analog blocks typically have a low yield. Moreover, logic and/or analog blocks consume large power. The three-dimension integration of these blocks faces many heat-dissipation issues. On the other hand, a memory block is less sensitive to defects because the defect-induced errors can be corrected (by, for example, redundancy circuit). Moreover, it consumes little power. Accordingly, memory is better suited for the 3-D integration.

In a three-dimensional memory (3D-M), one or more memory levels are stacked one above another on top of a substrate. As illustrated in FIG. 1, the two physical memory levels 100, 200 of the 3D-M 0 are stacked one by one on a substrate 0s. On each memory level 100, there are a plurality of address-select lines (including word line 20a and bit line 30a) and 3D-M cells (1aa . . . ). Substrate 0s comprises a plurality of transistors. Contact vias (20av, 30av . . . ) provide electrical connection between address-select lines (20a, 30a . . . ) and the substrate circuit.

The 3D-M can be categorized through the means employed to alter its contents. If the contents can be altered using electrical means, this 3D-M is an electrically programmable 3D-M (EP-3DM); if the contents are altered using non-electrical means, then this 3D-M is a non-electrically programmable 3D-M (NEP-3DM).

The electrically programmable 3D-M (EP-3DM) can be further categorized into 3-D RAM (3D-RAM), 3-D write-once memory (a.k.a 3-D one-time programmable, i.e. 3D-OTP), and 3-D write-many (3D-WM). The 3D-RAM cell is similar to a conventional RAM cell except that the transistors used therein are thin-film transistors (TFT) 1t (FIG. 1B). The 3D-OTP cell may comprise a 3D-ROM layer 22 (e.g. a diode layer) and an antifuse layer 22a (FIG. 1C). The integrity of the antifuse layer 22a indicates the logic state of the 3D-OTP cell. The 3D-WM includes 3D-flash, 3D-MRAM, 3D-FRAM, 3D-OUM (3-D Ovonyx-unified-memory), etc. It may comprise active devices such as TFT 1t (FIGS. 1DA–1DB). The TFT-based 3D-WM may comprise a floating gate 30fg (FIG. 1DA) or a vertical channel 25c (FIG. 1DB).

An exemplary non-electrically programmable 3D-M (NEP-3DM) is mask-programmable 3-D read-only memory (3D-MPROM). It represents logic "1" with the existence of an info-via 24 (i.e. absence of dielectric 26) (FIG. 1EA); and logic "0" with the absence of an info-via (i.e. existence of dielectric 26) (FIG. 1EB). Similar to 3D-OTP cell (FIG. 1C), it also comprises a 3D-ROM layer 22 (e.g. a diode layer).

3D-M can also be categorized as conventional semiconductor memory, i.e. it can be categorized into 3D-RAM and 3D-ROM (including 3D-MPROM, 3D-OTP, 3D-WM). This is the approach used by prior patents and patent applications filed by the same inventor (U.S. Pat. No. 5,835,396, U.S. patent application Ser. No. 10/230,648, etc.) In this application, both categorizations are used interchangeably.

With low-cost, high density and large bandwidth, the 3D-M has a strong competitive edge. However, because it is typically based on non-single-crystalline semiconductor, the performance of the 3D-M cell cannot yet compete with the conventional memory. For the 3D-M designed and manufactured in conventional approaches, its performance, such as read-write speed, unit-array capacity, intrinsic yield and programmability, needs further improvement.

The present invention provides an improved three-dimensional memory (3D-M). It has better integratibility, speed, density/cost and programmability. The 3D-M can be used to form three-dimensional integrated memory (3DiM), e.g. computer-on-a-chip (ConC) and player-on-a-chip (PonC). ConC/PonC offers excellent data security. Another 3D-M application of great importance is in the area of the integrated-circuit (IC) testing. 3D-M carrying the IC test data can be integrated with the circuit-under-test (CUT), thus enabling at-speed test and self-test.

OBJECTS AND ADVANTAGES

It is a principle object of the present invention to improve the 3D-M integratibility;

It is a further object of the present invention to improve the 3D-M data security.

It is a further object of the present invention to improve the 3D-M density and lower its cost.

It is a further object of the present invention to improve the 3D-M speed.

It is a further object of the present invention to provide software upgradibility for the 3D-M.

It is a further object of the present invention to provide an integrated circuit with self-test and at-speed test capabilities.

In accordance with these and other objects of the present invention, an improved three-dimensional memory is disclosed.

SUMMARY OF THE INVENTION

Compared with conventional memory, one greatest advantage of the 3D-M is its integratibility. Because its memory cells do not occupy substrate, most substrate real estate can be used to build complex substrate integrated circuits (substrate-IC). The substrate IC may comprise conventional memory block, processing unit, analog block and others. 3D-M SoC (system-on-a-chip) formed from the integration between the 3D-M and substrate-IC is referred in the present invention as three-dimensional integrated memory (3DiM). The 3DiM can further improve the data security, speed, yield and software upgradibility of the 3D-M.

In a 3DiM, the substrate-IC may comprise an embedded read-write memory (eRWM) and/or an embedded processor (eP). The performance of the 3D-M and the eRWM are complementary to each other: 3D-M excels in integratibility and density/cost; RWM is better in speed and programmability. The integration of the 3D-M and the RWM combines their individual strength and can achieve an optimized system performance. On the other hand, the integration of the 3D-M and the eP can enable the on-chip processing of the 3D-M data (data stored in the 3D-M), thus improving the 3D-M data security.

One exemplary eRWM is embedded RAM (eRAM). The eRAM has a small latency. It can be used as a cache for the 3D-M data, i.e. it keeps a copy of the 3D-M data. When the eP seeks data, it searches first in the eRAM. If not found, it will then search the 3D-M. This approach reconciles the speed difference between the eP and the 3D-M. Another exemplary eRWM is embedded ROM (eROM). In general, eROM comprises non-volatile memory (NVM). The excellent programmability of the eROM can remedy the limited programmability of the 3D-M. Accordingly, the eROM is an ideal storage device for the correctional data (data used to correct defect-induced errors) and upgrade code of the 3D-M.

Computer-on-a-chip (ConC) is realized by integrating a 3D-M with an eP and an eRWM. It can perform many task of a today's computer. One exemplary ConC is player-on-a-chip (PonC). PonC can store and play contents, including audio/video (A/V) materials, electronic books, electronic maps and others. It provides excellent copyright protection to these contents. For the conventional content-storage technologies such as optical discs, pirates can easily steal the original contents by monitoring the output signal from the content carrier (i.e. the medium that carries the content, including optical discs, ROM chips and others) or by reverse-engineering the content carrier. In a PonC, the 3D-M is integrated with a content player (preferably with an on-chip D/A converter). Its output is analog (AN) signal and/or decoded (AN) signal. Accordingly, the original contents do not appear anywhere outside the PonC and therefore, cannot be digitally duplicated. Thus, excellent copyright protection can be achieved.

For a 3DiM using a mask-programmable 3D-M to store data (e.g. contents, codes), the data represented by the info-vias in the 3D-M are preferably encrypted. In addition, 3DiM preferably comprises an on-chip decryption engine. This on-chip decryption engine decrypts the 3D-M data. The decrypted data are directly sent to the other functional blocks on the 3DiM. For this type of the 3DiM, it is very difficult to reverse-engineer the chip using means such as de-layering.

The present invention provides means for improving the 3D-M integratibility, both from a structural perspective and from a design perspective. From a structural perspective, simple 3D-M cell is preferred. To be more specific, the diode-based 3D-ROM, particularly 3D-MPORM, is the first-choice candidate. Moreover, if the 3D-M process requires relatively high temperature, the interconnect system for the substrate circuit is preferably made of refractory conductors (e.g. refractory metal) and thermally-stable dielectrics (e.g. silicon oxide, silicon nitride). Furthermore, there are preferably a plurality of gaps between certain address-select lines in the 3D-M array. With their help, embedded wires can pass through the 3D-M array and provide interface for the substrate-IC. In addition, for the high-speed substrate-IC, a shielding layer is preferably formed between at least a portion of the 3D-M layer and the substrate circuit.

From a design perspective, unit array (i.e. the basic memory array in a chip) preferably has large capacity. This can minimize the number of unit arrays on a 3D-M chip and therefore, minimize the effect of the 3D-M's peripheral circuits on the layout of the substrate-IC. Moreover, simple 3D-M peripheral circuit is preferred. Simple peripheral circuit occupies less substrate real estate. Accordingly, the saved space can be used to accommodate more powerful substrate-IC. Since 3D-MPROM does not need programming circuitry, it is advantageous over 3D-EPROM in this aspect. For the "write-once" 3D-EPROM, since its programming capability is not used "very often", the programming voltage can be directly fed into the chip, rather than being generated on-chip.

With outstanding manufacturability and integratibility, 3D-MPROM is a very promising 3D-M. The present invention provides several self-aligned 3D-MPROM. In a self-aligned 3D-MPROM, the 3D-ROM layer is self-aligned with the word and bit lines and its formation does not require any individual pattern-transfer step. The 3D-ROM layer may be pillar-shaped, with one dimension equal to the word-line width and the other dimension equal to the bit-line width; or be a natural junction, which is naturally formed at the cross-point between the word and bit lines. Furthermore, interleaved memory levels can be used to further increase memory density. In a 3D-M with interleaved memory levels, two adjacent memory levels share one address-select line. In general, 3D-MPROM can use an nF-opening mask to define the 3D-M data. On an nF-opening mask, the opening dimension is n times (preferably, n~2) the minimum dimension supported by this technology. It has a much lower mask cost.

Compared with conventional memory, the 3D-M is typically slower. This issue can be addressed both from a design perspective and from a system perspective. From a design perspective, techniques such as sense amplifier (S/A), full-read mode and self-timing are preferably used. With an S/A, the bit-line voltage swing required to trigger a logic output is small (~100 mV), thus it takes less time to charge up the bit line and the latency is shortened. In the fill-read mode, all data on a single word line are read out at the same time and therefore, the bandwidth is improved. Self-timing ensures data-validity and saves power. For programmable 3D-M, parallel programming improves the write speed.

From a system perspective, 3DiM is preferably used to hide the 3D-M latency. The eRAM in the 3DiM works as a cache for the 3D-M. After read, the 3D-M data latched at the S/A are copied into the eRAM word-by-word. When an external circuit seeks data from the 3DiM, it reads from the eRAM first. If there is a hit, the data is read out from the eRAM; otherwise the data is read out from the 3D-M.

Although the performance of a single 3D-M cell cannot yet compete with the conventional memory, collectively, its system performance can match that of the conventional memory, even excel.

To improve its integratibility, 3D-M preferably has a large unit-array capacity. This can be achieved in several approaches. First of all, since $N_{BL}$ ($N_{BL}$ is the number of bit lines in a unit array) is not constrained, a unit array can be designed into a rectangular shape, i.e. $N_{BL}$>$N_{WL}$ ($N_{WL}$ is the number of word lines in a unit array). Secondly, since $N_{WL}$ is constrained by the rectification ratio γ of the 3D-ROM cell during read, γ preferably has a large value. One γ-enhancement technique uses a large read voltage $V_R$. With the usage of S/A, the reverse and forward biases in γ is decoupled: the largest reverse bias is just around the threshold voltage $V_T$ of the S/A (~100 mV); whereas, the forward bias is controlled by $V_R$, which can be separately adjusted by design. In general, the forward bias (e.g. ~3V) is far greater than the reverse bias (e.g. ~0.3V). Apparently, γ can be improved by using larger $V_R$. Another γ-enhancement technique uses polarized 3D-ROM cell. In a polarized cell, the base materials in its upper and lower layers are different, or, it has different interfaces with its top and bottom electrodes.

To improve yield, a seamless 3D-ROM cell is preferably used to lower the intrinsic defects in a 3D-ROM array. In a seamless 3D-ROM cell, all defect-sensitive layers (i.e. 3D-ROM layer and at least the portion of the bottom and top electrodes adjacent to it), are formed in a seamless way, i.e. there is no pattern-transfer step between the formations of these layers. Alternatively, error-correction schemes such as error-correction code (ECC) and redundancy circuits can be used to correct the defect-induced errors. For ECC, Hamming code is preferably incorporated in the 3D-M array. For redundancy circuits, the eROM therein preferably stores the addresses and correctional data for defects. Redundancy circuits can correct word-line errors, bit-line errors and single-bit errors. The correctional process can be carried out right after the column decoder (correction-during-read), or, in the eRAM (correction-after-read).

Besides correcting word-line errors, the word-line redundancy block provides software upgradibility for the 3D-M. In the area of software upgrade, the word-line redundancy block is also referred to as flexible-code block. Software upgrade can also use address-translation. For address-translation, the 3D-M and the eROM form a unified memory space: the 3D-M stores the original code and the eROM stores the upgrade code. The substrate-C further comprises an address-translation block. It treats all input addresses as virtual address and translates them into the physical address for the unified memory space. If the data refer to the original code, the physical address points to the 3D-M; if the data refer to the upgrade code, the physical address points to the eROM.

Another 3D-M application of great importance is IC-testing. For the conventional testing methodology, it is difficult to achieve at-speed test and field self-test. Moreover, conventional testers are expensive. With the advent of 3D-M, particularly 3D-ROM, these issues can be addressed. The 3D-M carrying test data is preferably integrated with the circuit-under-test (CUT). During test, input test vector is first downloaded from the 3D-M to the CUT; then the output from the CUT is compared with the expected test vector. Accordingly, the CUT performance can be examined. This 3D-M-based self-test (3DMST) has many advantages: 1. With 3-D integration, the bandwidth between the CUT and the 3D-M is large. This large bandwidth can enable at-speed test to high-speed IC; 2. 3DMST can enable field self-test and self-diagnosis, thus improving the system reliability; 3. Being low-cost, the 3D-M adds little extra cost to the CUT; 4. The 3D-M has little impact to the CUT layout; 5. With a large capacity, the test data in the 3D-M can provide excellent fault coverage to the CUT.

Test vectors can be downloaded from the 3D-M to the CUT in a serial or parallel fashion. During serial downloading, test vectors are shifted one-by-one into the scan chain; during parallel downloading, test vectors are shifted into the scan chain in parallel. The integrated circuits with 3DMST capability (i.e. 3DMST-IC) can also support techniques such as parallel self-test, mixed-signal testing, and printed-circuit board (PCB) system self-test. Moreover, to reduce the amount of test data to be carried by the 3D-M, techniques such as test-data compression and composite test are preferably used. In a composite test, the 3DMST is combined with other testing techniques such as BIST and external scan test. Composite test further lowers the testing cost and improves the test reliability.

During the 3DMST, if the output test vector (OTV) mismatches the expected test vector (ETV), there are two possibilities: one is the CUT is defective; the other is the 3D-M is defective. The second scenario can cause undesired yield loss. To avoid it, methodologies such as 3DMST-with-confidence and/or secondary test are preferably followed. The 3DMST-with-confidence guarantees that the 3D-M is error-free: if there are defect-induced errors, they are corrected before the 3DMST. For the part that fails the 3DMST, a secondary test, i.e. an external scan test (EST), can be performed. Still failing the EST test, it will then be treated as a bad part. This testing methodology is also referred to as dual testing. To reduce the EST test time, the questionable test vectors (QTV, i.e. the test vectors corresponding to the mismatched OTV and ETV) are recorded during the 3DMST. Then the secondary test is only performed to the QTV.

BRIEF DESCRIPTION OF THE DRAWINGS

FIGS. 5AA–5CB illustrate several preferred shielding layers in a 3DiM.

FIGS. 6AA–6CB illustrate several preferred interfacing structures for a substrate-IC.

FIGS. 7AA–7BC illustrate several preferred folded-back address-decoders and their routing levels.

FIGS. 10A–10ED illustrate several preferred self-aligned, natural-junction 3D-MPROM's and their preferred process flows.

FIGS. 11A–11B illustrate two preferred 3D-EPROM cells with metal/semiconductor address-select lines.

FIGS. 12AA–12CB" illustrate several preferred inverted-U links and their preferred process flows.

FIGS. 13A–13C illustrate the symbol, basic block diagram and detailed block diagram for a preferred 3D-ROM core.

FIGS. 15AA–15AD explain sources for the latency; FIGS. 15BA–15CC explain reference bit line and provide several preferred reference bit lines; FIG. 15D illustrates a preferred implementation of data bit lines, dummy bit lines and timing bit lines in a 3D-ROM array.

FIG. 16 illustrates a preferred timing diagram of various signals in a 3D-ROM core.

FIGS. 17A–17G illustrate several preferred cached 3D-M's (3DcM) and preferred read flows.

FIGS. 18A–18B illustrate a preferred 3D-EPROM with parallel programming; FIG. 18C illustrates a preferred 3D-EPROM with external programming source(s).

FIGS. 19AA–19G illustrates several preferred means for increasing the 3D-M unit-array capacity.

FIGS. 20AA–20CB explain several 3D-M defect types.

FIGS. 21A–21B illustrate two preferred seamless 3D-ROM cells.

FIGS. 22A–22E' illustrate several preferred process flows for seamless 3D-ROM cells.

FIGS. 23A–23B illustrate two preferred quasi-seamless 3D-ROM cells.

FIGS. 25A–25DC illustrate several preferred 3D-M redundancy circuits.

FIGS. 26A–26C illustrate several preferred 3D-M's with software upgradibility.

FIGS. 27A–27B explain a conventional IC-testing methodology.

FIGS. 28A–28C illustrate a preferred implementation of 3D-M-based self-test (3DMST).

FIGS. 29AA–29BD illustrate several preferred test-data downloading means.

FIGS. 33A–33CB illustrate several preferred 3DMST-IC with dual-testing capacity.

For the reason of simplicity, in this disclosure, the figure number with a missing appendix refers to all figures with that appendix. For example, FIG. 17 refers to FIGS. 17A–17H; and FIG. 17E refers to FIGS. 17EA–17EC.

DETAILED DESCRIPTION OF THE PREFERRED EMBODIMENT

1. Three-Dimensional Integrated Memory (3DiM)

Figure 2A:
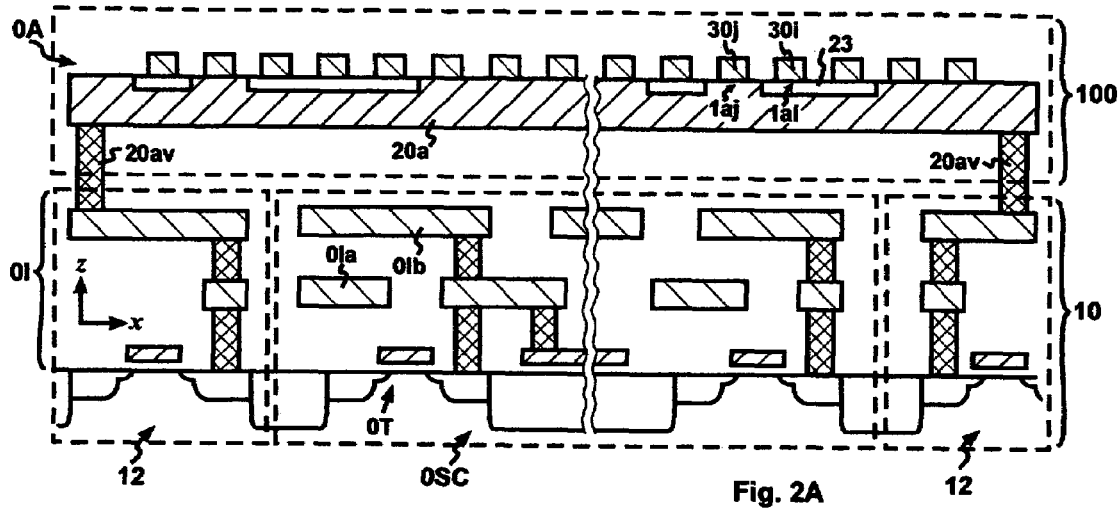
FIGS. 2A–2C illustrate a preferred 3DiM and its substrate-IC.

FIG. 2A is a cross-sectional view of a 3DiM. In a 3DiM, 3D-M array 0A is integrated with substrate circuit 0s. 3D-M array 0A comprises one or more three-dimensional (3-D) memory level 100. Each 3-D memory level 100 comprises a plurality of address-select lines ($20a$, $30i$ . . . ) and 3D-M cells ($1ai$ . . . ). The address-select lines comprise metallic material and/or doped semiconductor material. Transistors 0T and their interconnects (0Ia, 0Ib . . . ) form substrate circuit 0s. From a circuit perspective, substrate circuit 0s comprises a substrate-IC 0SC and address decoders 12, 18/70. These address decoders perform address decoding for the 3D-M array 0A. Contact vias ($20av$ . . . ) provides electrical connection between the address-select lines ($20a$ . . . ) and the substrate circuit 0s (e.g. address decoder).

In certain applications, the address-select lines in the 3D-M prefer to comprise poly-crystalline semiconductor (referring to FIGS. 9–11). The standard process to form poly-silicon requires a high temperature step of >500° C. To avoid damage to the substrate circuit, its interconnect system 0I (including metal wires and the insulating dielectric between them) is preferably made of refractory conductors (e.g. refractory metal, doped poly-silicon, silicides) and thermally-stable dielectrics (e.g. silicon oxide, silicon nitride). Here, tungsten (W) is a good candidate for refractory conductors. It is a mature technology and its resistivity is only 5.2 $\mu$W·cm. The W-based substrate-IC can meet the processing-power requirements for most 3DiM applications, particularly audio/video (A/V) players.

Figure 2B:
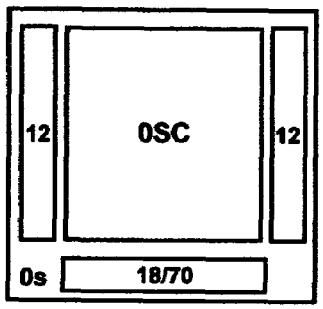
Figure 2C:
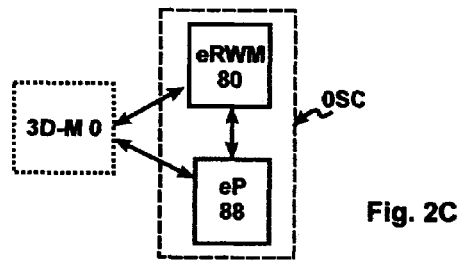

FIG. 2B is a block diagram of the substrate circuit 0s on the 3DiM. Since the 3D-M cells do not occupy substrate real estate and the address decoders 12, 18/70 occupy just a small portion thereof, most substrate real estate can be used to build substrate-IC 0SC. As illustrated in FIG. 2C, the substrate-IC 0SC may comprise embedded RWM (eRWM) 80 and/or embedded processor (eP) 88. The eRWM 80 includes embedded RAM (eRAM) and embedded ROM (eROM). The RAM in the eRAM could be SRAM or DRAM; the ROM in the eROM is preferably non-volatile memory (NVM), such as MROM, EPROM, EEPROM and flash. The eP 88 includes embedded decoder, D/A converter, decryption engine and others. An exemplary eP is embedded media player (eMP), which plays audio/video (A/V) materials. Integrated with the 3D-M 0, the substrate-IC 0SC can implement various functions: the eRAM can be used as a cache for the 3D-M data (referring to FIG. 17); the eROM can be used in the redundancy circuit and software-upgrade blocks (referring to FIGS. 25–26); the eP can be used in computer-on-a-chip (ConC) and player-on-a-chip (PonC) (referring to FIGS. 3–4). In these applications, the substrate-IC 0SC works for the 3D-M 0. On the other hand, the 3D-M 0 can work for the substrate-IC 0SC. The 3D-M can carry the test data for the IC under test so that 3D-M-based self-test can be realized (referring to FIGS. 28–33).

A. Computer-on-a-Chip (ConC)

FIGS. 3A–3D illustrate several preferred computer-on-a-chip (ConC). The substrate-IC 0SC in a ConC comprises an eRAM 82 and an eP 88. The 3D-M 0 and the eRAM 82 form the memory space 86 of the ConC. Data from the 3D-M is first copied into the eRAM before being processed by the eP. This reconciles the speed difference between the eP and 3D-M. A preferred implementation is illustrated in FIG. 17. This ConC hierarchy (3D-M 0→eRAM 82→eP 88) is similar to that of a conventional computer (HDD→RAM→CPU). In a conventional computer, with a large capacity, hard-disk drive (HDD) is used as the primary storage device; with a long latency (~ms), the HDD needs a RAM as its cache. In a ConC, with a large capacity, 3D-M is used as the primary storage device; with a somewhat long latency, the 3D-M also needs RAM 82 as its cache. However, because the 3D-M latency (~$\mu$s) is much shorter than the HDD latency, the RAM needed by the ConC is far less than that needed by a conventional computer.

In a ConC, software codes are preferably stored in the 3D-M and data can be stored in the eRAM and/or eROM.

Figure 3A:
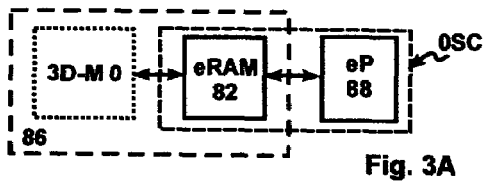
FIGS. 3A–3D illustrate several preferred computers-on-a-chip (ConC).
Figure 3B:
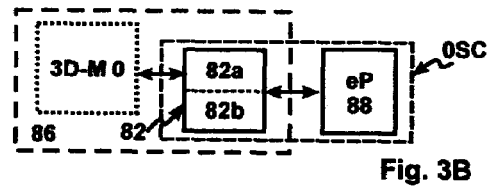
Figure 3C:
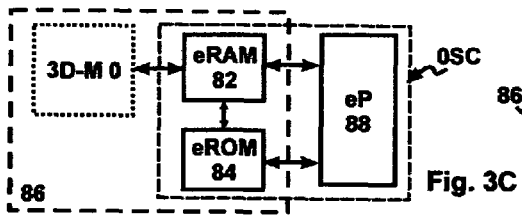
Figure 3D:
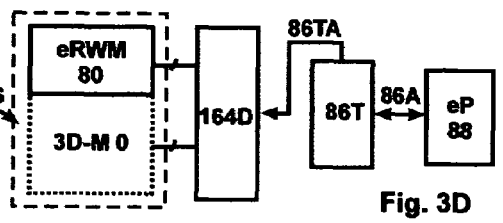

When copied into eRAM, software codes can share the same eRAM 82 with the data (FIG. 3A), or be separated into different sectors (e.g. sector 82a stores software codes and sector 82b stores data) (FIG. 3B). For the data stored in the eROM 84, they can be either first copied into the eRAM 82 and executed from there, or executed-in-place (FIG. 3C). To simplify the hardware design, ConC can use address-translation (FIG. 3D). For address-translation, 3D-M 0 and eRWM 80 form a unified memory space 86S. The address 86A from the eP 88 is first sent to an address-translation block 86T, which treats this address 86A as a virtual address and translates it into a physical address 86TA. The output of the address-translation block 86T is connected with the input of the address-decoder 164D for the unified memory space 86S. Based on the physical address 86TA, data are read out either from the 3D-M 0 or from the eRWM 80. The details of address-translation are explained in FIG. 26C.

Figure 4A:
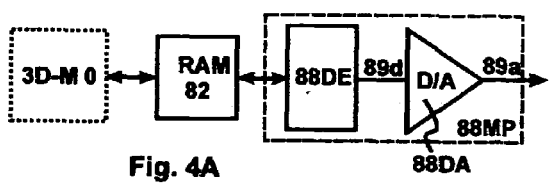
FIGS. 4A–4B illustrate two preferred players-on-a-chip (PonC).

In the area of content storage (electronic books, electronic maps, more particularly A/V materials), ConC can help to realize player-on-a-chip (PonC). PonC provides excellent copyright protection for content providers. Currently, contents are released in optical discs (e.g. CD, DVD). Because optical disc cannot be integrated with content players (e.g. A/V players), the original contents can be easily stolen from the interface between optical discs and content players. On the other hand, in a PonC, the 3D-M 0—as the content carrier—is integrated with an embedded media-player (eMP) 88MP (FIG. 4A). The decoder 88DE in the eMP 88MP performs the on-chip decoding. More ideally, an on-chip D/A converter 88DA further converts digital A/V signals 89d into analog A/V signals 89a. Moreover, if the original contents are "sealed" into the 3D-M "pre-sale" by mask or electrical means, the original contents are not exposed to a second party in any form and they cannot be digitally duplicated. As a result, PonC provides excellent copyright protection. PonC can help to miniaturize "digital walkman", "wearable compute" and others. In the near future, these devices will just comprise a chip, a battery and output means (headset and/or micro-display).

Figure 4B:
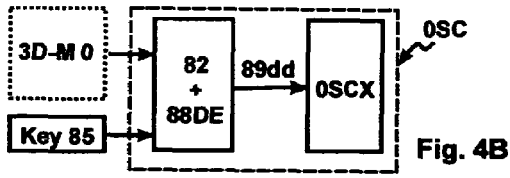

For the 3DiM using 3D-MPROM to carry contents or other sensitive data, to prevent professional pirates from stealing the 3D-MPROM data from its info-via pattern by reverse-engineering means such as de-layering, the 3D-MPROM data are preferably encrypted. To take full advantage of the 3D-M's integratibility, the substrate-IC 0SC preferably further comprises an on-chip decryption engine 88DE and an on-chip key storage 85 (FIG. 4B). The 3D-MPROM data are decrypted on-chip. The decrypted data 89dd are sent to the other functional blocks 0SCX on the 3DiM. As a result, it is very difficult to reverse-engineer the 3D-M data.

B. Shielding

In a 3DiM, when a substrate circuit is running at high speed, it may interfere with the data read-out in the 3D-M. To minimize interference in certain applications, a shielding layer 10S is preferably inserted between the substrate circuit and the data read-out line. FIGS. 5AA–5CB illustrate three preferred shielding layers. FIGS. 5AA–5AB are the cross-sectional view and plan view of a 3DiM with a first preferred shielding layer 10S. This preferred shielding layer 10S comprises a dedicated metal layer. In this metal layer, a metallic piece 0IS covers most area of the substrate circuit 0s and provides shielding. FIGS. 5BA–5BB are the cross-sectional view and plan view of a 3DiM with a second preferred shielding layer 10S. In this preferred embodiment, a word-line layer 20a separates the remaining 3D-M 0 from the substrate circuit 0s. Since they are minimum-spaced and their voltages are typically static (i.e. either at GND or at $V_R$), word lines 20a—when used as the shielding layer 10S—can shield most electromagnetic (EM) interference between the substrate circuit 0s and the 3D-M 0. FIGS. 5CA–5CB are the cross-sectional view and plan view of a 3DiM with a third preferred shielding layer 10S. Since the top metal layer of the substrate circuit 0s is typically used for the power supply routing (which is static), it can also be used as the shielding layer for the substrate circuit 0s. To minimize the EM interference between the substrate circuit 0s and the 3D-M 0, the spacing d between $V_{DD}$ supply 0Ib1 and GND supply 0Ib2 is preferably minimized. Note that in FIGS. 5BA–5CB, the shielding layer 10S uses an existing interconnect layer and no dedicated shielding layers are needed.

C. Interface Wiring

FIG. 6AA illustrate a conventional arrangement of a 3D-M array 0A and its contact vias 20av–20hv. FIG. 6AB is a cross-sectional view along A'A". Viewed at the substrate-IC, these contact vias 20av–20hv and the 3D-M array 0A form a "dense net". This "dense net" makes interfacing the substrate-IC with external world (outside the chip) very difficult.

To interface the substrate-IC with external world, embedded wire (FIGS. 6BA–6BB) and bended address-selection line (FIGS. 6CA–6CB) are preferably used. FIGS. 6BA–6BB illustrate a preferred embedded wire 20ei. It is particularly suitable for flip-chip, BGA and other package designs. In the 3D-M array, there are a plurality of gaps between certain address-select lines, e.g. a first gap 20gap between word lines 20p, 20q and a second gap 30gp between bit lines 30p, 30q (FIG. 6BA). A landing pad 20lp1 is formed in the intersection of the first and second gaps 20gp, 30gp. The landing pad 20lp1 in memory level 100, landing pad 20lp1' in memory level 200 and contact vias 20lv1–20lv3 form an embedded wire 20ei (FIG. 6BB), which interfaces the substrate-IC to the external world. The embedded wire 20ei can be placed nearly anywhere on the chip. Being short, it helps to maintain the circuit speed.

FIGS. 6CA–6CB illustrate preferred bended address-select lines. In this preferred embodiment, word lines 20a–h are divided into two groups: Group A includes word lines 20a–d; Group B includes word lines 20e–h. Word lines in each group are bended in such a way that interfacing gap 20gpb is formed between contact vias 20av–20dv and 20ev–hv associated with each group (FIGS. 6CA–6CB). The interfacing gap allows the interfacing wires of the substrate-IC to pass through. In addition, the placement of contact vias 20av–20hv could be more flexible. Their spacing $d_{cv}$ can be larger than that in a 3D-M based on a conventional design (in a conventional 3D-M design, $d_{cv}$ is equal to the spacing between address-select lines $d_{al}$, referring to FIG. 6AA). Accordingly, bended address-select lines can facilitate the layout of the address decoders.

D. Address-Decoder Fold-Back

One way to increase the 3D-M capacity is to improve its array efficiency. Array efficiency is the ratio between the area of the memory array and that of the whole chip. For a conventional transistor-based memory, because the peripheral circuit and memory array both reside in substrate, peripheral circuit is located "around" the memory array. Accordingly, its array efficiency is typically ~60%. For a 3D-M, since its memory array is located above the substrate, its peripheral circuit can be folded-back under its memory array with the help of routing levels (referring to FIG. 14 of U.S. Pat. No. 5,835,396). As a result, the memory array can occupy nearly the whole chip area and its array efficiency can approach 100%. Moreover, for the 3D-M integrated with a substrate-IC, its routing levels can utilize the existing interconnect layers of the substrate-IC (FIG. 2A). This simplifies the process. FIGS. 7AA–7BC illustrate several preferred fold-back schemes and the routing levels involved.

FIGS. 7AA–7AC illustrate a preferred fold-back scheme based on separate routing levels. This preferred embodiment comprises an interconnect 0R with four routing levels 0r1–0r4 and a memory array 0A with four address-select-line layers 20a', 30a', 20a, 30a. Each routing level (0r1–0r4) is separately dedicated for one address-select-line layer (30a, 20a, 30a', 20a', respectively) (FIGS. 7AA–7AB), thus it is referred to as separate routing level. Here, the routing level 0r2 folds the address decoder connected with the word line 20a back under the memory array 0A; the routing levels 0r1, 0r3, 0r4 perform similar task. Accordingly, address decoders can be placed nearly anywhere under the memory array (FIG. 7AC): row decoders 12l, 12r can be placed on its left- and right-hand sides; column decoders 18t, 18b can be placed on its top- and bottom-sides; for the word lines whose ends are located at the array corner, their row decoders 12tl (connected to word lines by connecting wire 0cw) can be placed at the near-center position of the memory array. As a result, all peripheral circuit can be placed under the memory array 0A. Apparently, separate routing levels support double-driven address-select lines (i.e. the address-select lines driven from both ends, e.g. word/bit lines of 3D-EPROM and word line of 3D-MPROM).

FIGS. 7BA–7BC illustrate an alternate preferred fold-back scheme based on shared routing levels. As its name suggests, two levels of address-select lines share one routing level, i.e. word line 20a and bit line 30a share routing level 0r1'; word line 20a' and bit line 30a' share the routing level 0r2' (FIGS. 7BA–7BB). Similarly, the routing levels 0r1', 0r2' fold address decoders back under the memory array 0A (FIG. 7BC). It is more suitable to single-driven address-select lines (i.e. the address-select lines driven from a single end).

E. 3D-M Supporting High-Temperature Operation

Figure 1A:
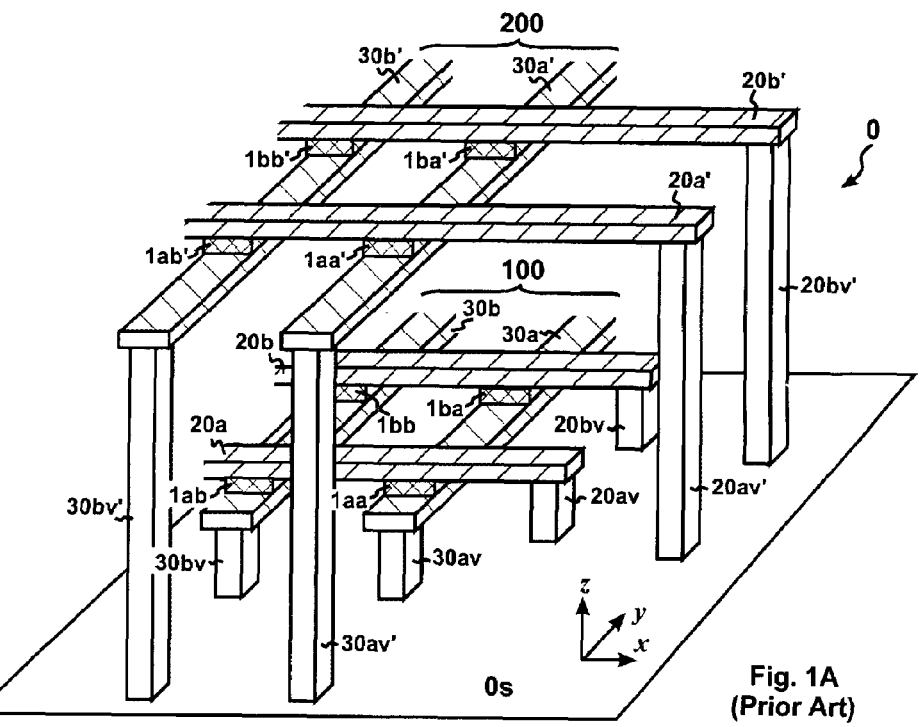
FIG. 1A is a perspective view of a preferred 3D-M.
Figure 1B:
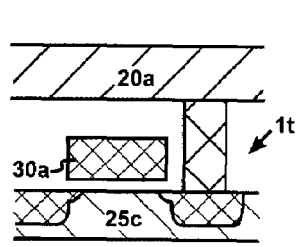
FIG. 1B illustrates a preferred 3D-RAM cell based on thin-film transistors.
Figure 1D:
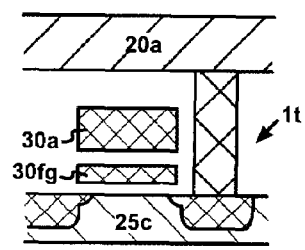
FIGS. 1DA–1DB illustrates two preferred 3D-WM cells based on thin-film transistors.
Figure 1D:
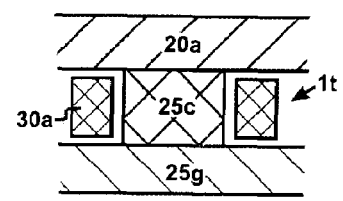
Figure 1C:
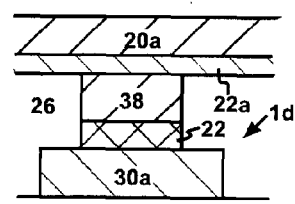
FIG. 1C illustrates a preferred 3D-OTP cell based on antifuse.
Figure 1E:
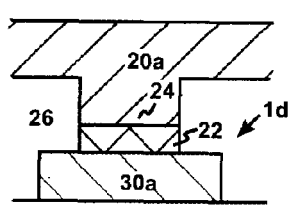
FIGS. 1EA–1EB illustrate preferred logic "1" and "0" 3D-MPROM cells.
Figure 1E:
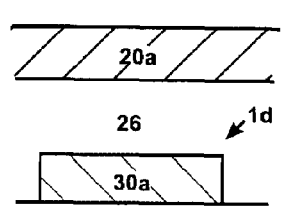

In certain 3DiM applications, more particularly ConC, 3D-M needs to support high-temperature operation. At a high ambient temperature, the 3D-M based on poly- or α-silicon may have a large leakage current. In order to guarantee a normal operation, the semiconductor materials used in 3D-M cells could have large bandgap ($E_g$). Examples include C and $SiC_x$. Alternatively, these semiconductor materials could be doped with elements such as C, O, N. These elements can adjust the bandgap of the semiconductor materials. Accordingly, the 3D-ROM layer 22 in FIG. 1DA may comprise a layer of high-$E_g$ semiconductor materials, such as C, $SiC_x$ (x>0), $SiO_y$ (y>0), $SiN_z$ (z>0).

2. 3D-ROM Structure

With a simple structure and excellent manufacturability, diode-based 3D-ROM will very likely become the first 3D-M put into mass production. Moreover, its outstanding integratibility makes the 3D-ROM suitable for ConC/PonC. The present invention makes further improvement on the 3D-ROM.

A. 3D-MPROM

Figure 8A:
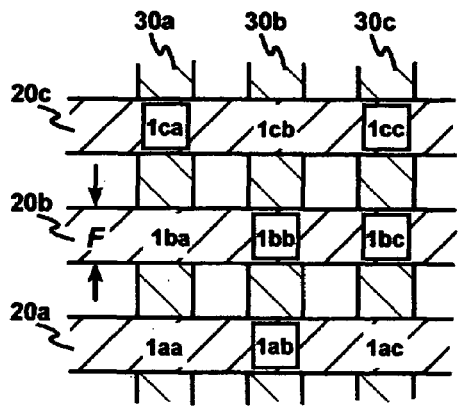
FIGS. 8A–8B compare the relative placements of the 1F- and nF-opening patterns with respect to address-select lines during a preferred 3D-MPROM process.
Figure 8B:
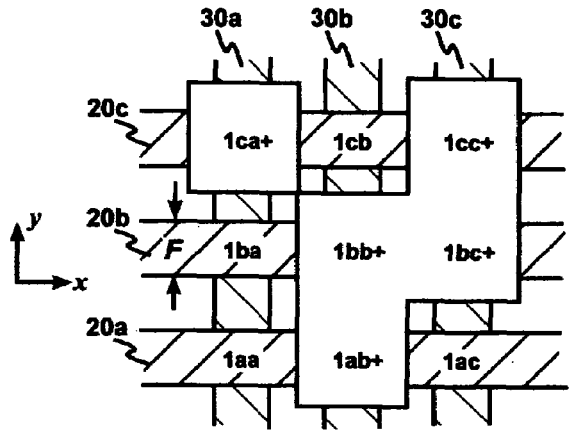

Among all 3D-ROM's, 3D-MPROM is the easiest to be implemented. It distinguishes a logic "0" and "1" through the absence or existence of a via Accordingly, these vias are referred to as info-vias. The cost of a 3D-MPROM chip includes the lithographic cost for its address-select lines and info-vias. The address-select lines do not incur high lithographic cost for the following reasons: their patterns are high repetitive, and they may use phase-shift mask and mature lithography; moreover, the address-select-line mask can be shared in a large number of 3D-MPROM products and therefore, the mask cost per chip is low. In comparison, the lithographic cost for the info-via mask is higher. Fortunately, this cost can be lowered by using. nF-opening mask and programmable litho-system. FIGS. 8A–8B compare 1F-opening mask and nF-opening mask during a preferred 3D-MPROM process flow.

FIG. 8A illustrates the relative placement of the conventional 1F-opening patterns with respect to the address-select-line patterns on silicon. Since the conventional info-via (e.g. 1ca) is located within the intersection of the word and bit lines, its dimension is preferably smaller than or equal to the width of the address-select lines (e.g. 20c, 30a), which is 1F. In fact, 3D-MPROM may use larger info-vias (referring to FIGS. 9–10). FIG. 8B illustrates the relative placement of the nF-opening patterns with respect to the address-select-line patterns on silicon. Here, n=2, i.e. the dimension of info-opening (i.e. the opening for the info-via, e.g. 1ca+) is twice the width of the address-select lines. For example, for the 3D-MPROM based on 0.25 μm technology, its info-via mask can be based on 0.5 μm technology. Moreover, adjacent openings can be merged together on a 2F-opening mask and the no accurate alignment is required during lithography. As a result, the info-opening layer incurs a fairly low lithographic cost. In the preferred embodiments of FIGS. 9–10, nF-opening masks are used. Apparently, 1F-opening may also be used.

FIGS. 9–10 illustrate several self-aligned 3D-MPROM. In a self-aligned 3D-MPROM, the 3D-ROM layer is self-aligned with the word and bit lines and its formation does not require any individual pattern-transfer step. The 3D-ROM layer in FIG. 9 is pillar-shaped and the 3D-ROM layer in FIG. 10 is a natural junction.

Figure 9A:
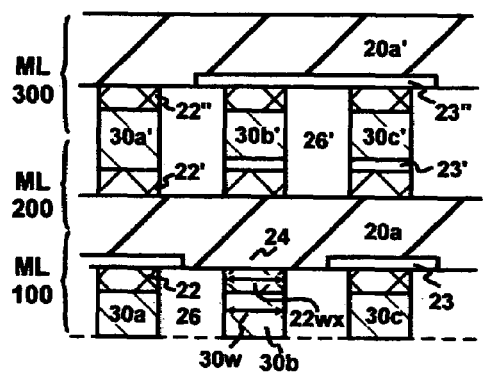
FIGS. 9A–9C illustrate several preferred self-aligned, pillar-shaped 3D-MPROM's and their preferred process flows.
Figure 9C:
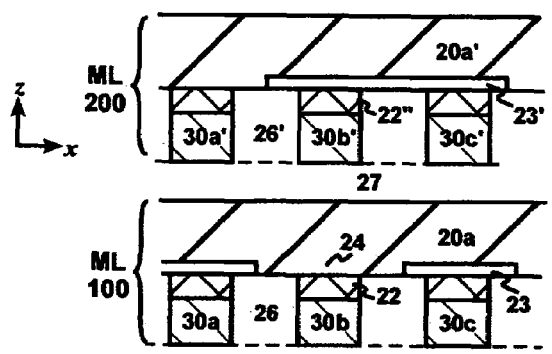
Figure 9B:
Figure 9B:
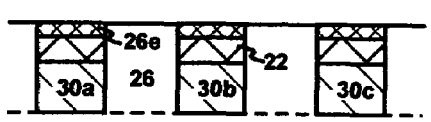
Figure 9B:
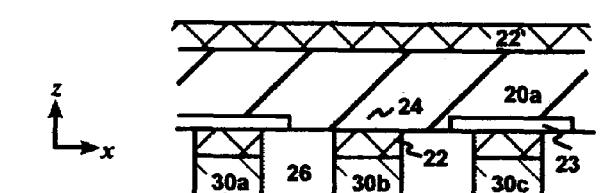
Figure 9B:
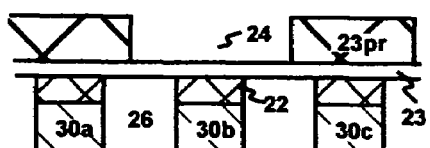
Figure 9B:
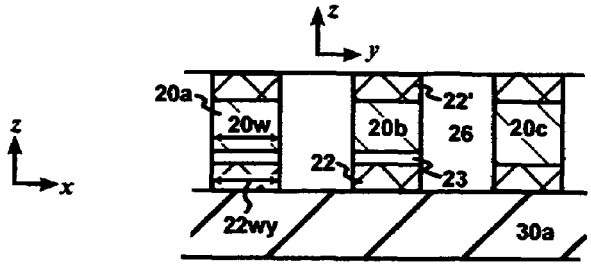

FIGS. 9A–9C illustrate several preferred self-aligned pillar-shaped 3D-MPROM (SP 3D-MPROM) and their preferred process flow. In an SP 3D-MPROM, the 3D-ROM layer has a pillar shape, with one dimension equal to the word-line width and the other dimension equal to the bit-line width. The memory levels in FIGS. 9A–9BD are interleaved; the memory levels in FIG. 9C are separate.

FIG. 9A illustrates an interleaved SP 3D-MPROM (ISP 3D-MPROM). In this preferred embodiment, adjacent memory levels share one address-select line. For example, memory level ML 100 shares with memory level ML 200 word line 20a. Because the address-selection lines are shared, the layering sequences of the 3D-ROM layer in adjacent memory levels are opposite: if the layering sequence for the 3D-ROM layer 22 in ML 100 is N+, N–, P+ (in the order they are formed during process), then the layering sequence for 3D-ROM layer 22' in ML 200 is P+, N–, N+. For the 3D-M cell between word line 20a and bit line 30c, a config-dielectric 23, isolates the word line 20a from the bit line 30c. Accordingly, it represents logic "0". For the 3D-M cell between word line 20a and bit line 30b, config-dielectric 23 is removed and an info-opening 24 allows current flow from the word line 20a to the bit line 30b. Accordingly, it represents logic "1". Because the nF-opening mask is used, along the direction of the upper-level address-select line (word line 20a), the dimension of the info-opening 24 is larger than the width of the lower-level address-select line (bit line 30b).

During the read-out of the ISP 3D-ROM (e.g. ML 200), a read voltage $V_R$ is applied on word line 20a and read current is sensed at bit lines 30a'–30c'. Meanwhile, the address-select lines 20a', 30a–30c on other memory levels are biased in such a way that no read current flows into these memory levels. For example, 20a' is biased at 0V and 30a—30c is biased at $V_R$.

FIGS. 9BA–9BD illustrate a preferred process flow of the ISP 3D-MPROM. First, a bit-line layer 30a and a first 3D-ROM layer 22 are formed consecutively. Then a first etch is performed on the first 3D-ROM layer 22 and the bit-line layer 30a to form bit-line strips. Next, gaps between the bit-line strips are filled with lower-level dielectric 26. This is followed by a planarization step (e.g. CMP) that exposes the first 3D-ROM layer 22 (FIG. 9BA). Alternatively, a bit-line buffer layer 26e is formed on top of the bit-line layer 30a and the first 3D-ROM layer 22 (FIG. 9BA'). This bit-line buffer layer 26e is conductive and preferably patterned by the first etch. This structure can be used in a seamless 3D-ROM cell (referring to section "Yield-enhancement techniques").

Then a config-dielectric 23 is formed on top of the planarized lower-level dielectric 26. If an nF-opening mask is to be used, the lower-level dielectric 26 and config-dielectric 23 preferably comprises different materials. For example, the config-dielectric 23 comprises silicon nitride or interleaved silicon oxide/nitride layers, whereas, the lower-level dielectric 26 comprise silicon oxide. Its purpose will become apparent as FIG. 9BC is explained. This is followed by a lithography step. Photoresist 23pr at the location of logic "0" cell (e.g. at the intersection with the bit line 30a) remains, while photoresist 23pr at the location of logic "1" cell (e.g. at the intersection 24 with the bit line 30b) is removed (FIG. 9BB).

After lithography, a second etch is performed on the config-dielectric 23. Said second etch preferably has good selectivity between the config-dielectric 23 and the lower-level dielectric 26, i.e. it can quickly remove the config-dielectric 23 but stops at the lower-level dielectric 26. Here, along the x direction, the dimension of the info-opening 24 is larger than the width of the lower-level address-select line (bit line) 30b. This preferred structure causes little or no performance penalty. After the second etch, a word-line layer 20a and a second 3D-ROM layer 22' are formed thereon consecutively (FIG. 9BC). Then a third etch removes the second 3D-ROM layer 22', the word-line layer 20a and the first 3D-ROM layer 22 before it stops on the bit-line layer 30a. Said third etch forms word-line strip (FIG. 9BD is its cross-sectional view in the y-z plane. Note that FIGS. 9BA–9BC are cross-sectional views in the x-z plane).

In the preferred process flow of FIGS. 9BA–9BD, there is no individual pattern-transfer step to define the 3D-ROM layer 22. It is formed during the first and third etches and is self-aligned with the word and bit lines. The 3D-ROM layer 22 is pillar-shaped, with its first dimension 22wx equal to the bit-line width 30w (FIG. 9A) and its second dimension 22wy equal to the word-line width 20w (FIG. 9B).

FIG. 9C illustrates a separate SP 3D-MPROM (SSP 3D-MPROM). Its memory levels are separated by an inter-level dielectric 2 and no address-select lines are shared between memory levels FIGS. 10A–10ED illustrates several preferred self-aligned natural-junction 3D-MPROM (SN 3D-MPROM) and their preferred process flow. In an SN 3D-MPROM, there is no dedicated 3D-ROM layer. The diode or similar junctions are formed naturally at the intersection between word and bit lines. One part of the 3D-ROM layer is in the word line and the other part in the bit line. The memory levels in FIGS. 10A–10CD are interleaved, while the memory levels in FIGS. 10D–10ED are separated.

Figure 10A:
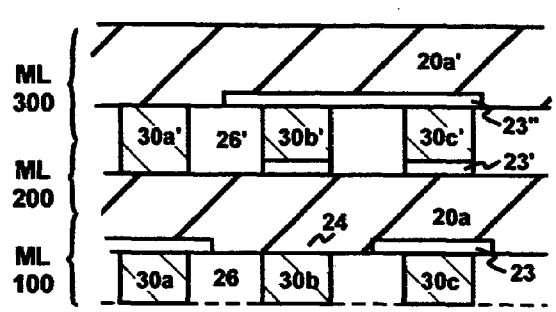

FIG. 10A illustrate an interleaved SN 3D-MPROM (ISN 3D-MPROM). Its structure resembles that of FIG. 9A except that there is no dedicated 3D-ROM layer 22. FIGS. 10BA–10BD illustrate several preferred ISN 3D-MPROM cells. In each figure, there are two memory cells 1nj, 1/0. Memory cell 1nj is located on top of memory cell 1/0 and they share one electrode 20a. Memory cell 1nj represents logic "1" and memory cell 1/0 represents logic "0".

FIG. 10BA illustrates a natural P+/N–/N+ diode junction. For memory cell 1nj, word line 20a (comprising poly P+ silicon or other semiconductor materials) and bit line 30a' (comprising three sub-layers: N+ poly 30a1', N– poly 30a2', N– poly 30a3') form a natural P+/N–/N+ diode junction at their intersection. It represents logic "1". Moreover, N-poly 30a3' can form another natural junction with the word line 20a' (as illustrated in FIG. 10A but not shown here). For memory cell 1/0, the existence of config-dielectric 23 between the word line 20a and the bit line 30a prevents the formation of a natural junction. Accordingly, it represents logic "0".

The preferred embodiment in FIG. 10BA can be formed by standard process: poly silicon in the address-select lines 30a, 20a, 30a' can be formed by a standard poly process; after the formation of all address lines, a high temperature anneal activates dopants and can form excellent natural diode junctions. Since high temperature is involved, the substrate interconnects preferably comprise refractory conductors (e.g. refractory metal, their alloys, composites or even highly-doped poly).

FIG. 10BB is similar to FIG. 10BA except that word line 20a comprises metallic materials (e.g. W, Pt). In this preferred embodiment, a natural Schottky diode is formed at the intersection between the word line 20a and the bit line 30a'. It can also be formed by standard process.

In FIG. 10BC, at least one metallic layer is inserted in the word and bit lines. Here, bit line 30a' comprises five sub-layers: N– poly 30a2', N+ poly 30a5', metallic layer 30a4', N+ poly 30a6', N– poly 30a3'; word line 20a comprise three sub-layers: P+ poly 20a2, metallic layer 20a1, P+ poly 20a3. The insertion of metallic layers 30a4', 20a1 can significantly reduce the parasitic series resistance of the address-select lines and therefore, improve the read speed. Alternatively, a first address-select-line layer (e.g. word line) comprises metallic materials and a second address-select-line layer (e.g. bit line) comprises semiconductor materials.

Similarly, poly bit lines in FIG. 10BB may also comprise metallic layers 30a3, 30a4'. This is illustrated in FIG. 10BD. Alternatively, a metallic ion-implant can be performed to the poly address-selection lines of FIGS. 10BA–10BB so that their parasitic series resistance can be reduced. This method does not require extra metallic layers and can lower the manufacturing complexity.

Figure 10D:
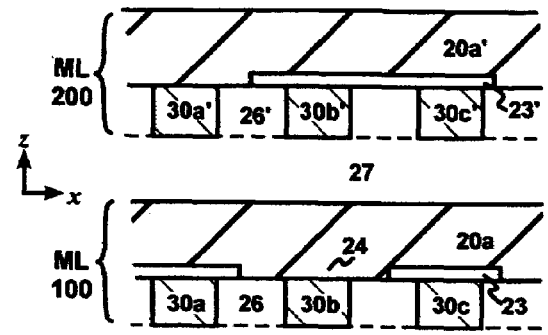
Figure 10B:
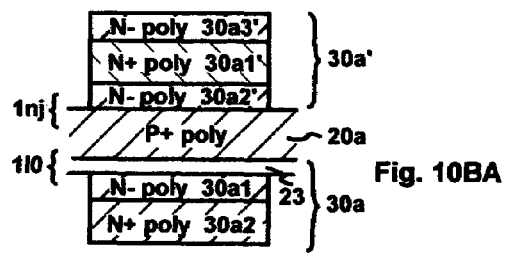
Figure 10B:
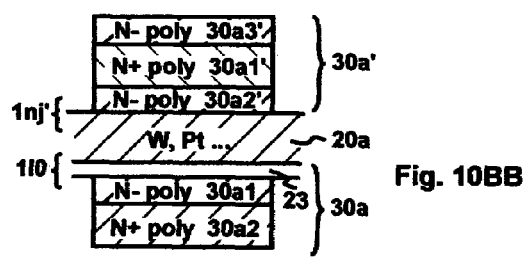
Figure 10B:
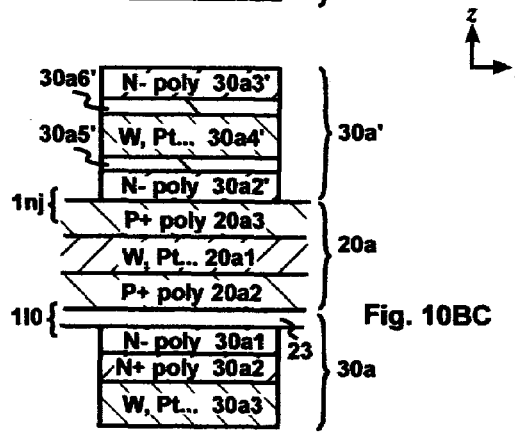
Figure 10B:
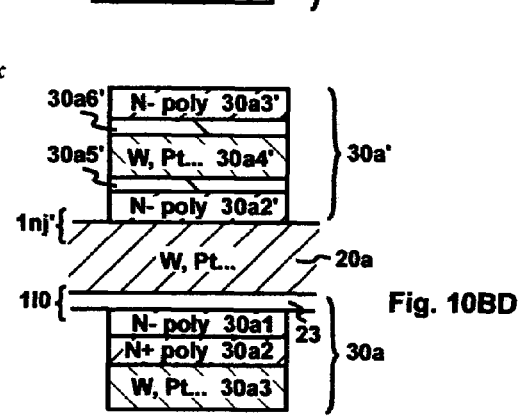
Figure 10C:
Figure 10C:
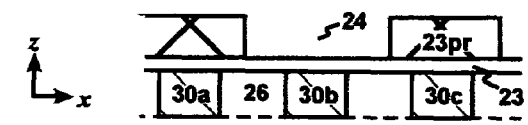
Figure 10C:
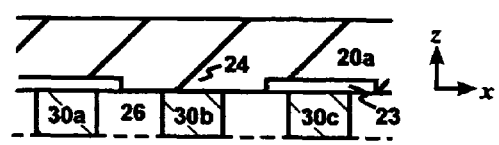
Figure 10C:
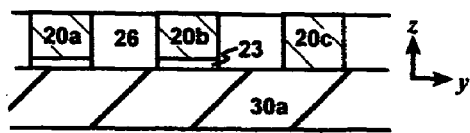

FIGS. 10CA–10CD illustrate a preferred process flow of a INJ 3D-MPROM. It is similar to FIGS. 9BA–9BD. In FIG. 10CA, bit-line strips 30a are formed by a first etch and lower-level dielectric 26 is planarized. In FIG. 10CB, photoresist 23pr is applied to config-dielectric 23 and exposed to the nF-opening mask. In FIG. 10CC, the config-dielectric 23 is removed by a second etch at the desired location 24 and word-line layer 20a is formed. In FIG. 10CD, the word-line strips 20a are formed by a third etch (FIG. 10CD is a cross-sectional view in the y-z plane; FIGS. 10CA–10CC are cross-sectional views in the x-z plane). This preferred process flow is very simple. For the preferred embodiments of FIGS. 10BA–10BB, their address-select lines comprise one material, the etching of which can be easily implemented.

FIG. 10D illustrates a separate SN 3D-MPROM (SSN 3D-MPROM). It comprises two separate memory levels ML 100 and 200, separated by inter-level dielectric 27.

FIGS. 10EA–10ED illustrate several preferred SSN 3D-MPROM cells. Because word/bit lines are not shared between adjacent memory levels, their structures are simpler than those of FIGS. 10BA–10BD. FIG. 10EA illustrates a preferred natural P+/N–/N+ diode junction 1*nj* formed between word line 20*a* and bit line 30*b*. FIG. 10EB illustrates a preferred natural Schottky junction 1*nj'*. FIG. 10EC is similar to FIG. 10EA, except that metallic layers 20*a*1, 30*b*3 are inserted into the poly lines. Similarly, it is also feasible to insert metallic layers into just one address-select-line level (preferably word lines). FIG. 10ED is similar to FIG. 10EB, expect that metallic layers 30*b*3 are inserted into bit line 30*b*. These metallic layers can reduce the parasitic series resistance of address-select lines and improve the read speed. Alternatively, a metallic ion-implant can be performed to the poly lines of FIGS. 10EA–10EB.

B. 3D-EPROM Cells

FIGS. 11BA–11BB illustrate two preferred 3D-EPROM cells with metal/semiconductor address-select lines. It borrows the concept from FIGS. 10BC–C–10BD, 10EC–10ED, i.e. metallic layers 20*a*1, 30*c*3 are inserted into the poly lines; or a metallic ion-implant is performed to the poly lines. They can reduce the parasitic series resistance of the address-select lines. Accordingly, under the same programming condition, the programming current is larger and therefore, programming becomes faster and more reliable. Moreover, with a smaller RC delay, read speed can significantly be improved. Antifuse layer 22*a* can be located between the N+ poly 30*c*2 and N– poly 30*c*1 of FIGS. 11A–11B, or between P+ poly 20*a*2 and N– poly 30*c*1 of FIG. 11A, or between word line 20*a* and N– poly 30*c*1 of FIG. 11B.

C. Inverted-U Link

Many address-selection lines in FIGS. 9–11 (e.g. 30*a'* of FIGS. 10BA–10BD) are composite lines. Composite lines comprise at least a highly-conductive layer and a bottom lightly-doped (semiconductor) layer. As its name suggests, the bottom lightly-doped layer is located at the bottom of the composite line. Besides the 3D-M, composite lines can also be used in other integrated circuits. To contact a line with a via, the conventional approach makes the contact from below (e.g. FIG. 2A). For the composite line, contact-from-below cannot make good ohmic contact. Accordingly, the composite line is preferably contacted on top and/or on sidewall by an inverted-U link. This invert-U link makes direct contact to the highly-conductive layer in the composite line. As a result, a small contact resistance can be achieved. FIGS. 12AA–12CB" illustrate several preferred inverted-U links and their preferred process flows.

FIGS. 12AA–12AB illustrate two preferred inverted-U link for a first composite line 30. Here, the first composite line 30 has a bi-layer structure, i.e. it comprises a highly-conductive layer 30*mc* and a bottom lightly-doped layer 30*lda*. In FIG. 12AA, via 30*v* makes contact with the highly-conductive layer 30*mc* of the first composite line 30 on top through a first inverted-U link 30*uc*. In FIG. 12AB, via 30*v* makes contact with the highly-conductive layer 30*mc* of the first composite line 30 on top and on sidewall through a second inverted-U link 30*bc*.

FIGS. 12BA–12BB illustrate two preferred inverted-U link to a second composite line 30'. The second composite line 30' has a tri-layer structure, i.e. it further comprise a top lightly-doped layer 30*ldb* and the highly-conductive layer 30*mc* is sandwiched between both lightly-doped layers 30*lda*, 30*ldb*. In FIG. 12BA, via 30*v* makes contact with the highly-conductive layer 30*mc* of the second composite line 30' on top through a third inverted-U link 30*uc'*. In FIG. 12BB, via 30*v* makes contact with the highly-conductive layer 30*mc* of the second composite line 30' on top and on sidewall through a fourth inverted-U link 30*bc'*. Note that a portion of the top lightly-doped layer 30*lda* is removed to expose a portion of the highly-conductive layer 30*mc*.

FIGS. 12CA–12CC illustrate a preferred process flow for the first inverted-U link. After the formation of the via 30*v*, the first composite line 30 is formed and it is covered with a dielectric 30*vd* (FIG. 12CA). At this point, there is no contact between the via 30*v* and the first composite line 30. Two openings 30*v*1, 30*v*2 are formed in the dielectric 30*vd*. The opening 30*v*1 exposes the via 30*v* and the opening 30*v*2 exposes a portion of the first composite line 30 on top (FIG. 12CB). Then conductive materials 30*uc*1 are filled in these opening (FIG. 12CC). Another metallization step completes the structure of FIG. 12AA.

The preferred process flow for the inverted-U link of FIG. 12AB is similar to that for FIG. 12AA, except that via 30*v*3 also exposes the sidewalls of the first composite line 30 (FIG. 12CB'). This facilitates contact to the first composite line 30 on its sidewalls.

The preferred process flows for the inverted-U link of FIGS. 12BA–12BB are similar to those for FIGS. 12AA–12AB, except that during the formation of vias 30*v*2, a portion of the top lightly-doped layer 30*ldb* is etched away and a portion of the highly-conductive layer 30*mc* is exposed. Moreover, techniques such as dual damascene can be used. FIG. 12CB" illustrates a preferred inverted-U link using dual damascene before the filling of conductive materials. Besides the openings 30*v*1, 30*v*2, a trench 30*t* is formed in the dielectric 30*vd*.

3. 3D-M Speed

Using 3D-ROM as an example, the present invention makes further improvement on the 3D-M speed by optimizing its transistor-level designs, more particularly, the designs of 3D-M core, 3DcM (cached 3D-M) and programming circuits. For the design perspective, techniques such as sense-amplifier (S/A), full-read mode and self-timing are preferably used; from the systems perspective, 3DcM is preferably used to hide the 3D-M latency. Accordingly, even though the performance of a single 3D-M cell cannot yet compete with the conventional memory, through system integration, its collective performance can match that of the conventional memory, even excel. To increase the write speed, parallel programming is preferred.

A. 3D-M Core

FIG. 13A illustrates the I/O ports of a preferred 3D-M core 0. A 3D-M core includes the 3D-M array and its basic peripheral circuit. The input signals include row address AS 2 and read-initiating signal RD 4. The output signals include data output DO 8 and data-ready signal RY 6.

FIG. 13B illustrates a basic block diagram of the preferred 3D-ROM core 0. It comprises a 3D-ROM array 0A, a sense amplifier (S/A) block 1', a trip-voltage ($V_M$) generating block 14, a row decoder 12, a bit-line disable block 18', a bias block 16 and an address latch 12*l*. Among these, the 3D-ROM unit array 0A comprises $N_{WL}$ word lines (20*c* . . . ) and $N_{BL}$ bit lines (30*c* . . . ). At each intersection between the word and bit lines, the existence of a diode indicates a logic "1"; the absence indicates a logic "0". Here, bit lines 30*a*–30*d* that store valid data bits are referred to as data bit line. The S/A block 18 amplifies the small analog signals on a bit line 30*c* and converts it into a logic signal 8.

Controlled by S/A-enable signal SE 5, the S/A block 18 samples data only when SE 5 is asserted. The $V_M$-generating-block 14 generates the trip voltage $V_M$ 7. $V_M$ is the input bias voltage at which the S/A is very sensitive to input change. The row decoder 12 selects a single word line based on input address 2l. When RY 6 is asserted, both the row decoder 12 and the bit-line disable block 18' are disabled, i.e. all word and bit lines are pre-/dis-charged to $V_M$. The bias block 16 generates SE 5 through a timing signal TS 8T. At the beginning of a read cycle, SE 5 is low and no data S/A's are enabled. When TS 8T switches to high, SE 5 enables data S/A's and starts data sampling. The data sampling lasts until all output 8 becomes valid. Then RY 6 is issued and data sampling is stopped. This concludes a read cycle. Its timing diagram is illustrated in FIG. 16.

During a major portion of a read cycle, the voltage rise on each bit line is too small to trigger its S/A. If all S/A's are turned on during this period, they would be consuming a lot of power while their outputs are not valid. It is preferably to just leave a small number of S/A's on, which monitor the voltage change on their bit lines. Only when they sense a large enough voltage change, other S/A's are turned on and start to sample. Accordingly, the majority of S/A's are turned on only during a small fraction of the read cycle, thus saving power. This is the concept behind self-timing.

FIG. 13C illustrates a preferred implementation of self-timing. A first timing bit line 30T is added to the 3D-ROM array 0A. It is preferably the bit line located farthest from any row decoder. It has a diode connection (1aT . . . ) with every word line (20a . . . ) it crosses. During read, the voltage rise on the first timing bit line 30T is preferably slower than that on any data "1" bit lines (data "1" bit line is a data bit line that reads out a logic "1"). Accordingly, when the first timing S/A 17T is triggered, the voltage change on all data "1" bit lines should have been large enough to trigger their respective S/A 17a–17d. Then the data S/A 17a–17d are turned on and start to sample data.

FIG. 13C also illustrates the S/A block 18, the bias block 16, the row decoder 12 and the bit-line disable block 18' in more details.

The S/A block 18 comprises at least a first timing S/A 17T and a plurality of data S/A 17a–17d. When the voltage on a bit line exceeds a threshold voltage $V_T$, its S/A output switches to high. Here, the data S/A 17a–17d are controlled by SE 5 and they only sample data when SE S is high. Since the first timing S/A 17T keeps monitoring the voltage on the first timing bit line 17T during read, its bias signal 5T stays constant during read.

The bias block 16 generates SE 5 based on the output 8T from the first timing S/A 17T. It comprises a timing circuit 15T and a bias-generating circuit 15B. The timing circuit 15T controls timing signal 15d, and the bias-generating circuit 15B generates the biases SE 5 and 5T. When 15d is low, SE 5 becomes asserted.

The row decoder 12 comprises a standard row decoder 12' and a plurality of row-decoder disable blocks 11a–11d. When RY 6 is high, row decoder 12 is disabled and all word lines are shorted to VM 7; when RY 6 is low and 20a' is high, word line is connected to $V_R$ and the 3D-M is switched to the read mode.

In the bit-line disable block 18', each bit line is connected to VM 7 through a switch (e.g. transistors 17a'—17d'). The controls of all switches are shorted to RY 6. When RY 6 is high, all bit lines are shorted to $V_M$ 7. The bit-line disable block 18' enables the full-read mode for the 3D-M.

Referring now to both FIGS. 13B and 13C, a preferred 3D-ROM read-out flow is disclosed. Its timing diagram is illustrated in FIG. 16. The data are preferably read out in a full-read mode, i.e. all data on a single word line are read out in a single read cycle. To be more specific, the 3D-ROM core 0 is initially at its default state, i.e. all word/bit lines are biased at $V_M$ and all S/A's are disabled. On the rising edge of RD 4, address latch 12l captures AS 2 (e.g. 00) and sends it to the row decoder 12. Then the corresponding word line 20a raises its voltage to $V_R$ and starts to charge every bit line (30a . . . ) that has a diode connection with it. At this moment, all data S/A's 17a–17d are still off, but the first timing S/A 17T keeps monitoring the voltage on the first timing bit line 30T. When it exceeds $V_T$, 8T switches to high and SE S becomes asserted. Then all data S/A's 17a–17d are turned on and start to sample the voltage on their respective bit lines 30a–30d. After DO 8 is generated, SE 5 returns to low and all data S/A's returns to off. Since the word line 20a does not need to stay at $V_R$ any more, RY 6 is issued and the 3D-ROM core 0 returns to its default state. This concludes one read cycle T.

Figure 14A:
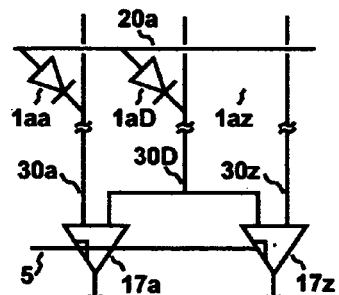
FIGS. 14A–14G illustrate the design of several preferred circuit blocks in the preferred 3D-ROM core.
Figure 14B:
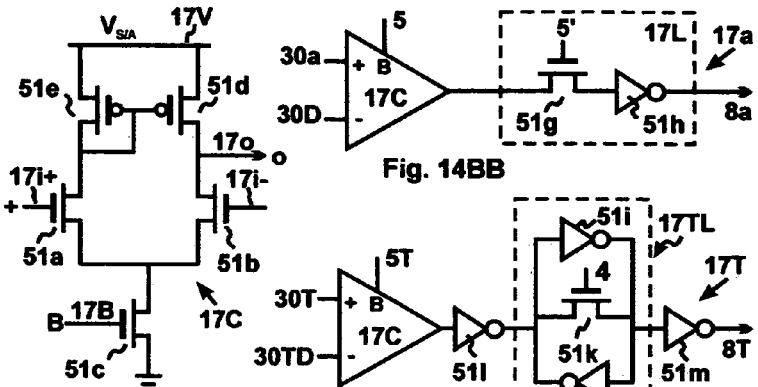
Figure 14C:
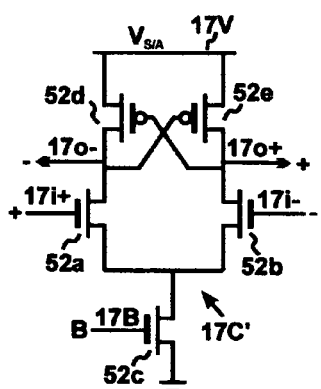
Figure 14C:
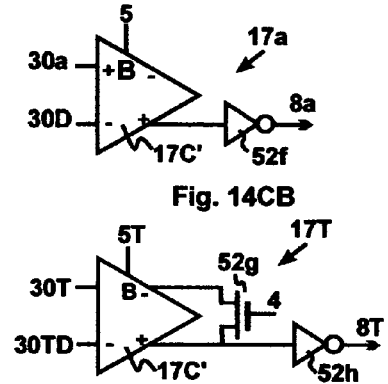
Figure 14D:
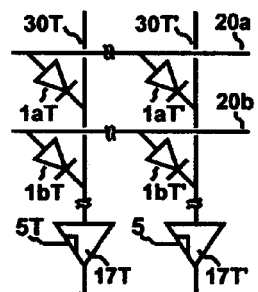
Figure 14D:
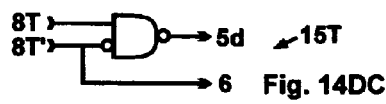
Figure 14D:
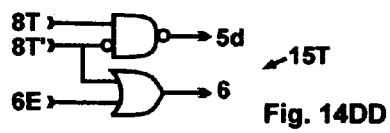
Figure 14E:
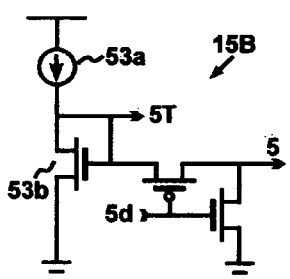
Figure 14D:
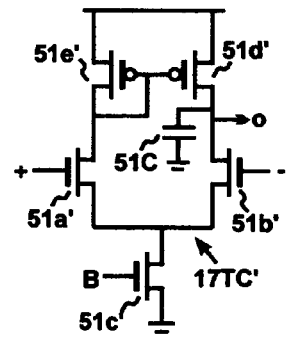
Figure 14F:
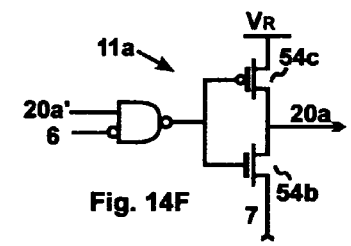
Figure 14G:
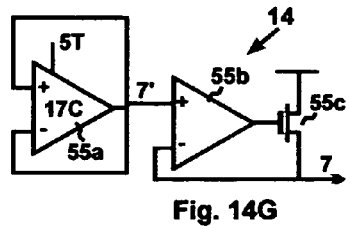

FIGS. 14A–14G disclose the designs of several circuit blocks used in the 3D-ROM core. FIGS. 14A–14CC illustrate several differential S/A's. FIGS. 14DA–14DD disclose a second timing bit line and the design of the timing circuit 15T. FIGS. 14E-14G illustrate a bias-generating circuit 15B, row-decode disable block 11a and $V_M$-generating-block 14.

To achieve noise immunity, S/A preferably uses differential S/A. Besides taking the bit-line voltage as one input, differential S/A needs a reference voltage. It can be provided by a dummy bit line. FIG. 14A illustrates two bit lines under read (30a, 30z), a dummy bit line 30D and their connections with two differential S/A's (17a, 17z). The dummy bit line 30D can be shared by a number of S/A's. It has a diode connection 1aD at each cross-point with word lines. During read, the value of the dummy-bit-line voltage is preferably between those on the data "1" and "0" bit lines.

FIG. 14BA is a circuit diagram of a first preferred differential S/A core 17C. It uses an NMOS input pair 51a, 51b and a mirrored PMOS load pair 51d, 51e. Its power supplies include $V_{S/A}$ and GND. Note that $V_{S/A}$ may be different from $V_{dd}$. Bias signal B controls the tail current through NMOS 51c. FIG. 14BB illustrates a preferred data S/A based on the first preferred S/A core 17C. It further comprises a latch 17L formed by an NMOS 51g and an inverter 51h. Through latch signal 5', NMOS 51g is turned on when SE 5 becomes high and turned off before SE 5 becomes low. Accordingly, even during the period when the first S/A core 17C does not sample data, output 8a still keeps its value. FIG. 14BC illustrates a preferred first timing S/A based on the first preferred S/A core 17C. It always samples data Inverter pair 51i, 51j form a latch 17TL and inverters 51l, 51m adjust the waveform shape. At the being of each read cycle, NMOS 51k clears the latch 17TL under the control of RD 4 (i.e. equalization).

FIG. 14CA is a circuit diagram of a second preferred differential S/A core 17C'. Different from FIG. 14BA, it uses a cross-coupled PMOS load pair 52d, 52e. Bias signal B controls the tail current through NMOS 52c. When B is low, the outputs o+, o− of the second preferred S/A core 17C' keep their values right before B is turned low. Thus, this S/A itself works as a latch FIG. 14CB illustrates an alternate preferred data S/A based on the second preferred S/A core 17C'. Inverter 52f adjusts the waveform shape. FIG. 14CC illustrates an alternate preferred first timing S/A based on the second preferred S/A core 17C'. It always samples data during read. At the beginning of each read cycle, NMOS 52g clears the second preferred S/A core 17C' under the control of RD 4 (i.e. equalization).

FIGS. 14DA–14DD illustrate several preferred timing circuits 15T. Combined with the bias-generating circuit 15B, the timing circuit 15T controls SE 5 of all data S/A's. When 8T is raised to high, it raises SE 5 and enables all data S/A's to sample data; then after a delay, i.e. when all data S/A's have acquired valid data, it lowers SE 5 and stops all data S/A's from sampling. To realize this delay, the preferred embodiment of FIG. 14DA adds a second timing bit line 30T' to the 3D-M array, whose S/A 17T' controls the delay. Here, the second timing bit line 30T' has a diode connection 1aT' at each cross-point with word lines. Its S/A 17T' is slightly slower than data S/A. When its output 8T' switches, all output data should be ready and all data S/A's can stop sampling. With the help of the second timing bit line 30T', the power consumption can be lowered too. Note that the signal from the first timing bit line starts the data sampling for data S/A, while the signal from the second timing bit line ends the data sampling for data S/A. FIG. 14DB illustrates a preferred timing S/A 17T' for the second timing bit line 30T'. Compared with the data S/A of FIG. 14BA, either its output drives an extra capacitance 51C, or the channel length of at least one of its transistors is longer. These and other designs can slow down this timing S/A 17T'.

FIG. 14DC illustrates a preferred timing circuit 15T. The output 8T' from the second timing bit line 30T' can be directly sent out as RY 6. Combined with the output 8T of the first timing bit line 30T, 8T' generates the bias control signal 5d, which in turn controls SE 5 through the bias-generating circuit 15B (referring to FIG. 14E). FIG. 14DD is an alternate preferred timing circuit 15T. Compared with FIG. 14DC, it provides a state-control signal 6E for external circuits (e.g. circuits inside the 3DiM but outside the 3D-M). When 6E is asserted, 3D-M is forced into its default state (i.e. all word and bit lines are shorted to $V_M$) and cannot perform any operation. This mode is referred to as "soft-off" mode. In the "soft-off" mode, no power is consumed by the 3D-M; when needed, the 3D-M can be quickly put into action by grounding 6E. Compared with "hard-off" mode (i.e. all word and bit lines are grounded), the 3D-M in the "soft-off" mode can "wake-up" faster. This preferred "soft-off" design can be incorporated in many applications, such as the word-line redundancy circuit and flexible-code block (when the word line under read is defective or its data need to be upgraded), or in the 3D-M-based IC testing (when the circuit-under-test is under normal operation).

FIG. 14E illustrates a preferred bias-generating circuit 15B. Current source 53a can be on-chip or provided externally. The bias voltage 5T is generated by a diode-connected NMOS 53b. When 5d is low, 5T is sent to SE 5; when 5d is high, SE 5 is grounded.

FIG. 14F illustrates a preferred row-decoder disable circuit 11a. When RY 6 is high, NMOS 54b is turned on and the word line 20a is shorted to $V_M$ 7. When RY 6 is low and 20a' is high, PMOS 54c is turned on and the word line 20a is shorted with the $V_R$. It is to be understood that $V_R$ does not have to be equal to $V_{dd}$ (referring to FIG. 19CA).

FIG. 14G illustrates a preferred $V_M$-generating block 14. It uses the same S/A core 17C (55a) as the data S/A. It further comprises a voltage regulator (including op-amp 55b and driving NMOS 55c). With all inputs and outputs shorted together, the S/A core 55a generates $V_M$ 7', which is ~$V_{S/A}$/2. The voltage regulator maintains the output 7 at $V_M$ while providing sufficient current. Accordingly, $V_M$ 7 is a constant dc-source.

Referring now to FIGS. 15AA–15AD, various aspects of the bit-line voltage timing characteristics are disclosed. As illustrated in FIG. 15AA, after the voltage on the word line 20y is raised to $V_R$, the word line 20y starts to pump current into bit line 30j through a diode 1yj. The voltage on the bit line 30j then starts to rise from its initial value $V_M$. The rise rate depends on the rate at which the diode current charges up the parasitic capacitance 1jC of the bit line 30j. In general, this parasitic capacitance 1jC include: the coupling capacitance 1j0 between the word line 20x and the bit line 30j (for a "0" cell), the junction capacitance 1j2 of the reverse-biased diode 1zj (for a "1" cell), the sidewall coupling capacitance 1j3, 1j4 to the adjacent bit lines 30i, 30k, and the coupling capacitance 1j1 with other interconnection layers. Since the voltage on the bit line 30j is a little above $V_M$ while all other word lines 20x, 20z (excluding the word line under read 20y) are at $V_M$, certain leakage current flows from the bit line 30j to other word lines 20z through the reverse-biased diode 1zj. The discharging effect on the bit line 30j from this leakage current counters the charging effect from the word line 20y.

The equivalent circuit used to simulate the bit-line voltage timing characteristics is illustrated in FIG. 15AB. The voltage change $\Delta V_b$ on the bit line 30j is affected by three components: diode 1yj, parasitic capacitance 1jC and equivalent diode 1jD. Equivalent diode 1jD comprises n diodes in parallel, where n is the number of diodes that the bit line 30j is connected with (except the one that is charging the bit line). In the worst case, n is equal to $N_{WL}-1$. The static equilibrium voltage $\Delta V_{be}$ on the bit line 30j is reached when the forward current of the diode 1yj is equal to the reverse current of the equivalent diode 1jD.

FIG. 15AC illustrates the current-voltage characteristics (IV) of the diode 1yj. Preferably, its forward current $I_f(V)$ If is much larger than its reverse current $I_r(V)$ 1r. $\Delta V_{be}$ can be found out by graphical means: first multiply the reverse current $I_r(V)$ 1r by $(N_{WL}-1)$; then shift it right by $V_R - V_M$, this forms curve 1rs; the cross-point between 1rs and 1f is $\Delta V_{be}$. Mathematically, $\Delta V_{be}$ can be expressed as, $$I_f(V_R - V_M - \Delta V_{be}) = (N_{WL}-1) \times I_r(\Delta V_{be}) \approx N_{WL} \times I_r(\Delta V_{be}) \qquad \text{eq. (1)}$$

FIG. 15AD is the bit-line voltage timing diagram. $\Delta V_b$ eventually reaches $\Delta V_{be}$. At time τ, $\Delta V_b$ exceeds $V_T$ and triggers the S/A. At this moment, output data becomes valid. For the bit line 30j, the time it takes for $\Delta V_b$ to reach $V_T$ is its latency $\tau_{30j}$, which can be expressed as, $$\tau_{30j} \sim V_T \times C_{30j}/I_f \qquad \text{eq. (2)}$$

As illustrated in FIGS. 13C, 14A, the timing characteristics of the first timing bit line and dummy bit line are different from that of the data bit lines. Accordingly, their designs are preferably different from that of the data bit line. FIGS. 15BA–15CC explain and illustrate several preferred designs. FIG. 15BA illustrates a data bit line 30a and a reference bit line 30r. The reference bit line 30r could be a first timing bit line or a dummy bit line. During read, the voltage change $\Delta V_{30r}$ on the reference bit line 30r is preferably slower than the voltage change $\Delta V_{30a}$ on the data bit line 30a. For the dummy bit line, preferably $\Delta V_{30r} \sim \Delta V_{30a}/2$ (FIG. 15BB). According to eq. (2), this can be achieved by increasing the parasitic capacitance 1rC of the reference bit line 30r. FIGS. 15CA–15CC illustrate several preferred reference bit lines.

FIG. 15CA illustrates a first preferred reference bit line 30r. It is wider than data bit line 30a. Thus, it has a larger parasitic capacitance. FIG. 15CB illustrates a second preferred reference bit line 30r. It comprises two shorted sub-bit lines 30r1, 30r2. Each of these sub-bit lines has the same width as the data bit line 30a. The sub-bit line 30r1 has diode connection 1ar1 with every word line it crosses, whereas, the sub-bit line 30r2 has no diode connection with these word lines. Accordingly, the reference bit line 30r has a larger parasitic capacitance and its voltage rise rate is slower. Note that the length of the sub-bit line 30r2 can be adjusted by layout FIG. 15CC illustrates a third preferred reference bit line 30r. It is physically connected with a physical capacitor 1r0. The physical capacitor 1r0 can be a MOS capacitor (including the S/A input capacitance), metal capacitor or other conventional capacitors. They can increase the latency τ.

FIG. 15D illustrates a preferred implementation of data bit lines, dummy bit lines and timing bit lines in a 3D-M array. In this preferred embodiment, there are two bit-line groups D1, D2. Within each bit-line group (D1), all data bit lines share one dummy bit line (30D). Each dummy bit line (30D) comprises two sub-bit lines 30D1, 30D2. The 3D-M array further comprises a first timing bit line 30T and its dummy timing bit line 30TD. The first timing bit line 30T comprises two sub-bit lines 30T1, 30T2, and the dummy timing bit line 30TD comprises four sub-bit lines 30TD1–30TD4. This preferred embodiment further comprises a second timing bit line 30T'. It comprises only one bit line but its S/A 17T' is slower. Apparently, the voltage rise on the dummy bit line 30D and the first timing bit line 30T is slower than that on the data bit line 30a; the voltage rise on the dummy timing bit line 30TD is even slower.

Alternatively, the dummy bit line 30D and the first timing bit line 30T may take a simpler form. Because it needs to drive a large number of data S/A's, whose input capacitance can significantly slow down the voltage rise, the dummy bit line 30D may comprise only one sub-bit line. On the other hand, the first timing bit line 30T may also comprise only one sub-bit line. In this case, its timing S/A 17T is preferably slow, but should be faster than the timing S/A 17T' of the second timing bit line 30T'.

FIG. 16 is a preferred timing diagram of various signals in the preferred 3D-ROM core 0. At time $\tau_{30a}$, the voltage change on the data bit line 30a exceeds the $V_T$ of its S/A 17a. However, since its S/A 17a is not turned on, there is no valid data on the output. At time t1, the voltage change on the first timing bit line 30T becomes large enough to trigger its S/A 17T. This means that the 3D-ROM core 0 is ready to sample data SE 5 is then asserted and all data S/A's are put to work. At time τ, the second timing bit line 30T' triggers its S/A 17T'. This means that all data are ready. All data S/A's are then turned off. This concludes the read cycle.

Eq. (2) and FIG. 15AA provide a set of design guidelines for a preferred 3D-ROM. To reduce the latency, the bit-line parasitic capacitance 1jC is preferably made small. Since a major component of 1jC is the sidewall coupling capacitance 1j3, 1j4, the 3D-ROM preferably uses thin bit lines. Even though thin bit lines have a larger series resistance, because the dominating portion of the resistance that determines the latency comes from the 3D-ROM layer, the larger resistance from the thin bit lines has little adverse effect on the latency. On the other hand, in the full-read mode, the word line under read carries the read current for all bit lines, which is typically large. To reduce the series voltage drop and avoid electro-migration, the 3D-ROM preferably uses thick word lines. A preferred 3D-ROM structure with thick word lines (20a) and thin bit lines (30i, 30j) is illustrated in FIG. 2A.

B. Cached 3D-M (3DcM)

The performance of a single 3D-M cell cannot yet compete with the conventional memory. Through system integration (e.g. using 3DiM), the potential of the 3D-M can be full exploited. Collectively, the 3D-M performance can match that of the conventional memory, even excel. Cached 3D-M (3DcM) is a good example of 3DiM. It comprises a 3D-M and an eRAM integrated with said 3D-M. 3DcM can speed up the 3D-M read-out by hiding its latency. To the external circuit, 3DcM can be viewed as an individual memory: the eRAM is formed in the substrate; the 3D-M is stacked on top of the eRAM; and the eRAM keeps a copy of data from the 3DM. When the external circuit searches data from the 3DcM, it reads from the eRAM first. In the case of a hit, the data are read out from the eRAM; otherwise the data are read out from the 3D-M. Accordingly, the eRAM works as a cache for the 3D-M. For hit, the 3DcM latency is equal to the eRAM latency and therefore, the external circuit cannot sense the 3D-M latency; for miss, the 3DcM latency is close to that 3D-M latency. If the eRAM has a large capacity, the chance for hits is large and therefore, the average latency becomes small. On the other hand, the 3DcM bandwidth is typically controlled by the eRAM.

The read operation in a 3DcM is similar to the cache operation in a conventional computer. FIGS. 17A–17G disclose preferred internal data flows in a 3DcM in details. FIG. 17A illustrates the I/O ports of a preferred 3DcM 0C. It includes input address AS 73, 3DcM read-initiating signal cRD 75, 3DcM data-ready signal cRY 77, clock signal CK 71, and data output DO 79.

FIG. 17B is a block diagram of the preferred 3DcM 0C. It comprises a 3D-M core 0, column decoder 70, eRAM 72, control block 74 and output selection-block 76. In this preferred embodiment, the size of the 3D-M core 0 is 1024×1024. During read, a page (1024 bits) is selected from the 3D-M array based on the row address 2 (i.e. the first 10 bits of AS 73 [13:4]) and sent to output 8. Here, a 3D-M page comprises all data on a single word line in a 3D-M unit array. The column decoder 70 selects a word (64 bits) from this output page (1024 bits) based on the column address 2c (i.e. the last 4 bits of AS 73 [3:0]). The selected word and the corresponding address are copied into the eRAM 72. The control block 74 controls the data flow from the 3D-M core 0 to the eRAM 72. For those skilled in the art, the control block 74 can be easily designed based on the preferred data flow of FIG. 17D. The output selection-block 76 determines whether the output data 79 come from the column decoder 70 or from the eRAM 72.

FIG. 17C illustrates a preferred eRAM 72. It comprises a read-write-enable port R/W 74r and a hit/miss port H/M 72h. It further comprise an eRAM data block 72D and an eRAM tag block 72T. The eRAM data block 72D keeps a copy of the data from the 3D-M core 0 and the eRAM tag block 72T keeps the address tag for the data stored in the corresponding row in the eRAM data block 72D. In this preferred embodiment, the size of the eRAM data block 72D is 64×64 and the size of the eRAM tag block 72T is 8×64. The first 8 bits 2a of AS 73 [13:6] are stored in the eRAM tag block 73T and the last 6 bits of AS 73 [5:0] are used as the column address 2b for the eRAM 72. The eRAM 72 further comprises a comparator 72C. During read, it compares the tag 72 to from the eRAM tag block 72T with 2a. If they match, it is a hit and the output H/M 72h becomes high; otherwise, 72h stays low.

FIG. 17D discloses a preferred 3DcM read flow. First, upon receiving cRD 75, AS 73 is sent to the eRAM 72 and the eRAM-read is enabled (step 91). The next step depends on the value of the H/M 72h (step 92): for hit, data 79a from the eRAM 72 are directly sent to the output 79 (step 97) and cRY 79 is issued (step 98); for miss, data are be read out from the 3D-M core. This involves the following steps: first RD 4 of the 3D-M core 0 is issued (step 93); then a page is read out from the 3D-M and RY 6 is issued (step 94); the eRAM-write is enabled, a word 79a is selected from the column decoder 70, this word 79a and its address 2b are copied into the eRAM 72 (step 95); then data 79a or 79b are sent to the output 79 (step 96) and cRY 79 is issued (step 98).

At the step 96, the data read-out can be "read-during-copy", i.e. data are read right after the column decoder 70 and during the data transfer from the 3D-M core 0 to the eRAM 72. This results in a shorter latency. FIG. 17EA illustrates a preferred output selection-block 76 corresponding to this scheme. It uses a multiplexor 76M, which selects between the data 79a from the column decoder 70 (for miss) or the data 79b from the eRAM 72 (for hit), based on the selection signal 79s (typically controlled by H/M 72h).

Alternatively, "read-after-copy" can be used. In "read-after-copy", data are only read out from the eRAM 72, for either hit or miss. This scheme facilitates redundancy and software upgrade. FIG. 17EB illustrates a preferred read flow. It is part of the step 96 of FIG. 17D. After the 3D-M data are copied into the eRAM 72, the eRAM read-out is repeated (including the steps 91, 92, 97 of FIG. 17D). To be more specific, after the step 95, AS 73 is sent to the eRAM 72 again and data are read (step 96a). Since this read is a sure "hit", i.e. H/M 72h is certainly high (step 96b), data 79b from the eRAM 72 is sent to the output 79 (step 96c). FIG. 17EC illustrates a preferred output selection-block 76 corresponding to this scheme. With all output data coming from the eRAM 72, this output selection-block 76 simply uses a transmission gate 76T to control the data flow from the eRAM 72 to the output 79.

The preferred 3DcM in FIGS. 17B–17EC is based on "word-copy", i.e. a word (64 bits) from the output page (1024 bits) is copied into the eRAM 72 (other words in that page might be wasted). To fully utilize the data read out each time, a "page-copy" scheme is preferred, i.e. all words in the output page are copied into the eRAM 72. It maximizes the read efficiency. FIG. 17F illustrates a preferred 3DcM using the "page-copy" scheme. Different from FIG. 17B, the column address 2c' does not use the last 4 bits of AS 73, instead it is generated internally by the control block 74'. For those skilled in the art, the control block 74' can be easily designed based on the preferred data flow of FIGS. 17D, 17G. FIG. 17G illustrates a preferred column-address generating flow. It is part of the step 95 of the FIG. 17D. After the step 94, under the control of 74', the column address 2c' is incremented in such a way that all words in the output page can be scanned over (step 95a). Then the word corresponding to 2c' and 2c' itself are copied into the eRAM 72' (step 95b). Repeat the steps 95a, 95b until 2c' reaches a pre-determined maximum value (step 95c). As a result, all words in the output page are copied into the eRAM 72'. FIG. 17H illustrates a preferred eRAM 72' used in the "page-copy" scheme. In this preferred embodiment, the size of the eRAM data block 72D is still 64×64, but it is divided into four eRAM sectors. Each eRAM sector is 64×16 in size and it stores data from a whole page (1024 bits). Each eRAM sector uses one tag row. Accordingly, the size of the eRAM tag block can be 8×4.

C. Write Speed

Users of 3D-EPROM can program the chip. In order to reduce the chip programming time, a plurality of memory cells are preferably programmed at the same time. This is the concept of parallel programming. FIG. 18A illustrates a preferred implementation of parallel programming. In this preferred embodiment, cells 1cb and 1cc are simultaneously programmed. During programming, the voltage on the word line 20c is $V_{pp}$; the voltages on the bit lines 30b, 30c are 0; the voltages on all other address-select lines are $V_{pp}/2$.

Accordingly, the voltages applied on the cells 1cb, 1cc are $V_{pp}$ and these cells are programmed at the same time. To lower the voltages on at least two bit lines to 0, column decoder is preferably a parallel-decoder (FIG. 18B). It comprises two sub-decoders 70a, 70b. These decoders share a same column address 2C. They could be located side-by-side or inter-leaved. In this preferred embodiment, they are mirrored. The column address 2C (e.g. "1") is fed into both sub-decoders 70a, 70b. This lowers the voltage on the bit lines 30b, 30c to 0. Accordingly, the voltage requirement of FIG. 18A is met.

In order to reduce the number of package pins, U.S. Pat. No. 6,385,074 suggests using an on-chip $V_{pp}$-generating-block. This $V_{pp}$-generating-block generates the programming voltage $V_{pp}$ from the chip power supply $V_{dd}$. This makes sense if the 3D-M needs frequent programming. However, for the "write-once" 3D-M's, they are not programmed as frequently. Moreover, for the 3D-EPROM's carrying contents (e.g. PonC of FIG. 3), they are typically programmed in factory (e.g. by content providers). During usage, customers just read, but not write. For these applications, the on-chip $V_{pp}$-generating-block is unnecessary. Furthermore, the saved chip space can be used to accommodate other functions. FIG. 18C illustrates a preferred 3D-M with $V_{pp}$-bonding pads 12P, 70P. These bonding pads are used to feed the external programming voltage. For the factory-programmed content carrying 3D-EPROM, since they are typically programmed at the wafer level, these bonding pads do not need to be bonded out. Accordingly, the number of package pins required for the chip is reduced.

4. Unit-Array Capacity

As illustrated in FIGS. 19AA–19AB, the unit-array capacity of a 3D-M can strongly impact its integratibility. With a large unit array, few unit arrays (e.g. 0A) are needed on a 3D-M chip (FIG. 19AA). On the other hand, with a small unit array, a large number of unit arrays (e.g. 0Aa–0Ai) are needed (FIG. 19AB). Because their peripheral circuits reside in the substrate, more unit arrays on a chip means that the substrate becomes more fragmented. A fragmented substrate severely impedes the layout for the substrate-IC. In addition, more unit arrays on a chip means that the array efficiency becomes worse. To improve its integratibility, the 3D-M preferably uses large unit array(s).

Since it is equal to the product of $N_{WL}$ and $N_{BL}$ (FIGS. 13B, 19B), the unit-array capacity $C_A$ can be improved by increasing $N_{WL}$ and $N_{BL}$. From a design perspective, $N_{BL}$ is not constrained and therefore, rectangular unit array can be used. On the other hand, from eq. (1) and letting $\Delta V_{be} = nV_T$ (in general, n~2, $V_T$~0.1V), $N_{WL}$ can be expressed as, $$N_{WL} = I_f(V_f)/I_r(V_r) = I_f(V_R - V_M - nV_T)/I_r(nV_T) \qquad \text{eq. (3)}$$

$N_{WL}$ is constrained by the rectification ratio γ of the 3D-ROM cell. Here, the γ definition is different from the conventional definition: the forward bias $V_f$ (e.g. ~3V) can be far greater than the reverse bias $V_r$ (e.g. ~0.3V). This attributes to the usage of S/A and other design improvements. Eq. (3) is very valuable to the unit-array design. Apparently, $N_{WL}$ can be increased by using large $V_R$. Alternatively, polarized cells can be used to improve γ. In a polarized cell, the resistance a current faces when it flows in one direction is different from the resistance it faces when it flows in the other direction.

FIG. 19B illustrates a preferred rectangular 3D-M array. In this preferred embodiment, $N_{BL} > N_{WL}$. It is feasible to place a number of these arrays in a 3D-M chip along the y direction. Accordingly, the shape of the resulted final chip is approximately square.

FIG. 19CA discloses an $N_{WL}$-improving means based on large $V_R$. Here, $V_R$ is larger than $V_{dd}$. Since the IV characteristic of the 3D-ROM layer is exponential, the read current $I_1$ (at $V_R$) is far larger than the current $I_2$ (at $V_{dd}$). As a result, $N_{WL}$ and $C_A$ can increase significantly. FIGS. 19CB-19CC illustrate a preferred $V_R$-generating means. FIG. 19CB is its circuit block diagram. $V_R$-generating-block 12R generates $V_R$ for the row decoder 12. It is typically based on charge-pump design. FIG. 19CC is a preferred substrate layout incorporating a $V_R$-generating-block 12R. The 3-D integration allows the $V_R$-generating-block 12R to be formed on the substrate 0s, preferably under the 3D-M array 0A.

Besides using a large $V_R$, polarized cells can be used to increase $C_A$. Polarized cell could comprise polarized layer and polarized structure. The polarized layer is based on the base-material difference (FIGS. 19D–19EC); the polarized structure is based on the interface difference (FIGS. 19F–19GC).

FIG. 19D explains the concept of polarized layer. A polarized layer 38 comprises at least two sub-layers 38a, 38b. Preferably, the materials forming these sub-layers 38a, 38b are substantially different When a current flows through the polarized layer 38 along direction 37a (i.e. from terminal 39a to terminal 39a), it encounters the sub-layer 38a first and the sub-layer 38b next; on the other hand, when it flows along direction 37b (i.e. from terminal 39b to terminal 39b), the current encounters the sub-layer 38b first and the sub-layer 38a next. The sequence in which the current encounters the sub-layers 38a, 38b can strongly affect the magnitude of the current. One well-known example is p-n junction diode. By using opposite dopant types in the sub-layers 38a, 38b, diode action can be observed. The polarized layer 38 goes further than diode: not only dopant types, but also the base materials are different in the sub-layers 38a, 38b. Here, base material is the major material component in a layer. FIGS. 19EA–19EC illustrate several preferred polarized layers.

FIG. 19EA illustrates a first preferred polarized 3D-ROM layer. It comprises two sub-layers 32a, 32b. They use different base materials. For example, the base material in the sub-layer 32a is silicon and the base material in the sub-layer 32b is silicon carbide ($Si_zC_{1-z}$, $0 \leq z \leq 1$). Other semiconductor materials, such as $Si_yGe_{1-y}$ ($0 \leq y \leq 1$), C, are also base-material candidates. Besides semiconductor materials, the polarized layer 32 may comprise: composite layer of semiconductor and dielectric (e.g. sub-layer 32a comprises a semiconductor material and sub-layer 32b comprises a dielectric material), different dielectric materials (e.g. sub-layer 32a comprises amorphous silicon and sub-layer 32b comprises silicon nitride), base materials with different structures (e.g. sub-layer 32a has an amorphous structure and sub-layer 32b has a poly-crystalline or micro-crystalline structure. This is also illustrated in FIG. 19EB), different electrode materials (e.g. metals of different work functions; or, metals with different interfacing properties with the 3D-ROM layer; or, one electrode uses metal, another electrode uses doped semiconductor). All these means can further improve the rectification ratio of the 3D-ROM cell.

FIG. 19EB illustrates a second preferred polarized 3D-ROM layer. In this preferred embodiment, a micro-crystalline layer 32au is inserted between the electrode 31 and the 3D-ROM layer 32a. Its existence at one electrode interface (e.g. between the electrode 31 and the 3D-ROM layer 32) can polarize 3D-ROM layer 32. In addition, the existence of micro-crystalline layer at at least one electrode interface (e.g. between the electrode 31 and the 3D-ROM layer 32, and/or between the electrode 33 and the 3D-ROM layer 32) can lower the metal-semiconductor contact resistance, increase the forward current and therefore, reduce the latency.

FIG. 19EC illustrates a third preferred polarized 3D-ROM layer. In this preferred embodiment, 3D-ROM layer 32 comprises a p+ layer 32p, a v layer 32x and an n+ layer 32n. The v layer 32x is lightly n doped or un-doped and all these layers are based on amorphous silicon (αSi). The layer-formation sequence is 32n, 32x, and 32p. This preferred structure can achieve a forward current of >10 A/cm² and a reverse current <6×10⁻⁵ A/cm².

FIG. 19F explains the concept of polarized structure. The 3D-ROM layer 32 has a top interfaces 32ti with the top electrode 33 and a bottom interface 32bi with the bottom electrodes 33. In a polarized structure, the shapes of these interfaces are different: one interface preferably has a field-enhancing tip 33t, while the other interface is relatively smoother. Accordingly, electron emission can be enhanced along one direction and the rectification ratio can be improved.

FIG. 19G illustrates a preferred polarized structure. In this preferred embodiment, the bottom electrode 33, being poly-crystalline, has a rough bottom interface 32bi; after the 3D-ROM layer 32 is deposited thereon, the amorphous material in the 3D-ROM layer 32 smoothes out the top interface 32ti. As a result, electron emission from the bottom electrode 33 to the top electrode 31 can be enhanced. Namely, the current flowing from the top electrode 31 to the bottom electrode 33 can be larger than the other way around. Accordingly, the top electrode 31 can be used as word line and the bottom electrode 33 can be used as bit line.

5. Yield-Enhancement Techniques

Defects cause various read-out errors and are detrimental to yield. As illustrated in FIGS. 20AA–20CB, there are six types of defects in a 3D-M array, including: 1. word-line open 20o (FIG. 20AA); 2. word-line short 20s (FIG. 20AB); 3. bit-line open 30o (FIG. 20BA); 4. bit-line short 30s (FIG. 20BB); 5. low 3D-ROM cell forward current (FIG. 20CA); 6. large 3D-ROM cell reverse current (FIG. 20CB).

For the word-line defects (types 1 and 2), no correct data can be read out for the entire word line. They cause word-line errors. For the bit-line defects (types 3 and 4), no correct data can be read out for the entire bit line. They cause bit-line errors. For the cell defect (type 5), the forward current 1f' is too small. The resulted $\Delta V_{be}$ might be too small to trigger the S/A and a logic "1" cell might be misread as logic "0" (FIG. 20CA). Fortunately, this defect only causes single-bit error. For the cell defect (type 6), the defective 3D-ROM cell is leaky and its reverse current 1r' is too large. When reading any other cells on the same bit line as the defective cell, the leakage current of the defective cell might limit $\Delta V_{be}$ in such a way that the S/A cannot triggered and no valid data can be read out (FIG. 20CB). This defect causes bit-line error. Defect types 5 and 6, particularly 6, are detrimental to the intrinsic yield of the 3D-M array.

To improve yield, the present invention discloses a seamless 3D-ROM cell. It reduces the number of defects in a 3D-ROM array (FIGS. 21A–23B). Alternatively, error-correction schemes such as error-correction code (ECC) and redundancy circuit can be used (FIGS. 24-26C). They can correct the errors caused by the defects in a 3D-M array.

A. Seamless 3D-ROM Cells

Defects can be introduced at several stages during the manufacturing process of the 3D-ROM, i.e. before the 3D-ROM layer formation (e.g. to the top surface of the bottom electrode), during the 3D-ROM layer formation (to the 3D-ROM layer), or after the 3D-ROM formation (e.g. to the top surface of the 3D-ROM layer). The cleanness of these layers (i.e. the 3D-ROM layer and the adjacent portions of top and bottom electrodes) has great impact to the intrinsic 3D-ROM yield. Accordingly, these layers are referred to as yield-sensitive layers. One common defect-introducing step is pate transfer. During pattern transfer, wafers are subjected to lithography and etching (and/or planarizing). These steps can either introduce foreign particles or cause damage to the 3D-ROM layer. Thus, pattern transfer is preferably avoided during the formation of the yield-sensitive layers.

FIG. 21A illustrates a preferred seamless 3D-ROM cell. It can improve the intrinsic yield of the 3D-ROM array. This preferred seamless 3D-ROM cell comprises a bottom electrode 64, a 3D-ROM layer 62, and a top electrode 65. The top electrode 65 further comprises a conductive top buffer layer 60 and a top conductor 65, which are connected by via (opening) 67. The interface between the top buffer layer 60 and the 3D-ROM layer 62 is the top interface 62*ti*; the interface between the 3D-ROM layer 62 and the bottom electrode 64 is the bottom interface 62*bi*. During the 3D-ROM process (FIGS. 22AA–22E'), the 3D-ROM layer and its adjacent layers are formed in a seamless way: there is no pattern transfer between these steps and therefore, no foreign particles are introduced to the top and bottom interfaces 62*ti*, 62*bi*. This process is preferably carried out in a cluster tool. FIG. 21B illustrates an alternate preferred 3D-ROM cell. In this preferred embodiment, nF-opening mask is used during the formation of the opening 67. Accordingly, the dimension of the resulted opening 67 is larger than that of the top buffer layer 60.

FIGS. 22AA–22E' illustrate several preferred process flows for the seamless preferred 3D-ROM cells. In FIG. 22AA, all yield-sensitive layers, including the bottom electrode 64, the 3D-ROM layer 62 and the top buffer layer 60 are formed in a seamless way. As a result, the amount of defects at the top and bottom interfaces 62*ti*, 62*bi* is minimized. Alternatively, an extra layer—an etchstop layer 60*b*—is formed between the 3D-ROM layer 62 and the top buffer layer 60 (FIG. 22AB). Its function will become apparent as FIG. 22BC is explained. All these layers (64, 62, 60*b*, 60) are also formed in a seamless way.

Then a pattern transfer step is performed to the top buffer layer 60*b*. FIGS. 22BA–22BC illustrate several preferred 3D-ROM structures after this step. In FIG. 22BA, a portion of the bottom electrode 64 is exposed. In FIG. 22BB, a portion of the 3D-ROM layer 62 is exposed. FIG. 22BC is a resultant structure from FIG. 22AB. The etchstop layer 60*b* protects the 3D-ROM layer 62 from the etch of the top buffer layer 60. In FIGS. 22BA–22BB, at least a portion of the top electrode 66 (i.e. the top buffer layer 60) has the same cross-section as at least a portion of the 3D-ROM layer 62.

After the top buffer layer 60 is defined, a repairing step is preferably performed to the edge of the 3D-ROM layer 62 (FIGS. 22CA–22CC). This is similar to the post-gate-oxidation step in the conventional MOS process. FIG. 22CA is a resultant structure from FIG. 22BA. A portion of the bottom electrode 64 is converted into a dielectric 68*d* by means such as oxidation. FIG. 22CB is a resultant structure from FIG. 22BB. A portion of the 3D-ROM layer 62 is converted into a dielectric 68*d* by means such as oxidation. FIG. 22CC is a resultant structure from FIG. 22BC. A portion of the etchstop layer 60*b* is converted into a dielectric 68*d* by means such as oxidation.

Next, a pattern transfer step is performed on the bottom electrode 64. This results in a 3D-ROM stack 69 (FIG. 22D). Then a lower-level dielectric 68 is formed and a portion thereof is removed to form a via (opening) 67. This is followed by the formation of the top conductor 65 (FIG. 22E).

FIGS. 22D'–22E' illustrate the extra steps to form the preferred seamless 3D-ROM structure of FIG. 21B. After the formation of the 3D-ROM stack 69, a lower-level dielectric 68 is deposited and planarized. Then a config-dielectric 23 is formed thereon (FIG. 22D'). The lower-level dielectric 68 and the config-dielectric 23 preferably comprise different dielectric materials, e.g. the lower-level dielectric 68 comprise silicon oxide and the config-dielectric 23 comprises silicon nitride. After being exposed to an nF-opening mask, the config-dielectric 23 is etched to form an opening 67. The etch recipe is selected in such a way that this etch step stops on top of the lower-level dielectric 68. Then the opening 67 is filled with conductive materials. After another pattern transfer, the top conductor 65 is formed (FIG. 22E').

FIGS. 23A–23B illustrate two preferred quasi-seamless 3D-EPROM cells. In these quasi-seamless cells, a portion of the 3D-EPROM layer (e.g. quasi-conduction layer 62*a*) is formed in a seamless way while the other portion (e.g. antifuse layer 62*b*) is formed in a conventional way. In FIG. 23A, the quasi-conduction layer 62*a* is sandwiched between the top buffer layer 60 and the bottom electrode 64. It is formed in a seamless way; on the other hand, the antifuse layer 62*b*, sandwiched between the plug 63 and the top electrode 65, is formed in a conventional way. In FIG. 23B, the quasi-conduction layer 62*a* is formed in a seamless way; on the other hand, the antifuse layer 62*b*, sandwiched between the top buffer layer 60 and the top electrode 65, is formed in a conventional way. In these two preferred embodiments, the amount of defects in the quasi-conduction layer 62*a* can be minimized. Note that the placements of the quasi-conduction layer 62*a* and the antifuse layer 62*b* can be switched.

B. Error-Correction Schemes

Figure 24:
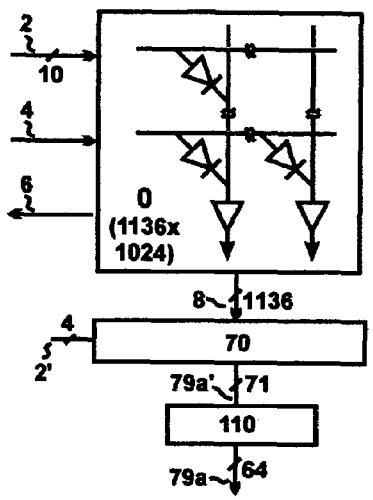
FIG. 24 illustrates a preferred 3D-M ECC circuit

To improve the 3D-M yield, error-correction scheme can be used. It includes error-correction code (ECC) and redundancy circuit FIG. 24 illustrates a preferred 3D-M incorporating ECC. It comprises a 3D-M core 0 incorporating ECC, a column decoder 70 and an ECC decoder 110. In the 3D-ROM core 0, each word line contains 1024 data bits. They are divided into 16 words of 64 bits. They can use Hamming code for error-correction. For Hamming code, each word of 64 bits requires 7 check bits. Thus, the total number of bits on each word line is (64+7)×16=1136. During read, these bits are supplied to the column decoder 70. The output 79*a'* from the column decoder 70 comprises 71 bits. The ECC decoder 110 converts these 71 bits 79*a'* into a word 79*a* with 64 valid bits.

Figure 25A:
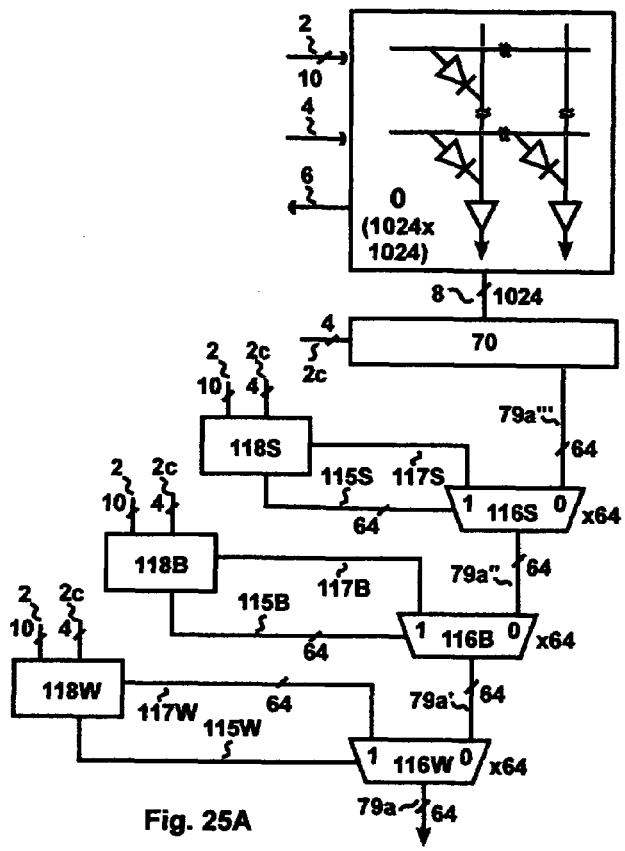

Redundancy circuits can correct single-bit error, bit-line errors and word-line errors. FIG. 25A illustrates a first preferred 3D-M with redundancy circuits. It comprises a 3D-M core 0, a column decoder 70, three 64-bit 2-to-1 multiplexors 116S, 116B, 116W and three redundancy blocks. The redundancy blocks include a single-bit redundancy block 118S, a bit-line redundancy block 118B and a word-line redundancy block 118W. They correct single-bit errors, bit-line errors and word-line errors, respectively. Each redundancy block stores the addresses and correctional data for defects (e.g. defective cells, defective bit lines, defective word lines). When the input address matches a defect address, the correctional datum corresponding to this defect address is sent to a data input (117S, 117B, 117W) of a multiplexor (116S, 116B, 116W). Under the control of a selection signal (115S, 115B, 115W), the correctional datum replaces the corresponding bit in the 3D-M output 79'''. The single-bit redundancy block 118S and the bit-line redundancy block 118B are illustrated in FIGS. 25B–25C; since the word-line redundancy block 118W can be used in software upgrade, it is illustrated in FIGS. 26B–26C.

Figure 25B:
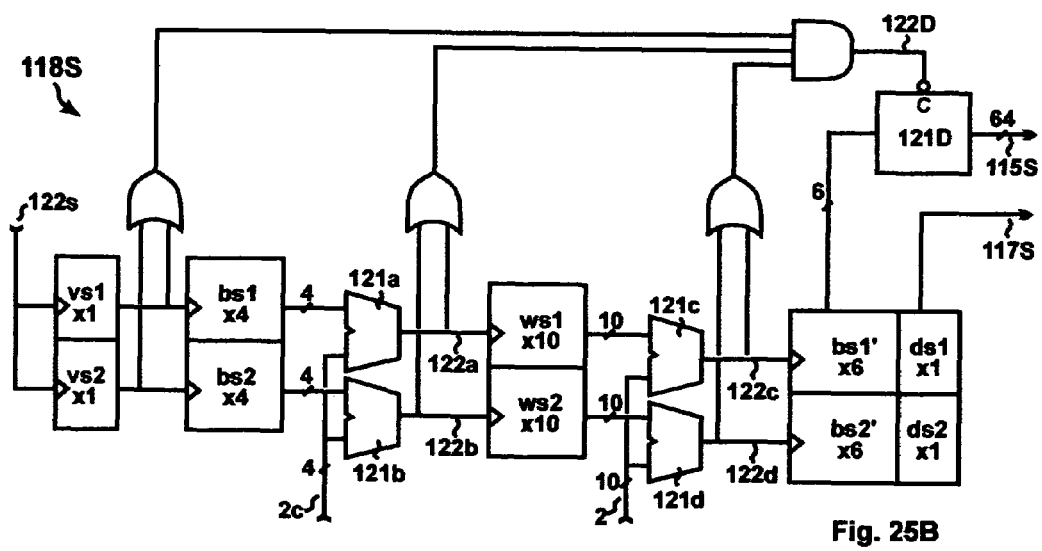

FIG. 25B illustrates a single-bit redundancy block 118S. This preferred embodiment comprises two correctional sets. They can correct two single-bit errors. Apparently, 118S may include more correctional sets. Each correctional set comprises a number of registers. They store a valid bit vs1 (1 bit), as well as the address and the correctional bit ds1 (1 bit) for the defective cell. The stored defect address includes the upper 4 bits bs1 of the column address, the row address ws1 (10 bits) and the lower 6 bits bs1' of the column address. The selection port of each register is represented by ">". The valid bit represents the validity of a correctional set: only when it is high, the correctional set is valid. The selection port 122s of the valid-bit register is tied to $V_{dd}$, or other timing signals (e.g. 74r). During read, comparator 121a, 121c compare the input column address 2c, AS 2 with bs1, ws1, respectively. If they match, bs1', ds1 are read out Based on bs1', decoder 121D raises the corresponding control line in 115S to high. Meanwhile, ds1 is sent to 117S and under the control of 115S, replaces the corresponding output 79''. Here, if the valid bit is low or the input address differs from the stored defect addresses, signal 122D will be set to low and disable the decoder 121D. This will drive all control lines in 115S low and the multiplexor 116S do not perform any data replacement.

FIG. 25C illustrates a bit-line redundancy block 118B. This preferred embodiment comprises two correctional sets. They can correct two bit-line errors. Each correctional set stores a valid bit vb1 (1 bit), as well as the address and the correctional column db1 (1024 bits) for the defective bit lines. The stored defect address includes the upper 4 bits bb1 of the column address and the lower 6 bits bb1' of the column address. The correctional column db1 contains all correctional data for the defective bit line. During read, the column address 2c is compared with bb1. If they match, bb1', db1 are read out. Based on bb1', decoder 123D raises the corresponding control line in 115B to high. Meanwhile, a correctional bit is selected from db1 based on AS 2. It is sent to 117B and replaces the corresponding output 79a' under the control of 115B.

The preferred redundancy circuits of FIGS. 25B-25C are based on "correct-during-read". On the other hand, by taking advantage of the fact that the eRAM in a 3DiM keeps a copy of the 3D-M data, "correction-after-read" can be implemented. In "correction-after-read", 3D-M data (including both correct data and erroneous data) are first copied into the eRAM, where they are to be corrected. FIG. 25DA illustrates a preferred redundancy 118SB based on "correction-after-read". 118SB first corrects single-bit errors, then it corrects bit-line errors. It comprises a single-bit correctional block 120S and a bit-line correctional block 120B. They correct single-bit errors and bit-line errors, respectively.

Single-bit correctional block 120S comprises a first correctional storage block 126S. It comprises a plurality of correctional sets. Each correctional set stores a valid bit 126d (1 bit), as well as the address and the correctional bit for the defective cells. The stored defect address includes the column address bs (10 bits) and the row address ws (10 bits). In this preferred embodiment, all valid correctional sets are stored from the bottom of 126S. When cRY 79 is set to high (i.e. data in the eRAM is ready), 126S starts to read correctional sets one-by-one under the control a timing circuit 126a. FIG. 25DB illustrates a preferred timing block 126a. Its function is: as long as the valid bit 125d is high, the timing block 126a will keep sending out the clock signal 125a for the counter 126b; once 125d switches to low, it will send out the clear signal 125b for the counter 126b and single-bit-correction-done signal 79'. Accordingly, as long as valid correctional sets are being read out (125d is high), the output 125c of the counter 126b keeps incrementing. This output 125c is used as the address for the first correctional storage block 126S. Address-decoder 126c reads out a correctional set based on 125c. Comparator 126e compares ws 125e with AS 2. If they match, bs 125f is sent to the address port A[9:0] of the eRAM 72; ds 125g is sent to the data port D of the eRAM 72 and replaces the datum corresponding to the single-bit error.

Bit-line correctional block 120B comprises a second correctional storage block 128B. It comprises a plurality of correctional set Each correctional set stores a valid bit 128d (1 bit), as well as the column address bb (10 bits) and the correctional column db (1024 bits) for the defective bit lines. When the single-bit-correction-done signal 79' is received, 128B starts to read correctional sets. It uses the same timing circuit 128a as 126a. Similarly, when the valid bit 127d is high, the counter 128b will keep incrementing the address 127c for 128B. Address-decoder 128c reads out bb 127f based on 127c and sends it to the address port A[9:0] of the eRAM 72. Then 128B selects a correctional bit 127g (1 bit) from db based on AS 2. This correctional bit 127g is sent to the data port D of the eRAM 72 and replaces the datum corresponding to the bit-line error. The timing diagram for this preferred "correct-after-read" process is illustrated in FIG. 25DC.

6. Software Upgradibility

During its lifetime, software is expected to experience a number of upgrades. During each upgrade, a portion of the original code (the initially released software code) is to be replaced by a upgrade code. It was generally believed that: if masked ROM (MROM) is used to store software, after the chip is shipped, the software stored therein cannot be upgraded. For a traditional MROM, this is true. For 3D-M, this belief is not valid. As explained before, the 3D-M carrying the original code can be easily integrated with a RWM (i.e. a 3DiM), which can be used to carry the upgrade code. Accordingly, the 3DiM supports software upgrade. Furthermore, because the upgrade code takes much less space than the original code, the RWM does not have to be large. This results in a low overall storage cost.

In order to facilitate software upgrade, software design is preferably based on a modular approach. FIG. 26 illustrates a preferred code storage in a 3D-M. Because the easiest data-replacing means is word-line replacement, i.e. all data on a single word line are replaced at the same time. Software modules stored in 3D-M array are preferred stored in units of 3D-M pages. In addition, they do not share 3D-M pages. Here, a 3D-M page (e.g. 20S[0]) refers to all data stored on a word line (e.g. 20[0]). In this preferred embodiment, software module 160*b* contains 2047 bits; since each 3D-M page stores 1024 bits, 160*b* is stored in two 3D-M pages 20S[0], 20S[1], among which the last bit 1*bz* on page 20S[1] is preferably a dummy. During an upgrade to the module 160*b*, all data on the word lines 20[0], 20[1] are replaced by the upgrade code. This can be accomplished by flexible-code block.

FIGS. 26B–26C illustrate two preferred flexible-code blocks. These flexible-code blocks can also correct word-line errors. The first preferred flexible-code block of FIG. 26B is similar to FIGS. 25B–25C and is based on "upgrade-during-read". It comprises two upgrade sets. They can upgrade two 3D-M pages. Each upgrade set stores a valid bit vw1 (1 bit), as well as the row address ww1 (10 bits) and the upgrade data dw1 (1024 bits) for the page-to-be-upgraded. The selection port 161*s* of the valid-bit register is preferably tied to cRD 75. During read, comparator 162*a* compares AS 2 and ww1. If they match, the upgrade codes 117W (64 bits) are read from dw1 based on 2*c*. They replace the output data under the control of word-line-replacement signal 115W. Accordingly, the external circuits only see the upgraded code. Alternatively, flexible-code block can also be based on "upgrade-after-read" (referring to FIG. 25DA). Note that during a read cycle, if the data from a word line are to be replaced, there is no need to read data from the 3D-M and the 3D-M can be turned off. Preferably the 3D-M is put into a "soft-off" mode (referring to FIG. 14DD), thus saving power and supporting quick "wake-up" (i.e. put back into action).

The second preferred flexible-code block in FIG. 26C borrows the concept of page management in the virtual memory of a computer, i.e. it treats the input address as virtual address and performs an address-translation that convert it into physical address. This preferred flexible-code block comprises a 3D-ROM 0, an upgrade block 86O, an address decoder 164D and an address-translation block 164T. The 3D-ROM 0 stores the original code and the upgrade block 86O, comprising RWM, stores the upgrade code. The 3D-M 0 and the upgrade block 86O form a unified memory space 86S. Here, the 3D-M 0 occupies the lower 1020 rows, i.e. R[00000 00000]–R[11111 11011], and the upgrade block 86O occupies the upper 4 rows, i.e. R[11111 11100]–R[11111 11111]. The address-translation block 164T stores the address or pseudo-address for the unified memory space 86S. If pseudo-address is stored therein, the address-translation block 164T preferably comprises a processing block, which converts the pseudo-address to physical address. The input address 86A of the address-translation block 164T is the upper 10 bits of the input address A[13:4]. Its output 86TA contains 10 bits TA[9:0], which is eventually sent to the address-decoder 164D and used as the physical address for 86S. The address-decoder 164D performs address-decoding for 86S based on the physical address. When the original code is needed, the physical address points to the 3D-M 0. For example, if 86A is 00000 00000 (i.e. row 165*a* of 164T), the corresponding 86TA is 00000 0000, which points to row R[00000 00000] of the 3D-M 0, i.e. the original code. When the upgrade code is needed, the physical address points to the upgrade block 86O. For example, if 86A is 00000 00100 (i.e. row 165*d* in 164T), the corresponding 86TA is 11111 11110, which points to row R[11111 11110] of the upgrade block 86O, i.e. the upgrade code. Address-translation can be easily applied to software upgrade, correction of word-line errors, and ConC (referring to FIG. 3D).

7. 3D-M-Based Self-Test (3DMST)

In the "design-for-test (DFT)" adopted by the conventional IC design, a plurality of muxed-flip-flops (mux-FF) are connected into at least one scan chain. During test, input test vectors (ITV) are shifted into the scan chain. Then the output from the circuit-under-test (CUT), i.e. output test vectors (OTV), are shifted out of the scan chain and compared with the expected test vectors (ETV) from the tester. If all OTV and ETV match, the CUT passes this test.

FIG. 27A is an exemplar CUT 0*cut* before DFT. It comprises three pipelined stages S1-S3. Each stage (S1) comprises a plurality of flip-flops (01*f*, 02*f*) and a logic network (1N). The output of the logic network 1N at the first stage S1 is the input X3 of the flip-flop 03*f* at the second stage S2. The circuit in FIG. 27A is used throughout this disclosure as the CUT.

FIG. 27B illustrates a conventional DFT-based CUT. It replaces every flip-flop (01*f*—04*f*) in FIG. 27A with a mux-FF (01*sf*—04*sf*). For the reason of simplicity, all logic networks 1N, 2N in FIG. 27A are combined into a single network 12N. The inputs D, S1 in the mux-FF is controlled by a scan-enable (SE) signal: when SE is low, the flip-flop in the mux-FF uses the normal input D; otherwise, it uses the scan input S1. Here, mux-FF's 01*sf*--04*sf* are connected one-by-one and form a scan chain 0*sfc*. ITV 002 is fed in from the input port SI 00*si* and OTV 006 is sent out to the output port SO 00*so*. In this preferred embodiment, the ITV width is 3 and the OTV width is 2.

A. 3DMST Concept

For the conventional testing methodology, it is difficult to perform at-speed test to high-speed circuits. Moreover, the testers are costly and do not support field-test and field-diagnosis. With the advent of 3D-M, particularly 3D-ROM, the industry acquires a storage device with large capacity and low cost. It is an ideal carrier for test vectors (e.g. ITV and ETV). More importantly, 3D-M is highly integratible, i.e. 3D-M can be easily integrated on top of the CUT. In fact, the integrated 3D-M and CUT is a form of 3DiM (referring to FIG. 2A). This integration causes minimum impact to the CUT layout (referring to FIG. 2B). Moreover, data flow between the 3D-M and the CUT is large (i.e. has a large bandwidth, referring to FIG. 17). Thus, at-speed test can be easily carried out. Apparently, 3D-M supports field self-test. Accordingly, this testing methodology is referred to as 3D-M-based self-test (3DMST).

In fact, the 3D-M array does not have to cover the whole CUT chip. It is acceptable for the 3D-M array to cover a fraction of the chip. If the CUT contains an area where, no routing is required for two adjacent interconnect layers, then this area can be used to form a 3D-M array. Accordingly, the introduction of a 3D-M array to a CUT may not require building extra interconnect layers. On the other hand, 3D-M does not need to be active during the normal operation of the CUT; it only needs to be activated during test. During the normal operation of the CUT, the state-control signal 6E (referring to FIG. 14DD) is preferably asserted. This forces the 3D-M into the "soft-off" mode and saves power.

FIG. 28A is a block diagram of a preferred integrated circuit supporting 3DMST (3DMST-IC) and FIG. 28B illustrates a preferred test flow. The 3DMST-IC comprises a CUT 0*cut*, a 3D-M 0 and a test-vector buffer (TVB) 206. The 3D-M 0 carries the test vectors for the CUT (e.g. ITV and ETV). The TVB 206 comprises an ITV buffer 202 and an ETV buffer 208. The test vectors 206*td* in the 3D-M 0 are first downloaded into the TVB 206. This includes steps of downloading the ITV 002 into the ITV buffer 202 (step 222) and downloading the ETV 008 into the ETV buffer 208 (step 224). Next, the CUT 0*cut* processes the ITV 002 and generates the OTV 006 (step 223). Then comparator 210 compares the OTV 006 with the ETV 008. If they match (step 226), or, in the case of mismatch, if further diagnosis or secondary test are needed (step 225), a new 3D-M address is generated and the steps 222-226 are repeated until the 3DMST is done (step 227); under other circumstances, the CUT is considered failing this test (step 228).

FIG. 28C discloses more details on a preferred arrangement of a test-vector carrying 3D-ROM array 0A and its TVB 206. They are the hardware implementation for the steps 222, 224 of FIGS. 28A–28B. The 3D-ROM array 0A comprises a plurality of word/bit lines (20*a*, 30*b*) and diodes representing test data (1*ab*—1*aj*). In this preferred embodiment, each word line (20*a*) carries two test vectors (006, 006'). Each test vector contains 5 bits of test data, including 3 bits of TV and 2 bits of ETV. Based on row address 2 and column address 2*c*, the test vector 006 is transferred into the TVB 206. Inside the TVB 206, flip-flops 1*f*1–1*f*3 form ITV buffer 202 and 1*f*4-1*f*5 form ETV buffer 208.

Since the 3D-M 0 is integrated with the TVB 206 in a 3-D fashion, test vectors can be transferred from the 3D-M 0 to the TVB 206 in parallel through a large number of contact vias. This results in a large bandwidth. Moreover, the flip-flops 1*f*1–1*f*5 in the TVB 206 are fast. Accordingly, the 3DMST-IC supports at-speed (i.e. high-speed) test. In FIG. 28C, test vectors are directly transferred to the TVB 206 through the column decoder 70. Alternatively, test vectors can be buffered into an eRAM first, before they are transferred from the eRAM to the TVB 206 (referring to FIG. 17).

FIGS. 29AA–29BC disclose two test-vector downloading means: one is serial downloading (FIGS. 29AA–29AD), i.e. test vectors are shifted into scan flip-flops one-by-one; the other is parallel downloading (FIGS. 29BA–29BC), i.e. test vectors are shifted into scan flip-flops in parallel.

FIG. 29AA is a preferred serial test flip-flop (SL-TFF). Its design is same as that the muxed-FF in FIG. 27B. FIG. 29AB is a preferred serial-load 3DMST-IC (SL-3DMST-IC). Compared with FIG. 27B, the input SI 00*si* to the first SL-TFF 01*sf* is the ITV 002 from the ITV buffer 202; the output SO 00*so* from the last SL-TFF 04*sf* is compared with the ETV 008 from the ETV buffer 208; and the comparison result CO 00*co* is sent to a back-end screening circuit 00*pp*, which determines if the CUT passes this test. The ITV buffer 202 and the ETV buffer 208 comprise parallel-in-serial-out modules (PISO). Their outputs 202*i*, 208*o* are driven by clock signals CKI 202*c*, CKO 208*c*, respectively; their inputs 202*td*, 208*td* are controlled by the parallel input-control signals PEI 202*p*, PEO 208*p*, respectively. At the beginning of the 3DMST, a clearing signal 00*cl* clears the counter 00*ctr*. Then, at the arrival of each clock signal CKT 00*ct*, the counter 00*ctr* increments the 3D-M address 2.

FIG. 29AC is a timing diagram for the preferred SL-3DMST. In this preferred embodiment, CK, CKI, CKO share one clock source, PEI, PEO share another clock source. During clock cycles T1–T3, serial-load control signal SE 00*s* is high and the nth ITV(n) is shifted into SL-TFF 01*sf*—03*sf* one-by-one. During clock cycle T4, SE 00*s* switches to low and SL-TFF 03*sf*—04*sf* acquire normal inputs X3, X4, which are the processing results of ITV(n) in the network 12N, i.e. OTV(n). During clock cycles T5–T6, OTV(n) are shifted out and compared with the ETV 208*o*. Since the OTV width is 2, the comparison result CO 00*co* are valid only during the clock cycles T5–T6. Accordingly, T5–T6 are referred to as valid OTV clock cycles. Here, input, processing and output need 4 clock cycles, which form a serial test cycle (STC). Note that the ETV(n) corresponding to the ITV(n) in a first STC are read out during the following STC.

FIG. 29AD illustrates a preferred back-end screening circuit 00*pp*. In this preferred embodiment, as long as OTV mismatches with ETV (i.e. 00*co* is "1") during any valid OTV clock cycle, the output P/F 00*pf* of the back-end screening circuit 00*pp* is latched to "1". This preferred embodiment further comprises a register 208*pn*, a counter 208*ctr* and a comparator 208*lt*. They determine if the comparison result obtained during a clock cycle is valid. Here, the register 208*pn* stores the OTV width; the counter 208*ctr* records the number of clock cycles elapsed after the beginning of each STC; and the comparator 208*lt* compares these two numbers. If the number of clock cycles is smaller than the OTV width, the comparison result is valid.

FIGS. 29BA–29BB illustrate two preferred parallel self-test flip-flops (PL-TFF). The PL-TFF 01*pf* has an expected-value input ER and a comparison-result output CO. The data from ER is compared with the data from the output Y of the flip-flop and the comparison result is sent out at CO. Data-selection port PE determines if flip-flop 0*f* captures normal input D or test data PI from the 3D-M. FIG. 29BB has an extra switch 00*sw*. During normal operation, 00*sw* cuts comparator 00*xo* from the CUT; 00*sw* is switched on only during test.

FIG. 29BC illustrates a preferred parallel-load 3DMST-IC (PL-3DMST-IC). Here, TVB 206 is a simple buffer. Its input is controlled by an input-control clock CKP' and their outputs are driven by an output-control signal CKP. The test vectors (202*a*–202*c*, 208*a*–208*b*) in the TVB 206 are fed into the PL-TFF 01*pf*–04*pf* in parallel. Since PL-TFF 01*pf*–02*pf* belong to the first stage S1 where no data are processed (referring to FIG. 27A), they do not have expected values. Accordingly, only the comparison results 00*co* from PL-TFF 03*pf*–04*pf* need to be sent to the back-end screening circuit.

The operation of a PL-3DMST-IC can be explained with the help of the timing diagram of FIG. 29BD. Under the control of CKP, at time tx, the test vector 206*td* from the 3D-M 0 is fed into the TVB 206. During clock cycle Ta, the parallel-input control signal PE is set to high and the test vector 206*td* is transferred into the PL-TFF 01*pf*–04*pf* in parallel. Then the CUT processes the ITV and generates the OTV. During clock cycle Tb, PE is set to low. At this moment, the OTV from a first stage is captured by the PL-TFF in the following stage and evaluated. Accordingly, each parallel self-test cycle (PTC) comprises 2 clock cycles.

B. 3DMST Applications

Figure 30A:
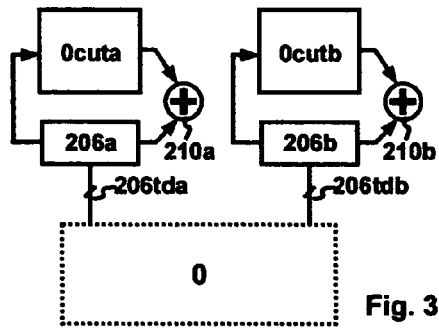
FIGS. 30A–30C illustrate preferred parallel self-test, mixed-signal testing, printed-circuit board (PCB) system self-test.
Figure 30B:
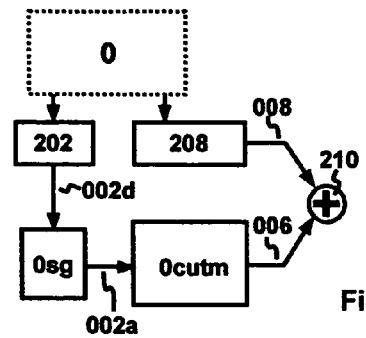
Figure 30B:
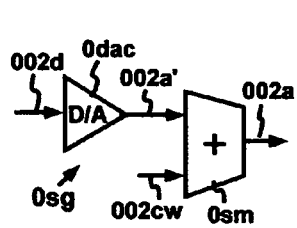
Figure 30B:
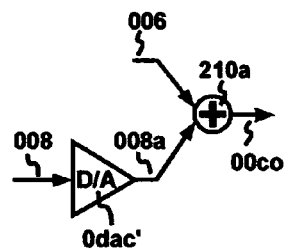
Figure 30C:
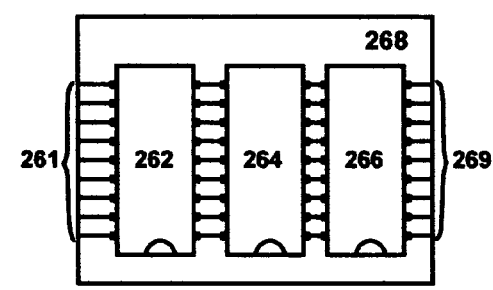

In real circuit applications, 3DMST can support parallel self-test (FIG. 30A), mixed-signal testing (FIGS. 30BA–30BC), printed-circuit board (PCB) system self-test (FIG. 30C).

Most integrated circuits comprise a number of scan chains. FIG. 30A illustrates a preferred 3DMST-IC supporting parallel self-test. In this preferred embodiment, test vectors 206*tda*, 206*tdb* are downloaded from the 3D-M 0 to the ITV 206*a*, 206*b*, respectively. This downloading process is carried out in parallel. Accordingly, two CUT's 0*cuta*, 0*cutb* can be tested in parallel. This shortens testing time.

Mixed-signal circuit contains analog signals. Since digital-to-analog (D/A) conversion is much faster than the other way around, during the mixed-signal testing, ITV and/or ETV are preferably converted into analog signals when necessary. FIG. 30BA illustrates a preferred 3DMST-IC supporting mixed-signal testing. In this preferred embodiment, the input of the CUT 0*cutm* includes analog signals and its output 006 are purely digital. The ITV 002*d* is converted into an analog signal by an on-hip analog-signal generating block 0*sg*, before it is sent to the CUT 0*cutm*. FIG. 30BB illustrates a preferred analog-signal generating block 0*sg*. It comprises a D/A converter 0*dac* and a mixer 0*sm*. The D/A converter 0*dac* converts the ITV 002*d* into an analog signal 002*a'*. The mixer 0*sm* mixes this analog signal 002*a'* with a carrier wave 002*cw* and generates a test signal 002*a*. On the other hand, the 0*cutm* output in FIG. 30BC includes output analog signal 006. The ETV 008 are converted into expected analog signal 008*a* by a D/A converter 0*dac'*. The expected analog signal is compared with the output analog signal 006 at an analog comparator 210*a* to obtain the comparison result 00*co*. The analog comparator 210*a* may comprise a differential amplifier such as 17C and an integrator.

FIG. 30C illustrates a preferred 3DMST-IC supporting printed-circuit board (PCB) system self-test. The PCB 268 comprises a 3DMST-IC chip 262 and other conventional IC chips 264, 266. The 3D-M in the 3DMST-IC 262 carries test vectors not only for the 3DMST-IC 262, but also for the conventional IC 264, 266. Accordingly, the 3DMST-IC 262 supports the self-test for the whole PCB system 268. Moreover, since the 3D-M has a large capacity, this test will have good fault coverage.

In the preferred embodiment of FIG. 30C, the first interface 269 is the standard interface between the PCB system 268 and the external system; the second interface 261 can be used to perform a separate test to the 3DMST-IC 262. The purpose of this separate test is to guarantee that the 3D-M in the 3DMST-IC 262 is error-free. It is a memory test and can be carried out by medium- to low-speed testers. Once the 3DMST-IC 262 passes this test, the PCB system self-test can be carried out at high speed and confidently.

C. Test Data Reduction

Figure 31A:
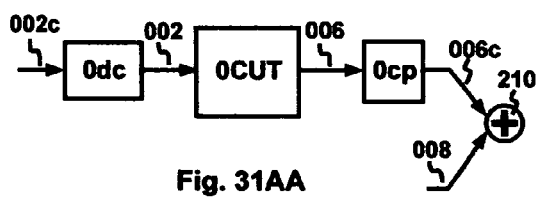
FIGS. 31AA–31BB illustrate several preferred test-data reducing means.
Figure 31A:
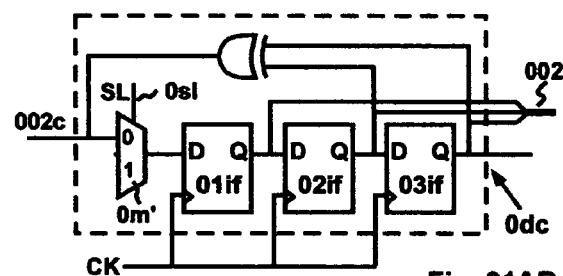

In order to reduce the amount of test data to be carried by a 3D-M, test-data compression can be used (FIGS. 31AA–31AB). Alternatively, composite test can be used (FIGS. 31BA–31BB).

FIG. 31AA illustrates a preferred 3DMST-IC based on compressed test data. Compared with FIG. 28A, the input of this preferred CUT further comprises an input-data de-compression circuit 0*dc* and the output further comprises an output-data compression circuit 0*cp*. The 3D-M 0 carries the ITV seeds 002*c*, which are converted into the ITV 002 by the input-data de-compression circuit 0*dc*. The processing results 006 are compressed by the output-data compression circuit 0*cp* before they are compared with the ETV 008.

FIGS. 31AB illustrates a preferred input-data de-compression circuit 0*dc*. It is an LFSR-generating-block 0*dc*. Before test, the control signal SL 0*sl* is asserted and the ITV seeds 002*c* are shifted into the flip-flops 01*if*–03*if*. During test, SL 0*sl* is de-asserted and the LFSR-generating-block 0*dc* generates a series of pseudo-random numbers. The output-data compression circuit 0*cp* can be a signature analyzer. This should be apparent to those skilled in the art Alternatively, IC-testing may use only one of the above (de-)compression circuits.

FIGS. 31BA–31BB explain two composite tests. Composite test combines at least two testing methods, e.g. 3DMST, built-in-self-test (BIST) and external scan test (EST). It exploits the individual strength of each testing method. As illustrated in FIG. 31BA, basic circuit blocks (e.g. RAM) can use the BIST, while the higher-level testing (e.g. chip-level functional/structural testing) can use the 3DMST. On the other hand, as illustrated in FIG. 31BB, the high-speed test can be relied on the 3DMST and/or BIST, while the medium- to low-speed test can be based on the EST. This can lower the overall testing cost. Alternatively, critical test vectors (i.e. the test vectors important to the circuit performance) are tested by the 3DMST, while the non-critical test vectors are tested by the EST. This improves the chance of locating defects during the field-test. Composite test can optimize the testing cost and reliability.

D. Methodologies to Avoid Undesired Yield Loss

Figure 32:
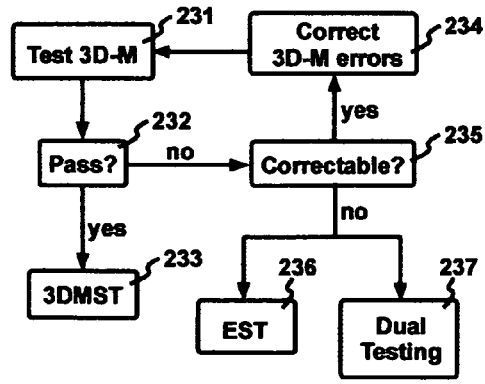
FIG. 32 illustrates a preferred 3DMST-with-confidence.

During the 3DMST, if the OTV mismatches with the ETV, there are two possibilities: one is the CUT is defective; the other is the 3D-M is defective. The second scenario causes undesired yield loss. To avoid this, 3DMST-with-confidence may be used, i.e. 3D-M is guaranteed to be error-free, and if there are any defect-induced errors, they are corrected before the 3DMST (FIG. 32). Alternatively, secondary test can be used, i.e. after the 3DMST, a conventional EST is performed on the chips that fail the 3DMST (FIGS. 33A–33D).

FIG. 32 illustrates a preferred flow for the 3DMST-with-confidence. During the 3DMST-with-confidence, the 3D-M 0 carrying the test vectors needs to be error-free. Accordingly, before the 3DMST, the 3D-M 0 is tested (step 231). This testing step can be performed in a medium- to low-speed tester and therefore, is a low-cost testing step. If the 3D-M 0 does not pass the test, the 3D-M errors are to be corrected by various correctional means (step 234, referring to FIGS. 25A–26C). For the CUT whose 3D-M 0 cannot be corrected, it has to go through the EST (step 236) and/or dual testing (step 237, referring to FIG. 33).

FIGS. 33A–33CB illustrates several preferred integrated circuit with dual-testing capability (DTC-IC). Besides supporting the 3DMST, the DTC-IC also supports the EST. As illustrated in FIG. 33A, during dual testing, a secondary test is performed to the CUT, i.e. after the 3DMST, a conventional EST is performed to the chip that fail the 3DMST (step 230). If said chip still fails the EST, it is considered a bad part. To reduce the EST test time during the dual testing, the questionable test vectors 004 (QTV, i.e. the ITV corresponding to mismatched OTV and ETV) are preferably recorded during the 3DMST (step 229). During the EST, testing is only performed to the QTV 004 (step 229C).

FIG. 33BA illustrates a preferred SL-3DMST-IC with DTC. It adds two multiplexors 00*m*1, 00*m*2 at each end of the SL-TFF chain 00*sfc*. The multiplexor 00*m*1 determines if the ITV fed into the SL-TFF chain 00*sfc* is the ITV 202*i* from the 3D-M 0 or the test data ESI 00*esi* from the external tester. On the other hand, the multiplexor 00*m*2 determines if the output 00*eo* from the SL-TFF chain 00*sfc* is the comparison result CO 00*co* or the OTV SO 00*so*.

FIG. 33BB is a preferred back-end screening circuit 00*pp'*. Compared FIG. 29AD, it has a QTV storage block 204. The QTV storage block 204 comprises a number of QTV-address registers 204*a*–4*d* and comparison-result registers 204*af*–4*df*. The QTV address 2QA may include the 3D-M address 2 and the location 208*n* of the questionable bit in the OTV. Here, questionable bit is the bit in the OTV that does not match with that in the ETV. It helps to diagnose the defective CUT. If a valid comparison result CO 00*co* is high, 204*af* is set to high, 2QA is fed into the first QTV register 204*a* and the earlier 2QA's are shifted one register to the right. As long as the output 00*pf* is high, the CUT fails the 3DMST.

FIGS. 33CA illustrate a preferred PL-3DMST-IC with DTC. It replaces all PL-TFF 01*pf*–04*pf* in FIG. 29BC by parallel-serial test flip-flops (PS-TFF) 01*df*–04*df*. These PS-TFF 01*df*–04*df* form a PS-TFF chain 00*dfc*. Under the control signal DE[0:1] 00*de*, each PS-TFF captures one signal from the following inputs: the normal input D, the ITV downloaded in series from an external tester, or the ITV downloaded in parallel from the 3D-M 0. A preferred PS-TFF is illustrated in FIG. 33CB. Its operation should be apparent to those skilled in the art.

While illustrative embodiments have been shown and described, it would be apparent to those skilled in the art that may more modifications than that have been mentioned above are possible without departing from the inventive concepts set forth L For example, the 3D-M array in this disclosure is typically 1024×1024. In fact, its size in real application could be as large as ~$10^4 \times 10^4$. On the other hand, the 3DMST-IC in this disclosure is based on mux-FF. In fact, they could be based on LSSD and other DFT designs. The invention, therefore, is not to be limited except in the spirit of the appended claims.

What is claimed is:

1. An integrated circuit (IC) supporting non-electrically-programmable three-dimensional memory (NEP-3DM)-based self-test (NEP-3DMST), comprising
    a substrate circuit, said substrate circuit further comprising a circuit-under-test (CUT) and a peripheral circuit; and,
    at least an NEP-3DM level stacked on said substrate circuit, at least a portion of said NEP-3DM level storing at least a portion of test data and/or test-data seeds for said CUT and being connected with said peripheral circuit through a plurality of inter-level connecting vias.

2. The IC supporting NEP-3DMST according to claim 1, wherein said substrate circuit further comprises a plurality of test-vector buffers, said test-vector buffers storing at least a portion of said test data and/or test-data seeds.

3. The IC supporting NEP-3DMST according to claim 1, wherein said test data or test-data seeds are downloaded into said CUT in a serial fashion.

4. The IC supporting NEP-3DMST according to claim 1, wherein said test data or test-data seeds are downloaded into said CUT in a parallel fashion.

5. The IC supporting NEP-3DMST according to claim 1, wherein
    said CUT comprises a first CUT block and a second CUT block;
    said substrate circuit further comprises a first test-vector buffer and a second test-vector buffer, said first test-vector buffer storing at least a portion of test data and/or test-data seeds for said first CUT block, said second test-vector buffer storing at least a portion of test data and/or test-data seeds for said second CUT block.

6. The IC supporting NEP-3DMST according to claim 1, wherein said substrate circuit further comprises a D/A converter, said D/A converter converting at least a portion of said digital test vectors into analog signals.

7. The IC supporting NEP-3DMST according to claim 6, wherein said substrate circuit further comprises an analog comparator.

8. The IC supporting NEP-3DMST according to claim 1, wherein
    said test data and/or test-data seeds in said NEP-3DM are compressed test data;
    said substrate circuit further comprises a data de-compressor, said data de-compressor de-compressing said compress test data.

9. The IC supporting NEP-3DMST according to claim 1, wherein
    said test data and/or test-data seeds in said NEP-3DM are compressed test data;
    said substrate circuit further comprises a data compressor, said data compressor compressing output test vectors.

10. The IC supporting NEP-3DMST according to claim 1, wherein said substrate circuit further comprises a storage block, said storage block storing address information associated with mismatched output test vectors and expected test vectors.

11. The IC supporting NEP-3DMST according to claim 1, wherein said substrate circuit further comprises a multiplexor, the output of said multiplexor being selected from external scan-test input and NEP-3DM input.

12. The IC supporting NEP-3DMST according to claim 1, wherein said substrate circuit further comprises a plurality of parallel-serial test flip-flops (PS-TFF), the output of said PS-TFF being selected from normal data input, external scan-test input, and NEP-3DM input.

* * * * *